(12) United States Patent
Pan

(10) Patent No.: US 10,796,627 B2
(45) Date of Patent: Oct. 6, 2020

(54) INTEGRATED LASER ARRAYS BASED DEVICES

(71) Applicant: Shaoher Pan, Palo Alto, CA (US)

(72) Inventor: Shaoher Pan, Palo Alto, CA (US)

(*) Notice: Subject to any disclaimer, the term of this patent is extended or adjusted under 35 U.S.C. 154(b) by 6 days.

(21) Appl. No.: 16/048,026

(22) Filed: Jul. 27, 2018

(65) Prior Publication Data
US 2020/0035146 A1 Jan. 30, 2020

(51) Int. Cl.
*G09G 3/32* (2016.01)
*H01S 5/187* (2006.01)
*H01S 5/343* (2006.01)
*H01S 5/00* (2006.01)
*H01S 5/042* (2006.01)
*H01S 5/028* (2006.01)
*H01S 5/02* (2006.01)
*H01S 5/42* (2006.01)
*H01S 5/026* (2006.01)
(Continued)

(52) U.S. Cl.
CPC .......... *G09G 3/32* (2013.01); *H01S 5/005* (2013.01); *H01S 5/021* (2013.01); *H01S 5/028* (2013.01); *H01S 5/0218* (2013.01); *H01S 5/0261* (2013.01); *H01S 5/042* (2013.01); *H01S 5/187* (2013.01); *H01S 5/34333* (2013.01); *H01S 5/423* (2013.01); *G06F 3/044* (2013.01); *G06F 3/0412* (2013.01); *G06F 3/0416* (2013.01); *G09G 2300/0426* (2013.01); *G09G 2300/0842* (2013.01); *H01S 2301/173* (2013.01)

(58) Field of Classification Search
None
See application file for complete search history.

(56) References Cited

U.S. PATENT DOCUMENTS

2003/0082889 A1* 5/2003 Maruyama .......... H01L 27/1214
438/455
2007/0147459 A1* 6/2007 Ueki ..................... H01S 5/1835
372/50.124
(Continued)

OTHER PUBLICATIONS

Chen et al., "Ultraviolet GaN-based Microdisk Laser with AlN/AlGaN Distributed Bragg Reflector," Appl. Phys. Lett. 96, 151115 (2010), 4 pages.
(Continued)

*Primary Examiner* — Matthew Yeung
(74) *Attorney, Agent, or Firm* — Fish & Richardson P.C.

(57) ABSTRACT

Integrated laser arrays based devices and systems and methods of forming the integrated laser arrays based devices and systems are provided. In one aspect, an integrated display includes a semiconductor substrate including a first side and a second side, an array of active-matrix light-emitting pixels, each of the pixels including one or more light-emitting elements formed on the first side and at least one non-volatile memory coupled to the one or more light-emitting elements, each of the light-emitting elements including a lasing structure that has an optical resonator and one or more semiconductor layers in the optical resonator and is operable to emit a laser light, one or more integrated circuits formed on the second side, and conductive interconnects penetrating from the second side through the semiconductor substrate and conductively coupling the one or more integrated circuits to the light-emitting elements.

58 Claims, 31 Drawing Sheets

(51) Int. Cl.
*G06F 3/041* (2006.01)
*G06F 3/044* (2006.01)

(56) References Cited

U.S. PATENT DOCUMENTS

| | | | |
|---|---|---|---|
| 2014/0168572 A1* | 6/2014 | Iwata | H01L 51/5268 |
| | | | 349/61 |
| 2015/0228235 A1* | 8/2015 | Davis | G09G 3/3611 |
| | | | 345/214 |
| 2018/0102085 A1 | 4/2018 | Pan | |
| 2018/0114800 A1 | 4/2018 | Pan | |
| 2018/0190615 A1 | 7/2018 | Pan | |
| 2019/0189865 A1* | 6/2019 | Shimizu | H01L 33/62 |

OTHER PUBLICATIONS

Cho et al., "InGaN/GaN Multi-quantum Well Distrubuted Bragg Reflector Laser Diode," Appl. Phys. Lett. 76, 1489 (2000); https://doi.org/10.1063/1.126072, published online Mar. 14, 2000, 3 pages.

Kao et al., "The Lasing Characteristics of GaN-based Vertical-cavity Surface-emitting Laser with AlN-GaN and $Ta_2/O_5/SiO_2$ Distributed Bragg Reflectors," published in IEEE Photonics Technology Letters (vol. 18, Issue 7, Apr. 1, 2006), 3 pages.

Peng et al., "Fabrication and Characteristics of GaN-based Microcavity Light-Emitting Diodes with High Reflectivity AlN/GaN Distributed Bragg Reflectors," Japanese Journal of Applied Physics, 2006, vol. 45, Part 1, No. 4B, 3 pages.

Zhao et al., "Efficiency Enhancement of InGaN/GaN Light-Emitting Diodes with a Back-Surface Distributed Bragg Reflector," Journal of Electronic Materials, 2003, 32(12):1523-1524.

Unknown author, "Modulated doping improves GaN-based vertical-cavity surface-emitting lasers," (Nov. 11, 2006) [online] (retrieved from https://phys.org/news/2016-11-modulated-doping-gan-based-vertical-cavity-surface-emitting.html), 3 pages.

* cited by examiner

INTEGRATED LASER ARRAYS BASED DEVICES

TECHNICAL FIELD

This disclosure relates generally to laser array based devices or systems, particularly to integrated laser array based display devices or systems.

BACKGROUND

Displays utilizing arrays of light emitting pixels are popular in the electronic field and especially in portable electronic and communication devices, because large amounts of data and pictures can be transmitted rapidly and virtually to any location. Light emitting diode (LED) arrays are becoming more popular than liquid crystal displays (LCD) as an image source in both direct view and virtual image displays. One reason for this is that LEDs are capable of generating relatively high luminance, thus displays incorporating LED arrays can be used in a greater variety of ambient conditions.

SUMMARY

Described herein are integrated laser array-based devices or systems, e.g., vertical-cavity surface-emitting laser (VCSEL) array based displays, and methods of making them. Compared to integrated LED arrays based displays, the integrated laser array-based displays can provide higher luminance (or brightness), higher spatial resolution, and higher energy efficiency.

One aspect of the present disclosure features an integrated device including: a semiconductor substrate including a first side and a second side; an array of active-matrix light-emitting pixels, each of the pixels including one or more light-emitting elements formed on the first side and at least one non-volatile memory coupled to the one or more light-emitting elements, each of the light-emitting elements including a lasing structure that has an optical resonator and one or more semiconductor layers in the optical resonator and is operable to emit laser light; one or more integrated circuits formed on the second side; and conductive interconnects penetrating from the second side through the semiconductor substrate and conductively coupling the one or more integrated circuits to the light-emitting elements.

The optical resonator can include a pair of distributed Bragg reflectors, and the one or more semiconductor layers can be arranged between the pair of distributed Bragg reflectors. Each of the light-emitting elements can include a first highly-reflective layer on a top surface of the lasing structure, and the first highly-reflective layer can define an opening region filled with a highly-transmissive layer, from which the laser light exits the lasing structure. The integrated device can further include an electrically conductive layer on top of the light-emitting elements to form a common electrical ground, the electrically conductive layer being highly-transmissive, and the first highly-reflective layer can be electrically conductive, the electrically conductive layer can be on top of the first highly-reflective layer, and the highly-transmissive layer in the opening region can be electrically isolated. Each of the light-emitting elements can further include a second highly-reflective layer under a bottom surface of the lasing structure, and the second highly-reflective layers of the light-emitting elements can be electrically conductive to be individual electrodes and separated from each other by an electrically isolated material.

Each of the light-emitting elements can further include a semiconductor buffer layer under the second highly-reflective layer and on a surface of the semiconductor substrate on the first side. The conductive interconnects can penetrate from the second side through the semiconductor substrate and through the semiconductor buffer layers to be electrically coupled to the second highly-reflective layers.

In some examples, the one or more semiconductor layers include one or more quantum well layers including Group III-V compounds. The one or more semiconductor layers can include a plurality of pairs of alternating InGaN layer and GaN: Si layer, and each of the lasing structures is operable to emit laser light with a blue color.

In some examples, the lasing structures in the light-emitting elements of each of the pixels include the same semiconductor layers and are operable to emit the same laser light with a same primary color. At least one of the light-emitting elements in each of the pixels includes a phosphor material or a quantum-dot material on a surface of the lasing structure and is operable to emit secondary light based on the laser light with the primary color. The secondary light can have a second color different from the primary color. In a particular example, each of the pixels includes at least three light-emitting elements operable to emit light with at least three different colors including red, blue, and green based on the laser light with the primary color.

In some implementations, the non-volatile memories of the pixels are on the second side and conductively coupled to the light-emitting elements through the conductive interconnects; scanning drivers and data drivers on the second side and conductively coupled to the one or more integrated circuits on the second side; and word lines and bit lines on the second side and conductively coupled to the non-volatile memories, such that each of the non-volatile memories is coupled to one of the scanning drivers through at least one word line and to one of the data drivers through at least one bit line. A number of the conductive interconnects can be no more than a number of the light emitting elements of the pixels.

In some implementations, the non-volatile memories of the pixels are on the first side and conductively coupled to the light-emitting elements, each of the non-volatile memories being adjacent to one or more light emitting elements of a corresponding pixel.

In some cases, the integrated device further includes: scanning drivers and data drivers on the first side, wherein the scanning drivers and the data drivers are conductively coupled to the one or more integrated circuits on the second side through the conductive interconnects; and word lines and bit lines on the first side and conductively coupled to the scanning drivers and the data drivers, where each of the non-volatile memories is coupled to one of the scanning drivers through at least one word line and to one of the data drivers through at least one bit line. A number of the conductive interconnects can be smaller than a sum of a number of the scanning drivers and a number of the data drivers.

In some cases, the integrated device further includes: scanning drivers and data drivers on the second side and conductively coupled to the one or more integrated circuits on the second side; and word lines and bit lines on the first side and conductively coupled to the non-volatile memories, where the word lines and the bit lines are coupled to the scanning drivers and the data drivers through the conductive interconnects, respectively, such that each of the non-volatile memories is coupled to one of the scanning drivers through at least one word line and to one of the data drivers through at least one bit line. A number of the conductive interconnects can be identical to a sum of a number of the word lines and a number of the bit lines.

In some cases, the integrated device further includes: scanning drivers and data drivers on the second side and conductively coupled to the one or more integrated circuits on the second side; and word lines and bit lines on the second side and conductively coupled to the scanning drivers and the data drivers, respectively, where the non-volatile memories are coupled to the word lines and the bit lines through the conductive interconnects, such that each of the non-volatile memories is coupled to one of the scanning drivers through at least one word line and to one of the data drivers through at least one bit line. A number of the conductive interconnects can be identical to a number of the non-volatile memories of the pixels.

The light emitting elements can be isolated by an electrically isolated material. The integrated device can further include a conductive grid array package on the second side of the semiconductor substrate and conductively coupled to the one or more integrated circuits. The conductive grid array package can include a ball grid array (BGA) package, and the BGA package is formed on a surface of the one or more integrated circuits.

The integrated device can further include a protective layer on top of the array of active-matrix light-emitting pixels. In some cases, the non-volatile memories of the pixels can be on the first side, the protective layer and the non-volatile memories form a touch screen position sensor operable to generate an electrical change in response to a touch on a spot of the protective layer, and the one or more integrated circuits include a touch screen signal processor coupled to the non-volatile memories through the conductive interconnects.

The one or more integrated circuits can include at least one of: one or more digital signal processors including at least one of: a digital signal analyzer, a digital processor, an image processor, a volatile memory, a non-volatile memory, or a touch screen processor; or one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

The semiconductor substrate can include a single crystal silicon substrate. The single crystal silicon substrate can have a first surface having a (111) orientation on the first side and a second surface having a (111) orientation on the second side and opposite to the first surface, and the array of light-emitting elements can be formed on the first surface, and the one or more integrated circuits can be formed on the second surface. The one or more integrated circuits can include transistors fabricated on the second side with the semiconductor substrate as their substrates.

Another aspect of the present disclosure features a method of fabricating an integrate device, including: forming an array of lasers on a first side of a semiconductor substrate, each of the lasers including an optical resonator and one or more semiconductor layers in the optical resonator and being configured to emit a laser light; forming an array of active-matrix laser pixels by using the array of lasers, each of the laser pixels including at least one of the lasers and at least one non-volatile memory coupled to the at least one of the lasers; forming conductive interconnects penetrating from the second side through the substrate to the first side; and forming one or more integrated circuits on the second side and conductively coupled to the array of active-matrix laser pixels through the conductive interconnects.

In some implementations, the method further includes forming an array of active-matrix multi-color display pixels by using the array of active-matrix laser pixels, each of the multi-color display pixels including at least two pixel elements operable to emit light with at least two different colors when excited by the laser light emitted from at least two lasers of a corresponding laser pixel. In some examples, forming the array of active-matrix multi-color display pixels can include selectively depositing a phosphor film or quantum-dot film on a surface of at least one of the lasers in each of the multi-color display pixels. In a particular example, forming the array of active-matrix multi-color display pixels includes selectively depositing blue, green, and red quantum dots or phosphors on the surfaces of the lasers.

Each of the lasers can be a vertical-cavity surface-emitting laser (VCSEL) operable to emit the laser light from a top surface of the laser. The one or more semiconductor layers can include one or more quantum well layers including Group III-V compounds.

In some implementations, forming the array of lasers includes: patterning a surface of the semiconductor substrate on the first side to form an array of individual surfaces of the semiconductor substrate; and sequentially depositing a plurality of layers on the array of individual surfaces, the plurality of layers including a first distributed Bragg reflector, one or more semiconductor layers, and a second distributed Bragg reflector, the first and second distributed Bragg reflectors forming the optical resonator.

In some implementations, forming the array of lasers includes: forming a plurality of layers on the first side of the substrate to form a lasing structure including a first distributed Bragg reflector, one or more semiconductor layers, and a second distributed Bragg reflector, the first and second distributed Bragg reflectors forming the optical resonator; and patterning the lasing structure to form the array of lasers.

In some implementations, forming the array of lasers includes: for each of the lasers, forming a first electrode on a bottom of the laser and a second electrode on a top of the laser; and forming an opening region in the second electrode, from which the laser light emits.

The method can further include: filling an electrically isolated material in gaps between adjacent lasers of the array of lasers on the first side; and polishing the first side to form a flat surface across the array of lasers. In some examples, the electrically isolated material is optically transmissive, and each of the lasers has an opening window from which the laser light emits, and the opening window is filled with the electrically isolated material. The method can further include forming an electrically conductive layer on the first side to form a common electrical ground for the array of lasers.

In some implementations, forming the conductive interconnects includes: thinning the semiconductor substrate from the second side; etching the thinned semiconductor substrate from the second side to form trenches in the semiconductor substrate; insulating inner surfaces of the trenches; and filling an electrically conductive material in the trenches.

In some implementations, forming the array of active-matrix laser pixels includes: forming a plurality of non-volatile memories on the second side; and conductively connecting the array of lasers on the first side to the plurality of non-volatile memories on the second side via the conductive interconnects. Each of the non-volatile memories can be coupled to a conductive electrode formed on a bottom of a respective laser via the conductive interconnects.

In some cases, the method further includes: forming scanning drivers and data drivers on the second side, where the scanning drivers and the data drivers are conductively coupled to the one or more integrated circuits on the second side; and forming word lines and bit lines on the second side and conductively coupled to the non-volatile memories, such that each of the non-volatile memories is coupled to one of the scanning drivers through at least one word line and to one of the data drivers through at least one bit line.

In some implementations, forming the array of active-matrix laser pixels includes: forming a plurality of non-volatile memories on the first side, each of the non-volatile memories being adjacent to one or more lasers of a corresponding laser pixel.

In some cases, the method further includes: forming scanning drivers and data drivers on the first side, wherein the scanning drivers and the data drivers are conductively coupled to the one or more integrated circuits on the second side through the conductive interconnects; and forming word lines and bit lines on the first side, such that each of the non-volatile memories is coupled to one of the scanning drivers through at least one word line and to one of the data drivers through at least one bit line. Forming the plurality of non-volatile memories and the scanning drivers and data drivers can include: selectively etching particular areas on the first side into the semiconductor substrate; cleaning open surfaces of the semiconductor substrate on the first side; and forming the plurality of non-volatile memories and the scanning drivers and data drivers on the open surfaces.

In some cases, the method further includes: forming word lines and bit lines on the first side and conductively coupled to the plurality of non-volatile memories; and forming scanning drivers and data drivers on the second side and conductively coupled to the one or more integrated circuits on the second side, where the word lines and bit lines are conductively coupled to the scanning drivers and the data drivers through the conductive interconnects, such that each of the non-volatile memories is coupled to one of the scanning drivers through at least one word line and to one of the data drivers through at least one bit line. Forming the plurality of non-volatile memories and the word lines and bit lines on the first side can include: selectively etching particular areas on the first side into the substrate; cleaning open surfaces of the substrate; forming the plurality of non-volatile memories on the open surfaces on the particular areas; selectively etching the lasers to open particular layers and depositing conductive electrodes on the particular layers as Ohmic contacts of the lasers; and forming the word lines and bit lines and conductive connections on the first side, such that the word lines and the bit lines are conductively coupled to the plurality of non-volatile memories.

In some cases, the method further includes: forming scanning drivers and data drivers on the second side, wherein the scanning drivers and the data drivers are conductively coupled to the one or more integrated circuits on the second side; and forming word lines and bit lines on the second side and coupled to the scanning drivers and the data drivers, respectively, wherein the non-volatile memories are conductively coupled to the word lines and bit lines through the conductive interconnects, such that each of the non-volatile memories is coupled to one of the scanning drivers through at least one word line and to one of the data drivers through at least one bit line.

The method can further include: forming a conductive grid array package on the second side of the substrate; and conductively coupling the conductive grid array package to the one or more integrated circuits. The method can further include: forming a protective layer on top of the array of active-matrix multi-color display pixels.

The one or more integrated circuits can include at least one of: one or more digital signal processors including at least one of: a digital signal analyzer, a digital processor, an image processor, a volatile memory, a non-volatile memory, or a touch screen processor; or one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

The semiconductor substrate can include a single crystal silicon substrate. The single crystal silicon substrate can have a first surface having a (111) orientation on the first side and a second surface having a (111) orientation on the second side and opposite to the first surface, and the array of lasers can be formed on the first surface, and the one or more integrated circuits can be formed on the second surface.

A further aspect of the present disclosure features a method of fabricating an integrate active-matrix laser pixel array based display, including: forming an array of vertical-cavity surface-emitting lasers (VCSELs) on a first side of a single crystal Si (111) substrate by depositing multiple layers on a top surface of the substrate, the multiple layers comprising a pair of distributed Bragg reflectors to form an optical resonator and one or more quantum well layers having Group III-V compounds as an active medium in the optical resonator, each of the lasers being operable to emit a laser light with a primary color; forming an array of active-matrix laser pixels by using the array of lasers, wherein each of the laser pixels includes at least three lasers and at least one non-volatile memory coupled to the at least three lasers; forming conductive interconnects penetrating through the substrate from the second side to the first side; forming one or more integrated circuits on the second side and conductively coupled to the array of active-matrix laser pixels through the conductive interconnects; and forming an array of active-matrix multi-color display pixels by selectively depositing at least three different color quantum dots or phosphors on surfaces of the array of lasers, each display pixel including at least three pixel elements operable to emit light with the at least three different colors, when excited by the laser light with the primary color emitted from the at least three lasers of a corresponding laser pixel.

Particular embodiments of the subject matter described in this specification can be implemented so as to realize one or more of the following advantages. Light-emitting pixel arrays, e.g., laser pixel arrays, are placed on one side of a substrate and are integrated with control electronics on the other side of the substrate and conductive interconnects through the substrate couple the control electronics to the pixel arrays. Accordingly, semiconductor based laser arrays are integrated with display control electronics on a semiconductor substrate, e.g., a single crystal Si wafer, enabling the use of standard semiconductor IC (integrated circuit) manufacturing equipment, facilities, and processes, resulting in reduced cost. Moreover, integrated laser arrays on the semiconductor substrate enables fabrication of an ultra-high resolution display (e.g., 10 μm pixel size), and/or micro-laser (μ-laser) displays with extremely high efficiency to save energy.

The technology can use one or more quantum well layers of Group III-V compounds (e.g., GaN/InGaN) as light emissive layers, which makes the laser arrays more energy efficient and more stable than OLED (organic LED) based arrays. The technology can use phosphor materials or quantum-dot materials deposited on the III-V compound based laser arrays to produce multi-color displays. For example, shorter wavelength photons, e.g., photons from blue color lasers, can be used as primary excitation sources to optically excite lower energy photons, e.g., green and red color photons, to form the multi-color displays. The technology can also integrate non-volatile memories, e.g., SRAM (static random-access memory), with the lasers to form active-matrix laser pixels, enabling higher efficiency and faster response time than passive-matrix display pixels. Furthermore, the technology allows integrating other components e.g., processors, memories, drivers, microcontrollers, sensors, timers, touch screen detectors, and/or amplifiers on the side of the semiconductor substrate opposite the laser pixel array, which greatly simplifies processing, achieves seamless integration and reduces cost. For example, the laser arrays can be epitaxially grown under a higher temperature, e.g., more than 1000° C., on a first side of the semiconductor substrate, and the integrated components can be fabricated under a lower temperature, e.g., less than 1000° C., on a second, opposite side of the semiconductor substrate.

The integrated laser array-based display systems, particularly micro-display systems, can achieve low power consumption (e.g., many times lower than current display devices such as OLED displays and LCD displays), high resolution (e.g., one order of magnitude smaller pixel size than the OLED displays and LCD displays), higher generated light flux density (one order of magnitude higher than OLED and LCD display), a fast response time (e.g., two orders of magnitude faster than the OLED displays and LCD displays), and/or potential low manufacture cost due to integration on a single substrate. These integrated laser display arrays can be widely used in many applications, including portable electronic and communication devices, such as wearable devices (e.g., eyeglasses, watches, clothes, bracelets, rings), virtual reality (VR)/augmented reality (AR) displays, or any lighting applications.

Besides display devices or systems, the technologies disclosed herein can also be widely used for other applications. For example, individually controlled high density integrated laser arrays, e.g., VC SEL arrays, can be fabricated. The fabricated high density laser arrays can be used as array light sources for telecommunication such as fiber optic communication, where shorter wavelength photons have a higher frequency that can carry more digital information to thereby increase efficiency and reduce cost. The fabricated laser arrays can be used for optical recording, e.g., as writing heads on an optical disk. The fabricated laser arrays can also be used to measure surface topography and 3D (three-dimensional) environment, e.g., for face mapping or driverless vehicles. For example, the fabricated laser arrays can be used for laser array Rada topography sensing in auto driving vehicles, because short wavelength photons have a longer penetration path to reach a longer distance and can even penetrate through fog and smokes. As another example, the integrated laser arrays can be used for optical computation, where direct coupling optoelectronics in a single substrate can be achieved to increase a speed of computation and reduce a device size and power consumption. The integrated laser arrays can be also used for color printing.

The details of one or more disclosed implementations of the subject matter described in this specification are set forth in the accompanying drawings and the description below. Other features, aspects, and advantages will become apparent from the description, the drawings and the claims.

BRIEF DESCRIPTION OF THE DRAWINGS

FIGS. 7A-7M are perspective views after different steps of forming the integrated laser display system of FIGS. 6A-6B.

DETAILED DESCRIPTIONS

The following descriptions are example displays that include integrated laser arrays and control electronics on silicon substrates. However, the disclosed implementations can be adopted to any suitable device or system that needs integrated laser arrays. Also, for illustration only, a single crystal Si substrate is used as a substrate. The Si substrate can be Si (111) substrate or Si (100) substrate, where (111) and (100) are Miller Indices that are used to describe an orientation (or a slice orientation) of a growth plane of the crystalline silicon. However, the substrate can be made of any suitable material, e.g., silicon, silicon oxide, silicon carbide, gallium nitride (GaN), sapphire, glass, or spinel. The substrate can also be formed by a double-layer structure such as a silicon layer on glass, or a silicon-on-insulator (SOI) substrate.

Example Display System

Figure 1A:
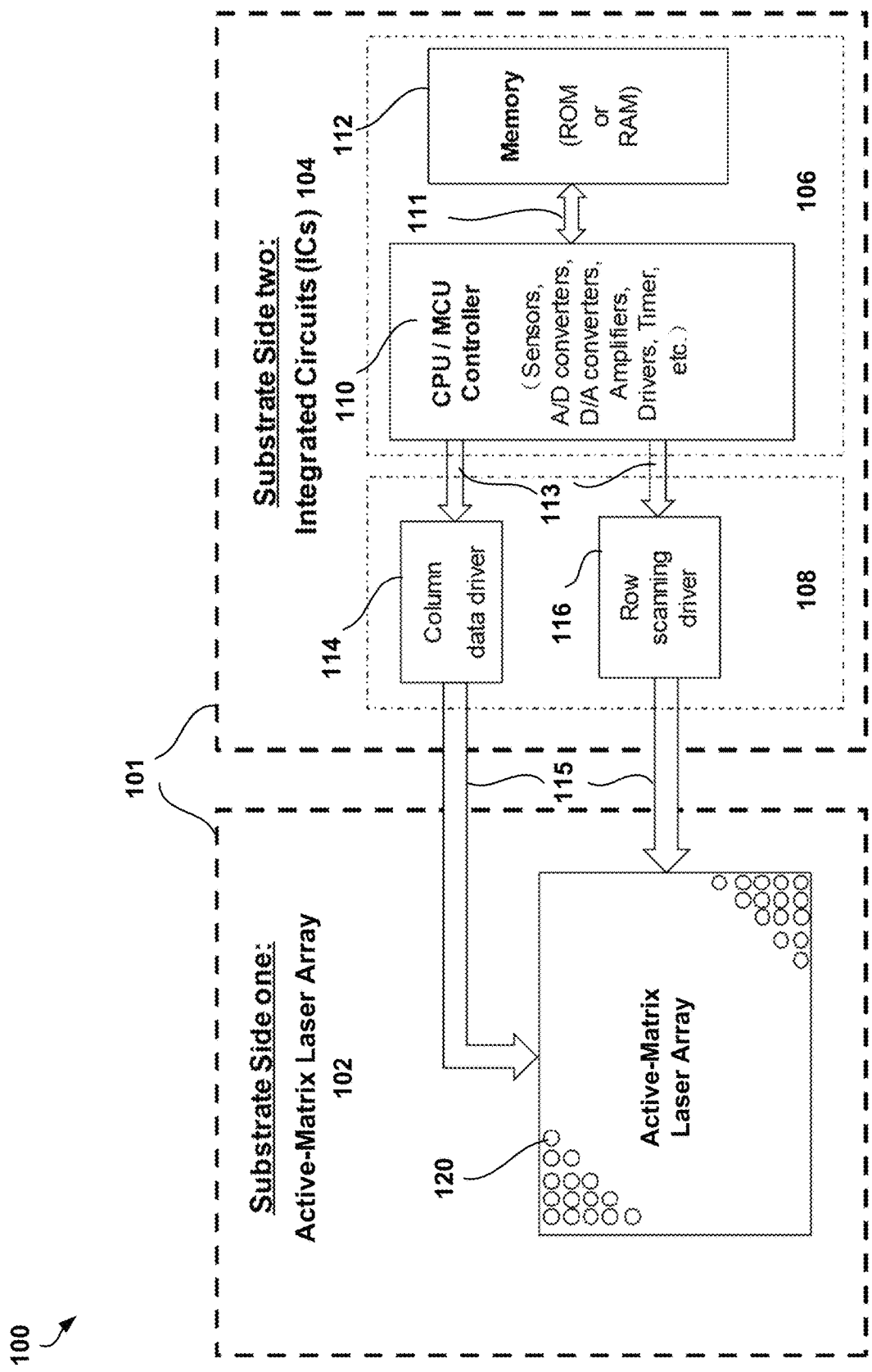
FIG. 1A is a schematic diagram of an example laser array based display system integrated on two sides of a substrate.

FIG. 1A is a schematic diagram of an example laser pixel array based display 100. The display 100 includes an active-matrix laser pixel array 102 formed on a first side of a substrate 101 and integrated circuits 104 formed on a second side of the substrate 101. The substrate 101 can be a semiconductor substrate, e.g., a single crystal semiconductor substrate such as a silicon wafer. The laser pixel array 102 is coupled to the integrated circuits (ICs) 104 via conductive electrodes 115 and 117. The conductive electrodes 115 and 117 can penetrate through the substrate, e.g., via through-holes, and conductively couple the laser pixel array 102 to the integrated circuits 104. Components of the integrated circuits 104 can be manufactured on the second side of the substrate 101.

In some implementations, the integrated circuits 104 includes control electronics 106 and display drivers 108. As illustrated in FIG. 1A, the control electronics 106 can include one or more processors and/or controllers 110, e.g., a central processing unit (CPU), a microcontroller unit (MCU), and/or integrated circuits (ICs) such as sensors, analog/digital converters (ADCs), digital/analog converters (DACs), amplifiers, drivers, and/or timers. The control electronics 106 also includes a memory 112, e.g., a read-only memory (ROM) and/or a random-access memory (RAM). The CPU/MCU controller 110 can be coupled to the memory 112 via connections 111, e.g., internal bus, conductive electrodes, wired connections, or wireless connections. The CPU/MCU controller 110 are configured to read data from or store data into the memory 112. For example, the CPU/MCU controller 110 can receive image or video data to be displayed, e.g., from external network or devices. The CPU/MCU controller 110 can process the image or video data, and/or store the processed image or video data in the memory 112. The memory 112 can also store instructions to cause the control electronics 110 to execute operations.

The display drivers 108 are coupled to the control electronics 106, e.g., the CPU/MCU controller 110, via connections 113 which can be similar to the connections 111. The display drivers 108 are configured to receive image/video data and/or control signals from the control electronics 106. In some examples, the display drivers 108 include data drivers 114, e.g., for columns of the laser pixels array 102, and scanning drivers 116, e.g., for rows of the laser pixels array 102. The data drivers 114 can be coupled to the laser pixels array 102 via bit lines, and the scanning drivers 116 can be coupled to the laser pixels array 102 via word lines. In some implementations, a display controller is coupled to the control electronics 106 and the display drivers 108. The display controller can include a scanning controller coupled to the scanning drivers and a data controller coupled to the column drivers. The scanning controller is configured to receive image/video data and/or a control signal from the control electronics 106 and transmit the image/video data and/or control signals to individual scanning drivers. The data controller is configured to receive image/video data and/or a control signal from the control electronics 106 and transmit the image/video data and/or control signals to individual data drivers.

The laser pixel array 102 can include an array 118 of active-matrix laser pixels 120. Each laser pixel is coupled to a data driver 114 via at least one bit line and a scanning driver 116 via at least one word line. The scanning driver 116 is configured to select a laser pixel through the word line and the data driver 114 transmits a data signal to the selected laser pixel through the bit line. The array 118 of laser pixels may be coupled to a plurality of data drivers 114 and a plurality of scanning drivers 116. In some implementations, as illustrated in FIG. 1A, the data drivers 114 and the scanning drivers 116 are formed on the opposite side as the array 102 of the laser pixels 120. The bit lines and the word lines can be formed on the first side of the substrate 101, together with the active-matrix laser pixel array 102, and coupled to the display drivers 108 (the data drivers 114 and the scanning drivers 116) via conductive electrodes 115 penetrating through the substrate 101. In some implementations, the bit lines and the word lines can be formed on the second side of the substrate, together with the integrated circuits (ICs), and coupled to the active-matrix laser pixel array via conductive electrodes penetrating through the substrate.

In some implementations, the control electronics 110 includes one or more digital signal processors including: a digital signal analyzer, a digital processor, an image processor, a volatile memory, a non-volatile memory, and/or a touch screen processor. The control electronics 104 can also include one or more analog signal processors including a light signal sensor, an electrical signal sensor, a sound signal sensor, a sound signal processor, an analog signal amplifier, an ADC, a DAC, a touch screen signal processor, and/or any other associated electronic components. The analog signal processors are connected to and communicate with the digital signal processors through an ADC and/or a DAC. The digital signal processors are connected to the data drivers 114 and the scanning drivers 116 through the connections 113. In operation, the analog signal processors can receive and process image or video signals from external devices or network or from the internal memory 112. The image or video signals may be analog signals which can be processed and converted into digital signals by an ADC. The digital signals are further processed and analyzed by the digital signal processors. Then the processed digital data can be further transmitted from the digital signal processors to particular data drivers 114 and scanning drivers 116 which then select particular laser pixels and control the selected laser pixels for display.

Figure 1B:
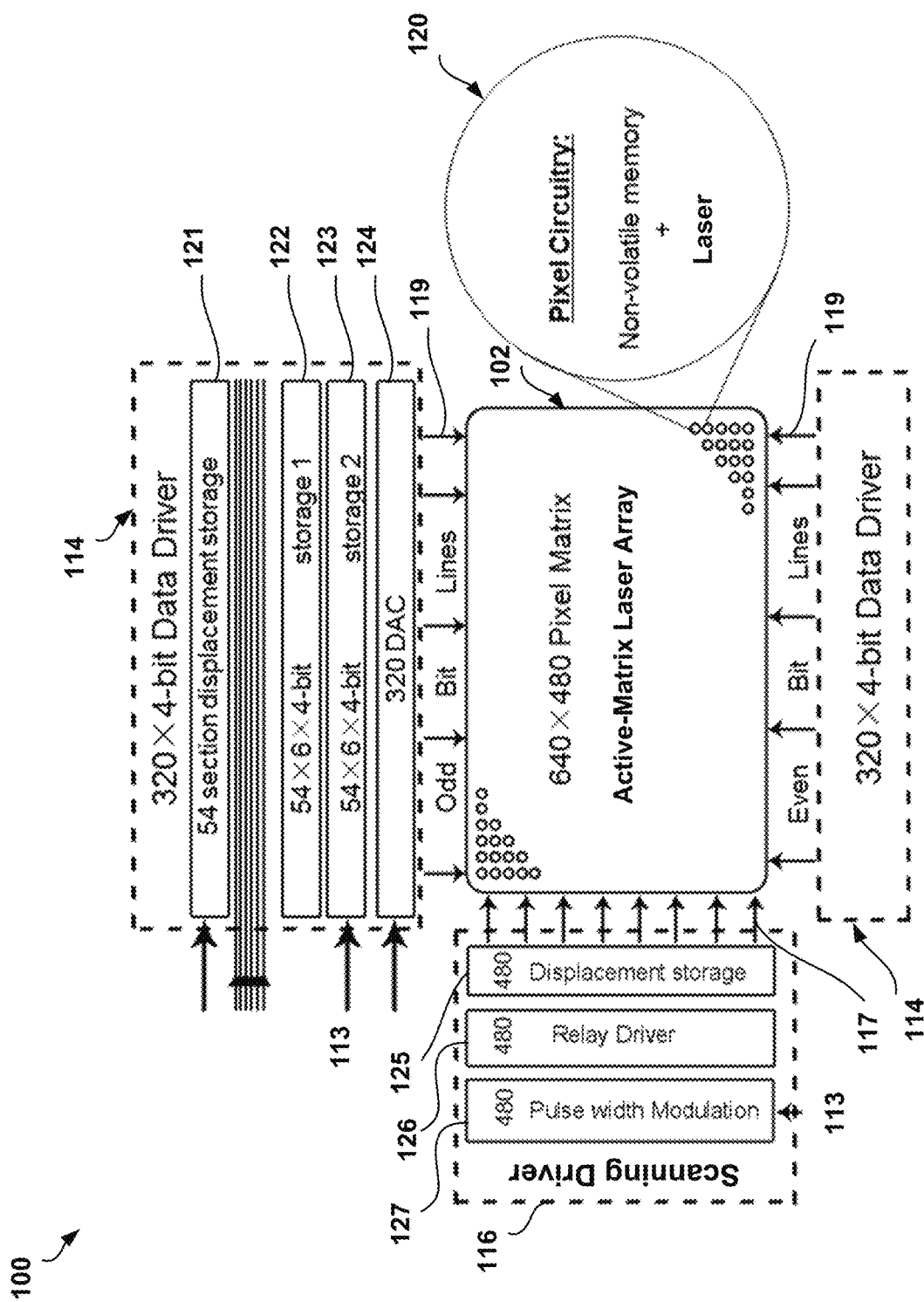
FIG. 1B is a schematic diagram of one side of the substrate of FIG. 1A including active-matrix laser pixel arrays.
Figures 2A, 2B:
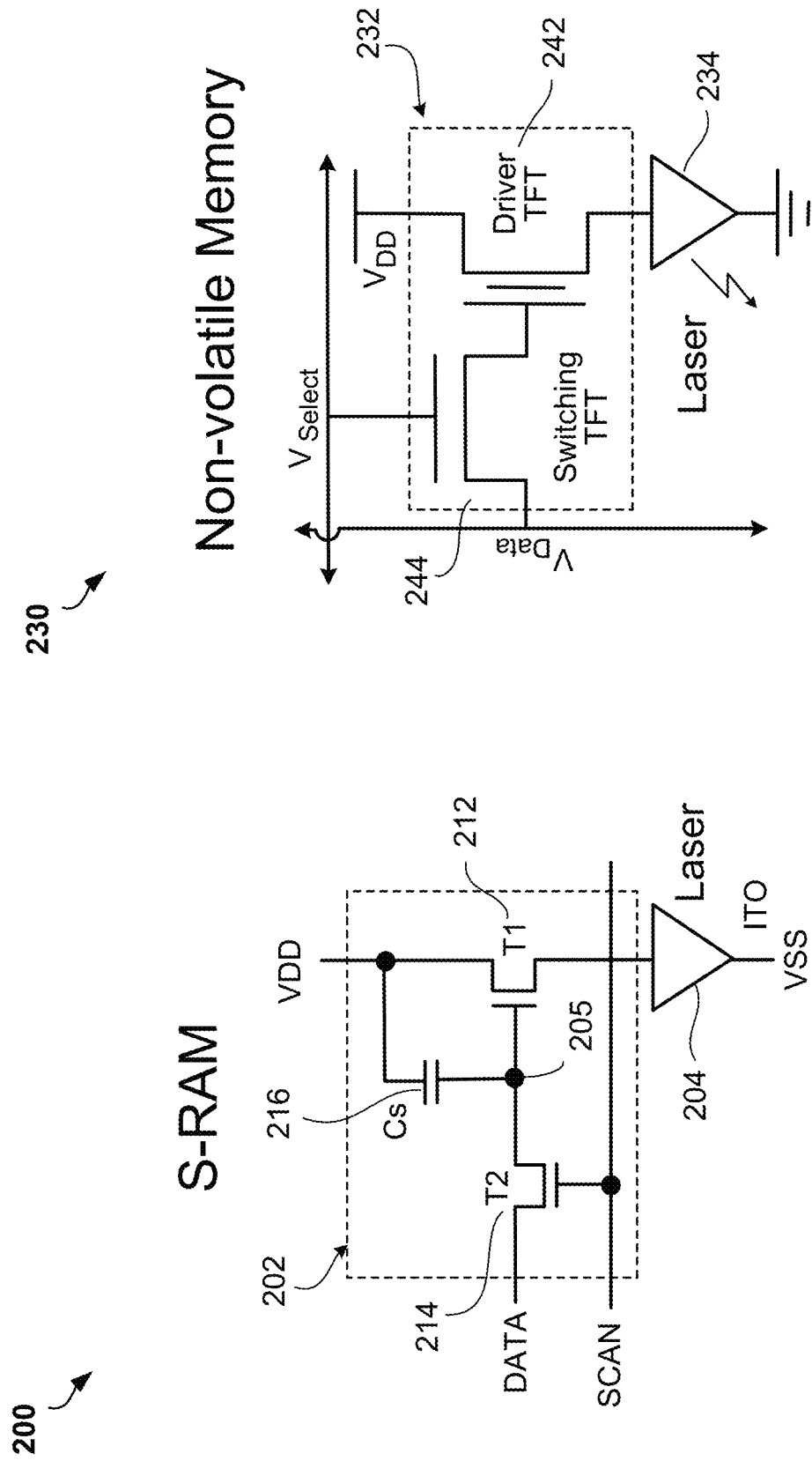
FIGS. 2A-2B are schematic diagrams of example active-matrix laser pixels.

FIG. 1B shows an example implementation of the active-matrix laser pixel display 102 and the display drivers 108. The laser pixel array 102 is composed of 640 (columns)×480 (rows) pixel matrix arranged in columns and rows, respectively. Each pixel 120 is an active-matrix laser pixel. As illustrated in FIGS. 2A-2B below, an active-matrix laser pixel includes at least one laser and at least one non-volatile memory coupled to the at least one laser. Upon receiving the data instructions from the scanning driver 116 and/or the data driver 114, the non-voltage memory can enable each pixel to operate continuously and independently without waiting for the next instruction coming after a full scan.

In some examples, a laser pixel includes a plurality of color elements, e.g., blue color element, red color element, and green color element, and a plurality of corresponding non-volatile memories. Each laser is coupled to a respective non-volatile memory. In some examples, one laser pixel includes three lasers and one non-volatile memory coupled to the three lasers. In some examples, the laser pixel includes a white laser. In some examples, the laser pixel includes four lasers including three lasers emitting basic light such as red, blue, and green, and a white laser emitting white light.

As discussed with further details below, the laser pixel array can be formed by first forming monochrome laser arrays on the substrate and then depositing particular color quantum dots or phosphors on surfaces of the monochrome laser arrays for exciting different colors. Each of the monochrome lasers can be a vertical-cavity surface-emitting laser (VCSEL) or an edge-emitting laser. The monochrome lasers can generate coherent photons in a shorter wavelength, e.g., green color photons, blue color photons, ultraviolet (UV) photons, or deep UV photons. The quantum dots or phosphors can be excited by the shorter-wavelength photons to emit same-wavelength or longer-wavelength photons. In one example, blue color lasers can be used to excite green color quantum dots or phosphors to emit green color light, to excite red color quantum dots or phosphors to emit red color light, to excite blue color quantum dots or phosphors to emit blue color light, and/or to excite yellow color quantum dots or phosphors to emit white color light. In another example, UV lasers can be used to excite blue, green, red, or yellow quantum dots (or phosphors) to emit blue, green, red, or white color light, respectively.

Each monochrome laser includes a number of epitaxially grown semiconductor layers having multiple quantum well (MQW) semiconductor layers as an active medium between two contact electrodes. The MQW layers can include group III-V nitrides (e.g., GaN) and each of the lasers is operable to emit light with a particular color, e.g., blue, green, or red. The emitted wavelength of the lasers is dependent on the MQW materials' band gap and can be controlled by a thickness of InGaN layer (e.g., in a range of 2-3 nm) and GaN/InN ratio, from near ultraviolet for 0.02In/0.98Ga through 390 nm for 0.1In/0.9Ga, violet-blue 420 nm for 0.2In/0.8Ga, blue 440 nm for 0.3In/0.7Ga, green 532 nm for 0.5In/0.5Ga, to red for higher ratios In/Ga. The lasers can also be ultraviolet (UV) or deep UV lasers with an emitted wavelength within a range from 100 nm to 450 nm. The MQW material can also include AlGaN, InAlGaN, or AlN.

The scanning driver 116 can include 480 displacement storages 125, 480 relay drivers 126, and 480 pulse width modulators 127. Each row of laser pixels is coupled to a respective displacement storage 125, a respective relay driver 126, and a respective pulse width modulator 127 through a respective word line (or scanning line) 117. The scanning driver 116 can receive instructions from the control electronics 110 and select one or more particular laser pixels based on those instructions.

In some implementations, the data driver is divided into two sub-drivers 114 positioned on top and bottom of the array 102 of laser pixels, respectively. Each sub-driver 114 can be a 320×4-bit data driver and include 54 section displacement storage 121, 54×6×4-bit storages 122 and 123, and/or 320 digital-to-analog converters (DACs) 124. Each sub-driver 114 is coupled to 320 columns of laser pixels through respective column bit lines 119. Particularly, the top sub-driver 114 is coupled to 320 columns of laser pixels through odd column bit lines, and the bottom sub-driver 114 is coupled to another 320 columns of laser pixels through even column bit lines. An intersection of an individual bit line 119 and an individual word line 117 is coupled to a respective laser pixel. That is, selecting the individual bit line 119 and the individual word line 117 can uniquely select the respective laser pixel. The sub-data driver 114 can receive instructions and/or data from the control electronics 110 through the connections 113, and select one or more particular laser pixels with the scanning driver 116 based on the instructions and/or data and transmit data to the selected particular laser pixels through respective bit lines 119.

In some implementations, the active-matrix laser pixel array based display 100 is covered by a protective layer. The protective layer can be transparent. In some examples, the protective layer is made of glass coated with a conductive material like indium tin oxide (ITO). The protective layer defines an array of spots corresponding to the array of laser pixel. Each spot covers a laser underneath and is coupled to a corresponding non-volatile memory coupled to the laser. The spot and the surface of the laser may form a capacitor, and/or one or more additional capacitors may be formed between the spot and the laser. When the spot is touched, e.g., by a fingertip on top of the spot or moving towards the spot, a capacitance of the capacitors can change. The capacitance change can be detected by a touch screen detector/processor in the control electronics 110 through the non-volatile memory, a corresponding data driver 114/scanning driver 116 coupled to the non-volatile memory, and corresponding connections 113. Thus, the protective layer, the laser array, and the corresponding non-volatile memories can form a touch screen position sensor, which, together with the touch screen detector/processor in the control electronics 110, enables the display 100 to function as a touch screen display. Additional implementations of the touch screen sensor on the laser are also possible, e.g., using other technologies like resistive sensing, surface acoustic wave, infrared grid, infrared acrylic projection acoustic pulse recognition, or dispersive signal technology.

In some implementations, as discussed in further details in FIGS. 4A-4B and FIGS. 5A-5H, the non-volatile memories of the laser pixels are formed on the second side of the substrate, opposite to the lasers of the laser pixels. The non-volatile memories can be coupled to the lasers via conductive electrodes penetrating through the substrate. Each non-volatile memory can be coupled to one of the scanning drivers on the second side through at least one word line and to one of the data drivers on the second side through at least one bit line. The word lines and the bit lines are formed on the second side. A number of the conductive electrodes is no more than a number of the lasers of the laser pixels. For example, in a laser pixel, two or more lasers can be connected first on the first side and then connected to a corresponding non-volatile memory. The number of the conductive electrodes can be smaller than the number of the lasers of the laser pixels.

In some implementations, as discussed in further details in FIGS. 6A-6B and FIGS. 7A-7M, the non-volatile memories of the laser pixels are formed on the first side of the substrate, together with the lasers of the laser pixels. The laser pixels are coupled to the display drivers on the second side through conductive electrodes penetrating through the substrate. Particularly, each non-volatile memory can be coupled to one of the scanning drivers on the second side through at least one word line and to one of the data drivers on the second side through at least one bit line. In some cases, the word lines and the bit lines can be formed on the first side as the non-volatile memories and coupled to the scanning drivers and the data drivers through the conductive electrodes. A number of the conductive electrodes can be identical to a sum of a number of the word lines and a number of the bit lines. In some cases, the word lines and the bit lines can be formed on the second side and conductively coupled to the scanning drivers and the data drivers, respectively, and the non-volatile memories are coupled to the word lines and the bit lines through the conductive electrodes. A number of the conductive electrodes can be identical to a number of the non-volatile memories of the laser pixels.

In some implementations, similar to the LED array based displays as described in FIG. 4A and FIGS. 5A-5J of U.S. patent application Ser. No. 15/291,330, entitled "INTEGRATED LIGHT-EMITTING DIODE ARRAYS FOR DISPLAYS" and filed on Oct. 12, 2016, whose content is hereby incorporated by reference in its entirety, the non-volatile memories of the laser pixels are formed on the first side of the substrate, together with the lasers of the laser pixels, and the scanning drivers and data drivers are also formed on the first side and conductively coupled to the one or more integrated circuits on the second side through the conductive electrodes. A number of the conductive electrodes can be smaller than a sum of a number of the scanning drivers and a number of the data drivers. The word lines and bit lines are formed on the first side and conductively coupled to the scanning drivers and the data drivers, and each of the non-volatile memories is coupled to one of the scanning drivers through at least one word line and to one of the data drivers through at least one bit line.

A number of example integrated laser display systems with multi-color laser pixel arrays have been described above in the present disclosure. Other implementations are also possible. In some implementations, an array of passive-matrix lasers is formed on a first side of a substrate. Display divers (e.g., scanning drivers and data drivers) and connections lines (e.g., word lines and bit lines) are also formed on the first side and coupled to the passive-matrix lasers. For example, each laser can be coupled to a corresponding scanning driver through at least one word line and to a corresponding data driver through at least one bit line. Control electronics are formed on a second side of the substrate and coupled to the display drivers on the first side through conductive interconnects that penetrate through the substrate from the second side to the first side.

In some implementations, an array of laser pixels, e.g., passive-matrix laser or active-matrix laser pixels, is formed on a first side of a primary substrate, and display drivers are formed on a second side of the primary substrate and coupled to the laser pixels through interconnects penetrating through the primary substrate. The display drivers can directly receive image/video data and/or control signals from an external controller or computing device. For example, control electronics, including CPU, memory, controller, or other ICs, can be formed or assembled on a secondary substrate and communicates, e.g., wired or wireless, to the display drivers on the primary substrate. The secondary substrate can be integrated with the primary substrate, e.g., by bonding.

In some implementations, a first part of control electronics for the laser pixel array is integrated (formed or assembled) on the primary substrate, while a second part of the control electronics is on a secondary substrate and communicates with the first part of the control electronics. In one example, the control electronics includes one or more analog signal processors and one or more digital signal processors. The one or more analog signal processors can be on the secondary substrate and the one or more digital signal processors can be integrated on the primary substrate and communicate with the one or more analog signal processors. The digital signal processors are configured to control the laser pixel array. In another example, a controller is integrated on the primary substrate and configured to control the laser pixel array via display drivers, and other components including CPU, memory, and/or ICs, are on the secondary substrate. In some examples, part of the control electronics is formed/fabricated on the substrate, and the other part of the control electronics are external components and assembled, e.g., by bonding, on the substrate.

Example Active Matrix Laser Pixels

FIG. 2A shows an example active-matrix laser pixel 200 with non-volatile memory. The laser pixel 200 can be used as the laser pixel 120 of FIGS. 1A-1B. The laser pixel 200 includes an S-RAM (static-random access memory) 202 and a laser 204. The S-RAM 202 includes a driver transistor (T1) 212, a switching transistor (T2) 214, and a storage capacitor (Cs) 216. The transistors 212 and 214 can be formed on a substrate, e.g., the substrate 101 of FIG. 1A, by complementary metal-oxide-semiconductor (CMOS) technology. For example, the transistors 212 and 214 can be metal oxide semiconductor field effect transistors (MOSFETs).

During display operation, a word line (scanning line or select line) can be pulled high to allow a voltage on a bit line to propagate through the switching transistor 214 to a storage node 205, charging the storage capacitor 216 and setting a high voltage on a gate of the driver transistor 212. This allows a current to pass through the driver transistor 212 and the laser 204 is consequently lighted.

FIG. 2B shows another example active-matrix laser pixel 230 with non-volatile memory 232 and a laser 234. The non-volatile memory 232 includes a driver transistor 242 and a switching transistor 244. In some implementations, different from the laser pixel 200 in FIG. 2A, the brightness of the laser 234 is not controlled by varying $V_{Data}$ applied to a gate of the driver transistor 242 through the switching transistor 244. Instead, a constant voltage $V_{Data}$ is applied to the gate of the driver transistor 242. The current through the driver transistor that causes the laser 234 to illuminate is controlled by changing a threshold voltage VT of the driver transistor 242, e.g., through programming. If low brightness is desired, the driver transistor 242 can be set to a high threshold voltage by programming with a large positive gate pulse. If high brightness is desired, the driver transistor 242 can be set to a low threshold voltage by programming with a small positive gate pulse, or not programming at all, the leaving it with the initial threshold voltage. Thus, an image or video can be displayed by controlling the brightness or on/off status of the lasers of an array.

Figure 2C:
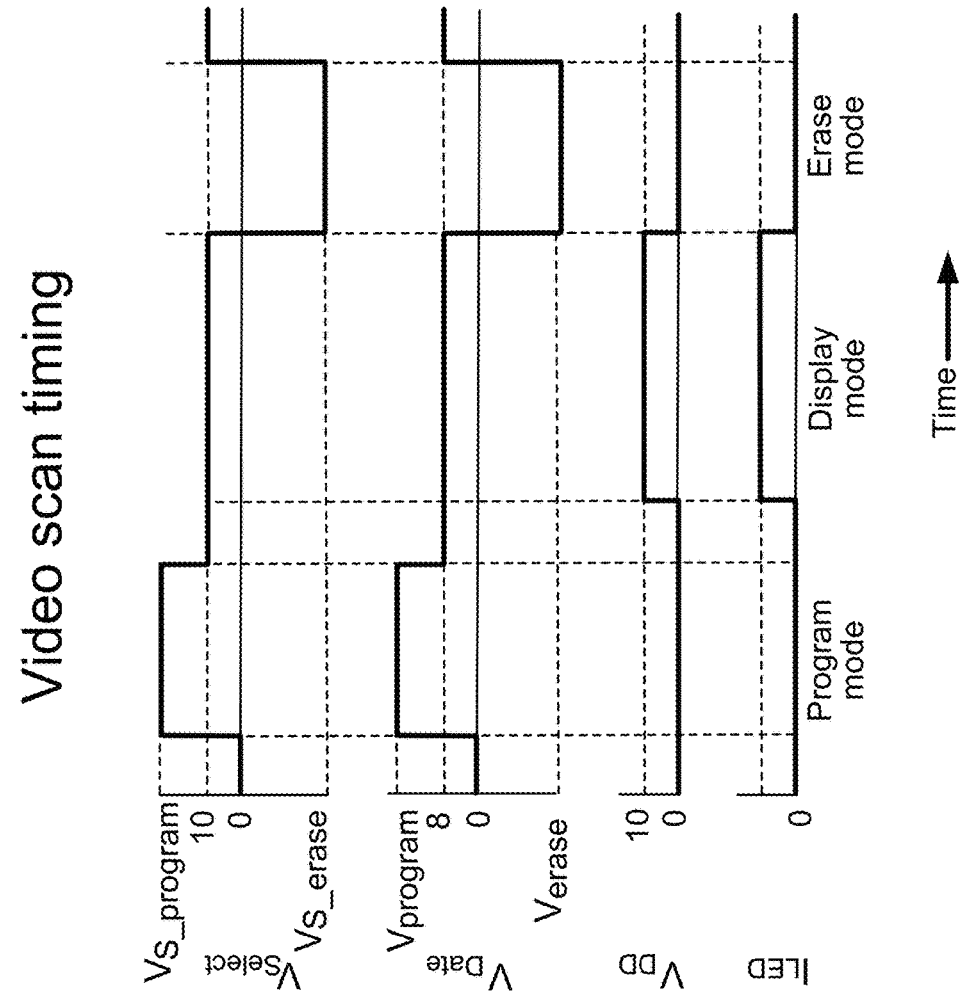
FIG. 2C shows an example timing diagram using active-matrix laser pixels for a video display.

FIG. 2C shows an example video scan timing 250 of a display using the active-matrix laser pixel 230 of FIG. 2B. After programming (or programming mode), the display is activated by setting a supply voltage $V_{DD}$ to 10 V, $V_{Data}$ to 8 V on all the bit lines, and $V_{select}$ to 10 V on all the word lines (select lines). The laser current and therefore brightness of the pixel 230 is determined by the programmed threshold voltage of the driver transistor 242. Both $V_{Data}$ and $V_{select}$ are DC voltages in the display mode because a pixel refresh is not necessary to maintain a static image. The image information remains stored in the threshold voltage of the driver transistor 242 even if the power is turned off. To change the programmed image, the pixels can be first erased and then reprogrammed. Erase mode in FIG. 2C is identical to the program operation. The only difference is that the applied voltage pulse has a larger negative amplitude, instead of a positive one. This negative voltage forces the trapped electrons in the driver transistor 242 to tunnel back out, causing the threshold voltage to shift towards its original un-programmed value. For example, to erase a single pixel in the active matrix (instead of an entire column), all other select lines can be held at −30 V to prevent the erase pulse from propagating to the undesired pixel drivers.

Example Displaying Process

Figure 3:
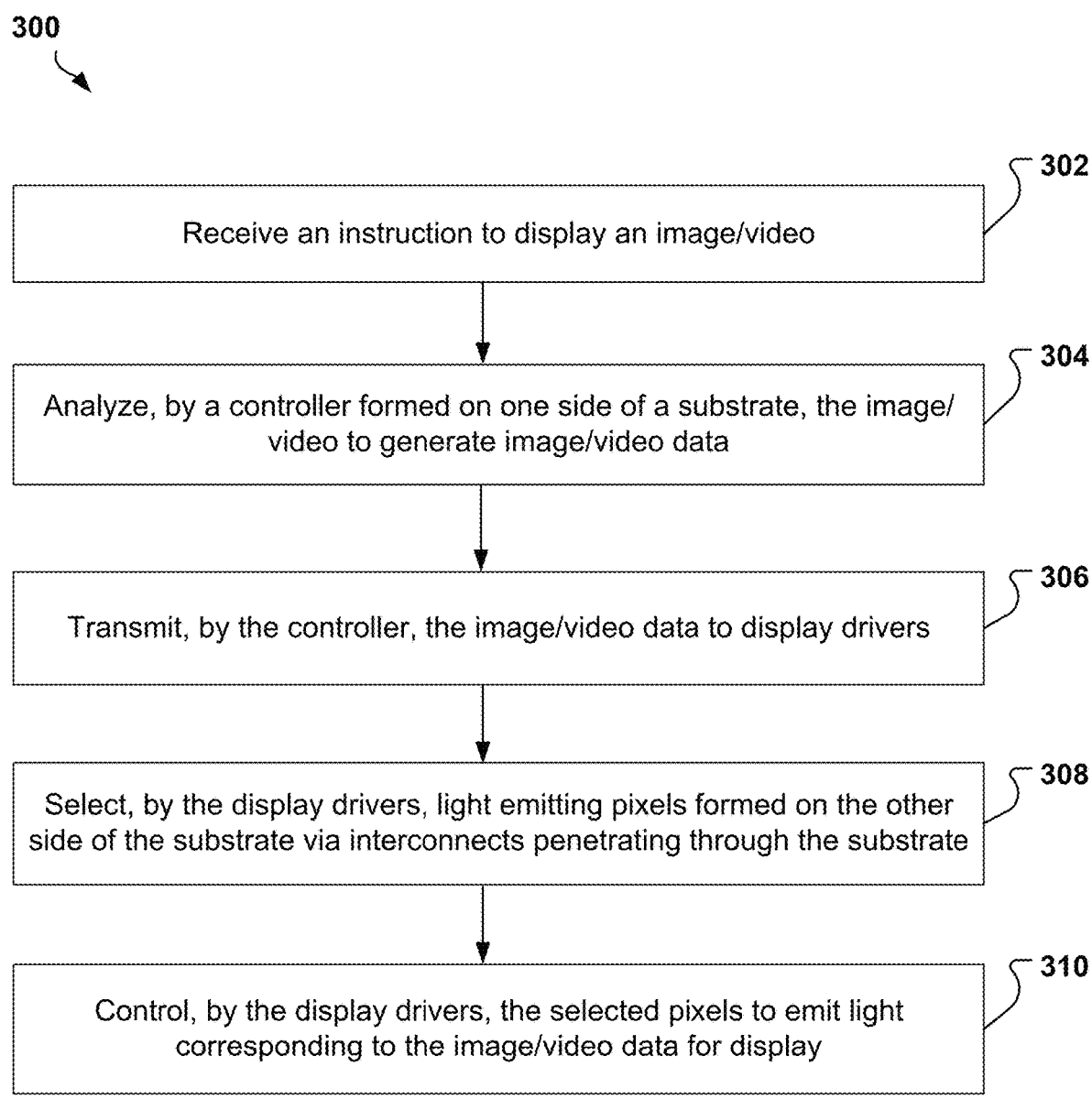
FIG. 3 is a flow diagram of an example process of displaying an image/video on an integrated active-matrix laser pixel array based display system.

FIG. 3 shows an example process 300 of displaying an image/video on an integrated display system. The integrated display system can be the integrated display system 100 of FIG. 1A or any other display system according to the present disclosure. Components of the display system are formed on a substrate, e.g., a single crystal silicon substrate. The image can be static or dynamic. The video can be considered as a series of sequential images, and pixels of the display systems can be refreshed to display a next image to replace a previous image.

An instruction is received to display an image/video (302). The display system can receive the instruction from an external device or network. In some cases, the image/video is received from the external device or network. In some cases, the image/video is stored in a memory in the display system. The memory can be the memory 112 formed on a first side of the substrate.

The image/video is analyzed by a controller of the display system to obtain image/video data (304). The controller can be the processors/controllers 110 of FIG. 1A. The controller is formed on a side of the substrate, e.g., on the first side with the memory. The controller can analyze the image/video to generate the image/video data. In some cases, the image/video data is stored in the memory. The controller can retrieve the stored image/video data based on the received instruction.

The image/video data is transmitted by the controller to one or more display drivers of the display system (306). The display drivers are formed on a second, different side of the substrate and coupled to the controller via conductive interconnects penetrating through the substrate. The second side can be opposite to the first side. In some examples, the controller selects the display drivers based on a result of analyzing the image/video and transmits the image/video data to the selected display drivers. The display drivers can include at least one scanning driver, e.g., the scanning driver 116 of FIG. 1A, and at least one data driver, e.g., the data driver 114 of FIG. 1A.

One or more light-emitting pixels of an array of light-emitting pixels are selected by the display drivers (308). The light-emitting pixels can be the laser pixels 120 of FIGS. 1A-1B, the laser pixel 200 of FIG. 2A, the laser pixel 230 of FIG. 2B. The array of light-emitting pixels are formed on the second side of the substrate. The light-emitting pixels can be active-matrix pixels including non-volatile memories. Each light-emitting pixel is coupled to a display driver through connection lines. In some examples, each light-emitting pixel is coupled to a scanning driver through at least one word line and a data driver through at least one bit line. The scanning driver is configured to select a light-emitting pixel with the data driver, and the data driver is configured to transmit a data signal to the selected light-emitting pixel.

The selected light-emitting pixels are controlled by the display drivers to emit light corresponding to the image/video data (310). The image/video data can be transmitted to the selected light-emitting pixels by the display drivers, e.g., via a voltage applied on the connection lines such as bit lines. As noted above in FIGS. 2A-2C, by controlling the voltage applied on the connection lines or a threshold voltage of a transistor in an active-matrix pixel, the selected light-emitting pixels can be controlled to emit light with brightness corresponding to the image/video data, thus to display the image/video.

Example Integrated Laser Displays and Fabrications

Figure 4A:
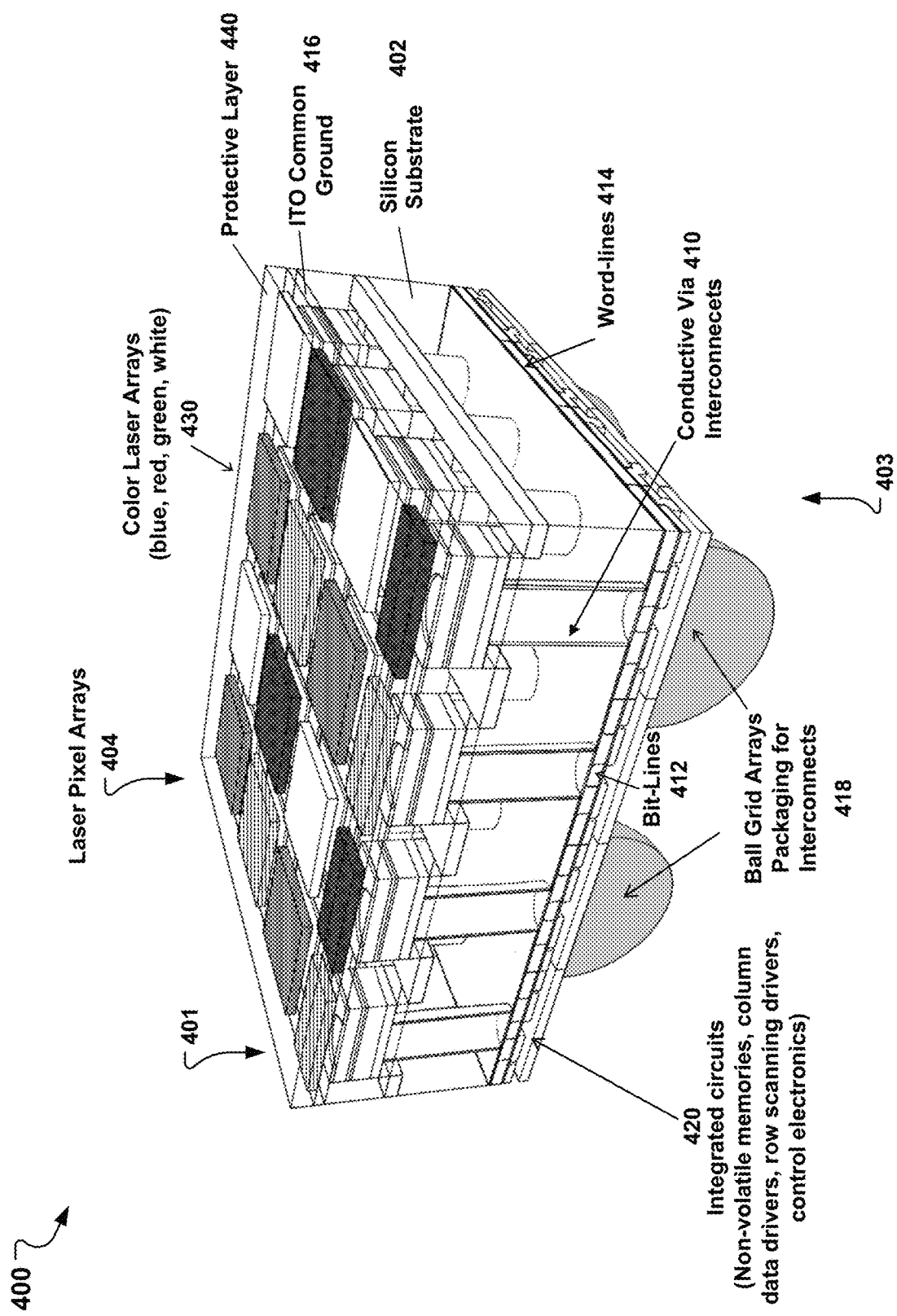
FIG. 4A is a perspective view of an example integrated display system with multi-color laser pixel arrays.

FIG. 4A shows an example integrated laser display system 400 with multi-color laser pixel arrays. The laser display system 400 can be the display system 100 of FIG. 1A. This laser display system 400 is formed on a silicon semiconductor substrate 402, e.g., a silicon wafer, with (111) orientation, or a silicon (111) substrate. The silicon substrate 402 can be a 2-inch silicon wafer, 4-inch silicon wafer, 6-inch silicon wafer, or a combination of multiple silicon substrates.

The silicon substrate 402 has a first side 401 and a second side 403. The first side 401 can be an upper side and the second side 403 can be a lower side opposite to the upper side. Laser arrays 430 of laser pixel arrays 404 are formed on the first side 401 and arranged in rows and columns. As an example, each laser pixel in FIG. 4A includes a blue color element, a red color element, a green color element, and a white color element. As discussed with further details in FIG. 5G, the different color elements can be formed based on primary lasers, e.g., blue color lasers, by depositing different color phosphor material or different size quantum dots material on top of the primary lasers to excite secondary light.

Figure 5A:
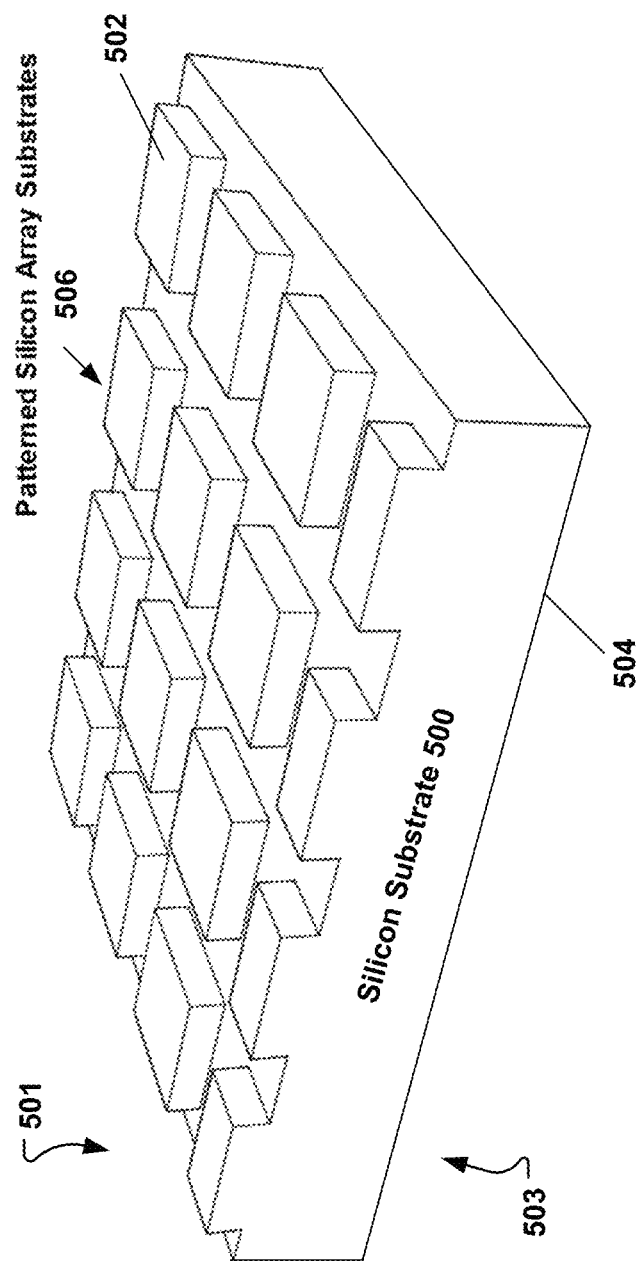
FIGS. 5A-5H are perspective views after different steps of forming the integrated laser display system of FIGS. 4A-4B.
Figure 5B:
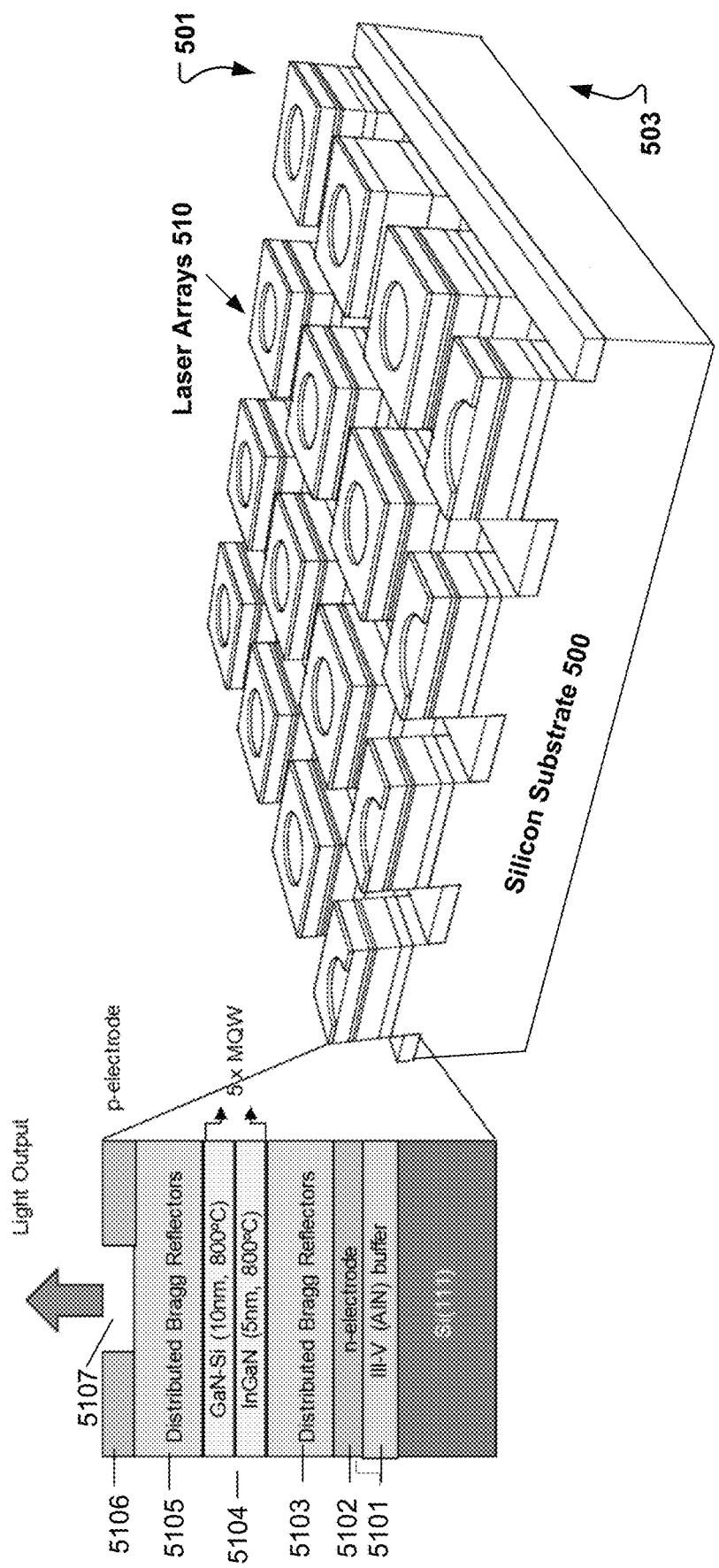

As discussed with further details in FIG. 5B, the primary lasers can be directly formed on a surface of the first side 401 of the substrate 402 by depositing multiple layers including a pair of distributed Bragg reflectors to form an optical resonator and one or more quantum well layers having Group III-V compounds as an active medium in the optical resonator. The distributed Bragg reflectors can be made of pairs of alternating higher-index layer and lower-index layer, e.g., $TiO_2/SiO_2$, AlAs/GaAs, or $AlxGa_{(1-x)}As$/GaAs. Each layer can have an effective thickness substantially identical to a quarter of the laser wavelength in the material, yielding high intensity reflectivity, e.g., above 99%. In some examples, a Group III-V compound layer includes a group III element and a group V element. The group III element can be gallium (Ga). The group V element can be nitride (N). In a particular example, the quantum well layers include a number of pairs of alternating InGaN layer and GaN: Si layer (or alternating AlGaN layer and GaN layer), and each of the lasers is operable to emit a laser light with a primary color.

The primary laser can be a vertical-cavity surface-emitting laser (VCSEL) operable to emit the primary laser light from a top surface of the laser. A first electrically conductive layer, e.g., p doped GaN layer, can be formed on the top surface of the laser as a first electrode layer. The first electrode layer defines an opening for outputting the primary laser light. The first electrode layers of the laser arrays 430 are electrically conductively coupled to a transparent conductive layer 416, e.g., indium tin oxide (ITO), as a common ground. Different color quantum dots (QDs) or phosphors are formed on top of the transparent conductive layer 416 and excitable by the primary laser light from the primary lasers. A protective layer 440 is formed on top of the multi-color laser arrays 430. The protective layer 440 can be transparent. In some examples, the protective layer 440 is made of glass coated with a conductive material like indium tin oxide (ITO).

A second electrically conductive layer, e.g., n doped GaN layer, can be formed on the bottom surface of the laser as a second electrode layer. The second electrode layers of the lasers are separated from each other by electrically isolated material, e.g., SiOx, such that the second electrode layers can be individually controlled.

One or more integrated circuits (ICs) 420 are formed on the second side 403 of the silicon substrate 402. The integrated circuits 420 include non-volatile memories for the lasers arrays. The second electrode layer of each laser is electrically coupled to a respective non-volatile memory via a respective conducive interconnect 410, such that the laser arrays 430 are coupled to the respective non-volatile memories to form the laser pixel arrays 404. The conductive interconnects 410 penetrate through the substrate 402 from the second side 401 to the second electrode layers of the lasers. The number of the conductive interconnects 410 is no more than the number of the lasers of the laser pixel arrays 404.

The integrated circuits 420 can also include column data drivers, row scanning drivers and other control electronics. The control electronics can be similar to the control electronics 106 of FIG. 1A. Each non-volatile memory is coupled to a corresponding data driver through a bit line 412 and a corresponding scanning driver through a word line 414. The bit lines 412 and the word lines 414 are also formed on the second side 403 of the substrate 402. The scanning drivers and the data drivers are coupled to the control electronics via interconnects on the second side. Each scanning driver or each data driver can be individually coupled to (and/or controlled by) the control electronics, e.g., a controller or a processor.

A conductive grid array package, e.g., ball grid array (BGA) package 418, is formed on the second side 403, e.g., on a surface of the integrated circuits 420. The BGA package 418 can include a number of BGA solider balls on the integrated circuits, e.g., no less than 4. A larger number of BGA solider balls with corresponding grid lines enables a higher connection resolution for the integrated circuits 420. The BGA package 418 function as interconnects to connect the integrated circuits 420 to other displays or to a control unit of a larger display. The BGA package enables the formed integrated active-matrix light-emitting pixel array based display 400 to form a larger display with other displays, as described in a U.S. patent application Ser. No. 15/396,135, entitled "LARGER DISPLAYS FORMED BY MULTIPLE INTEGRATED LED ARRAY MICRO-DISPLAYS" and filed on Dec. 30, 2016, whose content is hereby incorporated by reference in its entirety. The larger display can still have the advantages of integrated light emitting pixel arrays but overcome the current dimensional limit of displays fabricated by using standard wafers.

FIGS. 5A-5H show perspective views at different steps of forming the integrated laser display system 400 on a silicon (111) substrate, where lasers are formed on one side and non-volatile memories, display drivers, control electronics, and BGA packages are formed on the other side of the silicon (111) substrate.

The silicon (111) substrate 500 has an upper side 501 including a top surface 502 and a lower side 503 including a bottom surface 504. The top surface 502 and the bottom surface 504 can be parallel to a (111) crystalline plane. The substrate 500 can be pre-treated, e.g., by cleaning the top surface 502 and the bottom surface 504. In some cases, wet chemical treatment, e.g., an RCA clean procedure based on solutions, can be used to remove any organic or inorganic contaminations present on the surfaces 502, 504. The solutions can include hydrogen peroxide, trichloroethylene, acetone, or methanol.

First, the silicon substrate 500 is patterned. In some implementations, a hard mask layer, e.g., SiNx such as $Si_3N_4$, is used as a protective layer for patterning. The patterning of the silicon substrate 500 can include: 1) patterning a hard mask layer on the silicon substrate 500. This patterning can be formed by putting a mold with the desired pattern over the silicon substrate 500 and then depositing the hard mask layer. The hard mask layer can be deposited on the silicon substrate by Metal-Organic Chemical Vapor Deposition (MOCVD), molecular beam epitaxy (MBE), atomic layer deposition (ALD), physical vapor deposition (PVD), Chemical Vapor Deposition (CVD), or any other deposition methods in a vacuum chamber; 2) dry etching silicon of the silicon substrate, e.g., using reactive ion etching (ME) or plasma etching; 3) removing the remaining hard mask layer.

In some cases, the patterning of the silicon substrate occurs over the top surface 502 for forming an array of lasers. FIG. 5A illustrates the substrate 500 patterned by using the hard mask layer SiNx. The patterned silicon substrate includes an array of etched sub-substrates 506 arranged in columns and rows for forming the array of lasers.

In some implementations, photoresist is used as a protective material for patterning. The patterning of the silicon substrate 500 can include: 1) patterning a photoresist layer on the silicon substrate 500, e.g., by photolithography; 2) etching silicon with plasma; 3) removing the remaining photoresist layer from the silicon substrate.

Second, arrays of lasers 510 are formed on surfaces of the sub-substrate 506. Each laser 510 can be a vertical-cavity surface-emitting laser (VCSEL) operable to emit laser light from a top of the laser. The lasers 510 can be formed by depositing multiple layers on surfaces of the silicon substrate parallel to (111) crystalline plane. The multiple layers can be deposited by MOCVD, MBE, ALD, PVD, CVD, or any other suitable deposition methods in a vacuum chamber with a certain temperature.

The multiple layers include a pair of highly-reflective reflectors, e.g., distributed Bragg reflectors, to form an optical resonator and one or more quantum well layers having Group III-V compounds as an active medium in the optical resonator. The distributed Bragg reflectors can be made of pairs of alternating higher-index layer and lower-index layer, e.g., $TiO_2/SiO_2$, AlAs/GaAs, or $AlxGa_{(1-x)}As/GaAs$. Each layer can have an effective thickness substantially identical to a quarter of the laser wavelength in the material, yielding a high intensity reflectivity, e.g., above 99%. In some examples, a Group III-V compound layer includes a group III element and a group V element. The group III element can be gallium (Ga). The group V element can be nitride (N). For example, III-V blue light lasers 510 can be formed by using pairs of InGaN and GaN: Si as the quantum well (MQW) layers.

As illustrated in FIG. 5B, the lasers 510 can include one or more buffer layers 5101, e.g., III-V (AlN) buffer layers, deposited on the silicon (111) surface, a first electrode layer 5102, e.g., n type electrode or n-electrode, a lower reflector 5103, e.g., distributed Bragg reflectors, one or more MQW layers 5104, e.g., 5 pairs of 5-nm InGaN and 10-nm GaN— Si under 800° C., an upper reflector 5105, e.g., another distributed Bragg reflectors, and a second electrode layer 5106, e.g., p type electrode or p-electrode. The second electrode layer 5106 has an opening region configured to allow generated laser light to emit out of the laser 510. The n-electrode layer 5102 can include a n doped semiconductive layer, e.g., a n doped GaAs layer, and the p-electrode layer 5106 can include a p doped semiconductive layer, e.g., a p doped GaAs layer. The lower reflector 5103 and the upper reflector 5105 can be doped as n-type and p-type materials, respectively, forming a diode junction. For example, the lower reflector 5103 can be made of pairs of alternating n-AlAs/GaAs, and the upper reflector 5105 can be made of pairs of alternating p-AlGaAs/GaAs.

Figure 5C:
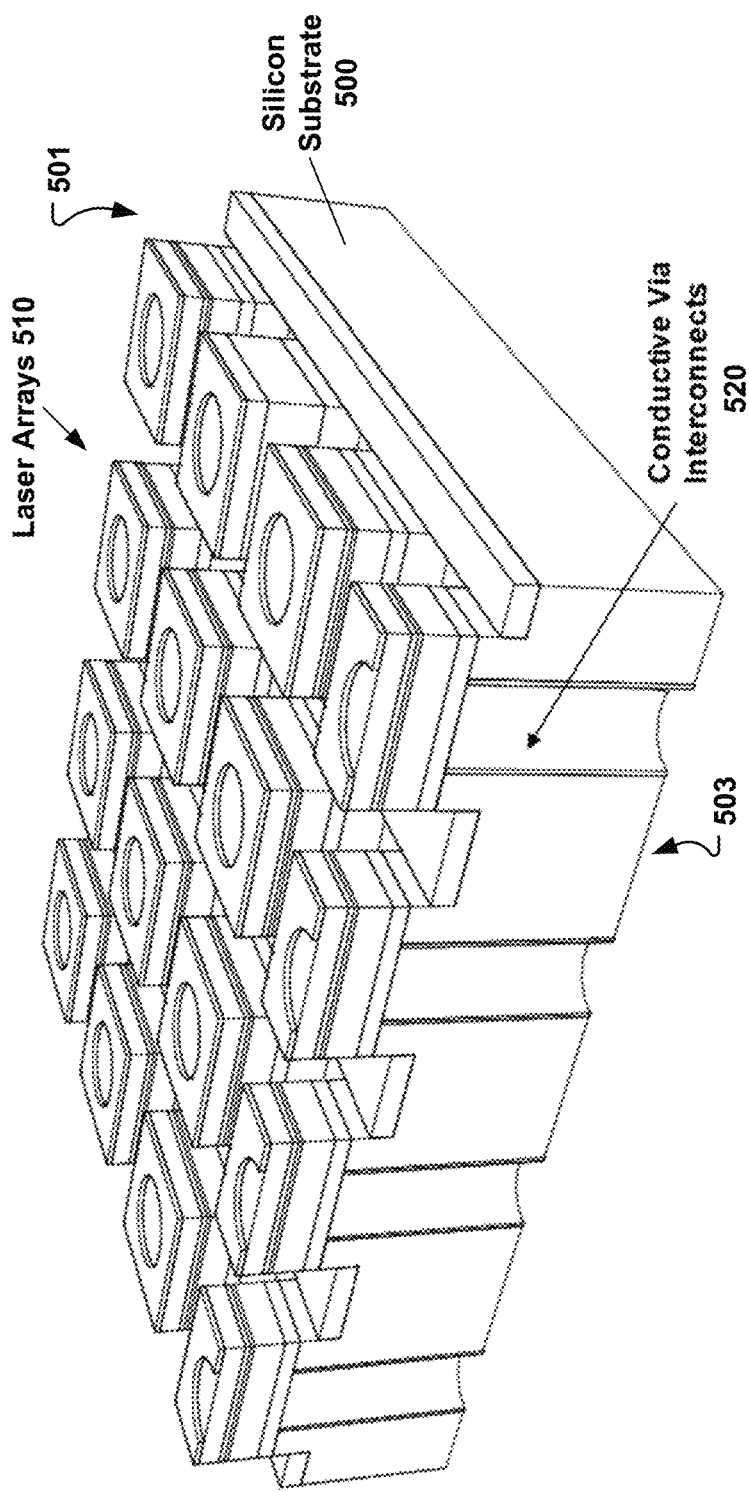

Third, as shown in FIG. 5C, conductive electrodes 520 are formed as interconnects from the bottom surface 504 to a bottom side of each laser 510, e.g., the n-electrode layer 5102, which penetrate through the silicon substrate 500. The conductive electrodes 520 can be implemented with the following steps: 1) the silicon substrate 500 is thinned from the lower side 503; 2) the silicon substrate 500 is selectively etched, e.g., by deep RIE or plasma etch, from the lower side 503 to form deep trenches (or through-holes) underneath each laser 510, e.g., to the n-electrode layer 5102; 3) conductive electrodes are formed inside the deep trenches to form interconnects. In some cases, inner surfaces of the deep trenches are insulated and then metal is filled inside the deep trenches, e.g., by CVD, to form the conductive electrodes 520 as interconnects from the lasers 510 to the lower side 503.

Figure 5D:
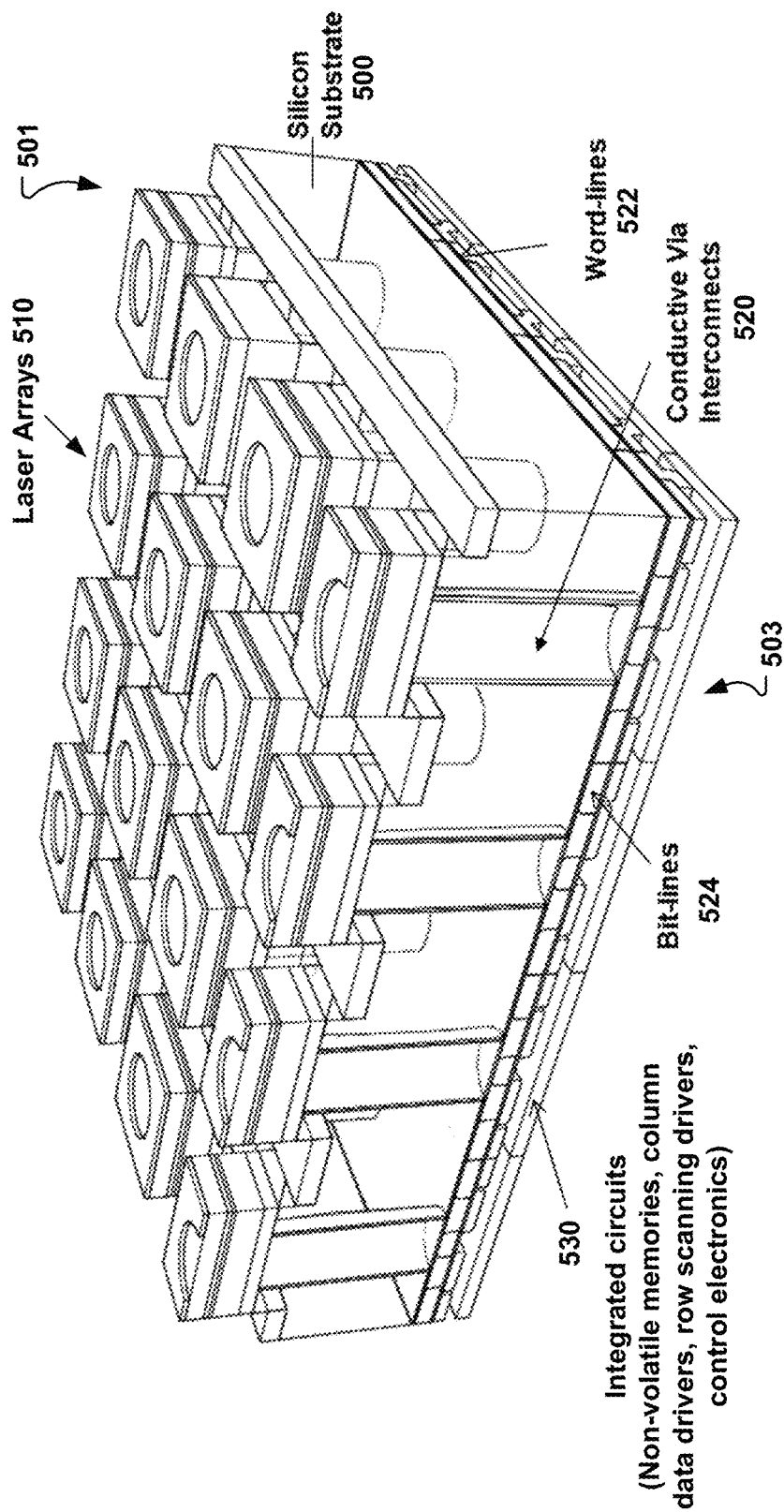
Figure 5E:
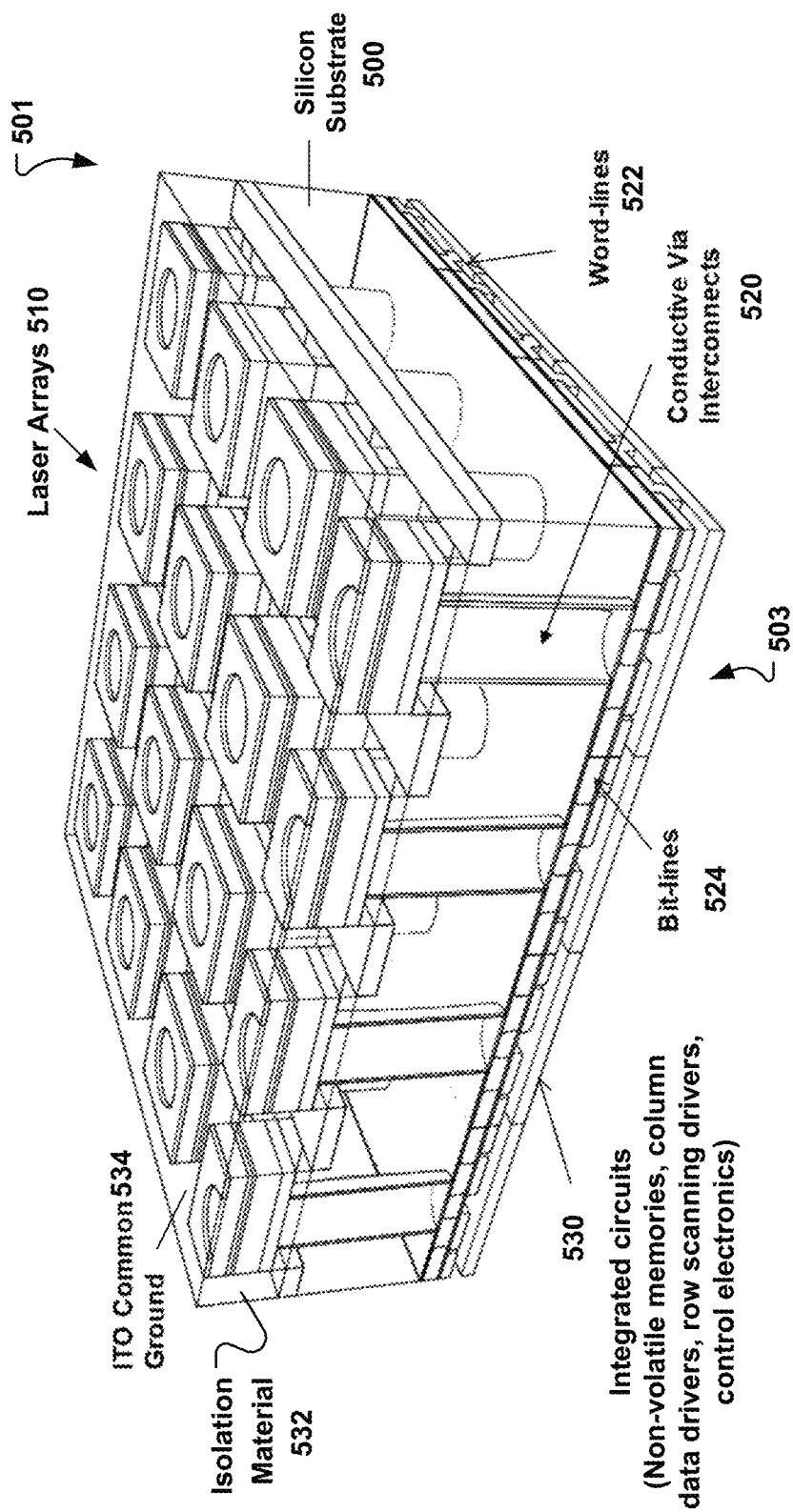

Fourth, as shown in FIG. 5D, integrated circuits 530 are formed on the lower side 503 and coupled to the lasers 510 via the conductive electrodes 520. The integrated circuits 530 can include non-volatile memories, display drivers (column data drivers and row scanning drivers), and control electronics (e.g., CPU/MPU, memory, A/D converters, D/A converters, amplifiers, and other ICs). Each of the non-volatile memories can be similar to the non-volatile memory 200 of FIG. 2A or the non-volatile memory 230 of FIG. 2B. The column data drivers can be similar to the column data driver 114 of FIG. 1A, and the row scanning drivers can be similar to the row scanning drivers 116 of FIG. 1A. The control electronics can be similar to the control electronics 106 of FIG. 1A.

Each non-volatile memory can be coupled to each laser on the upper side 501 through the conductive electrodes 520 to form an active-matrix laser pixel. Each non-volatile memory can be coupled to a row scanning driver via at least one word line 522 and to a column data driver via at least one bit line 524. The word lines 522 and the bit lines 524 are formed on the lower side 503. The display drivers (column data drivers and the scanning drivers) are coupled to the control electronics via connections, e.g., the connections 113 of FIG. 1A. Components in the control electronics can be connected to each other, e.g., via internal bus.

Fifth, the silicon substrate 500 is flipped back from the lower side 503 to the upper side 501. Electrically isolation material 532, e.g., SiOx, is first filled into gaps between adjacent lasers 510, e.g., by chemical vapor deposition (CVD), such that each laser 510 is electrically isolated from each other. The electrically isolation material 532 is also filled in the open regions of the lasers 510. The electrically isolation material 532 is transparent. Then, topology planarization, e.g., polishing by chemical-mechanical polishing (CMP), is performed on the first side to form a flat surface across the lasers 510. The first side can be polished to expose doped surfaces of the lasers 510, e.g., to the p-electrode layer 5106. That is, the flat surface can include the exposed p-electrode layer 5106 of all of the lasers 510. Then, a conductive layer 534, e.g., an ITO layer, is deposited on top of the p-electrode layers 5106 of the lasers 510 to form electrical common ground.

Figure 5F:
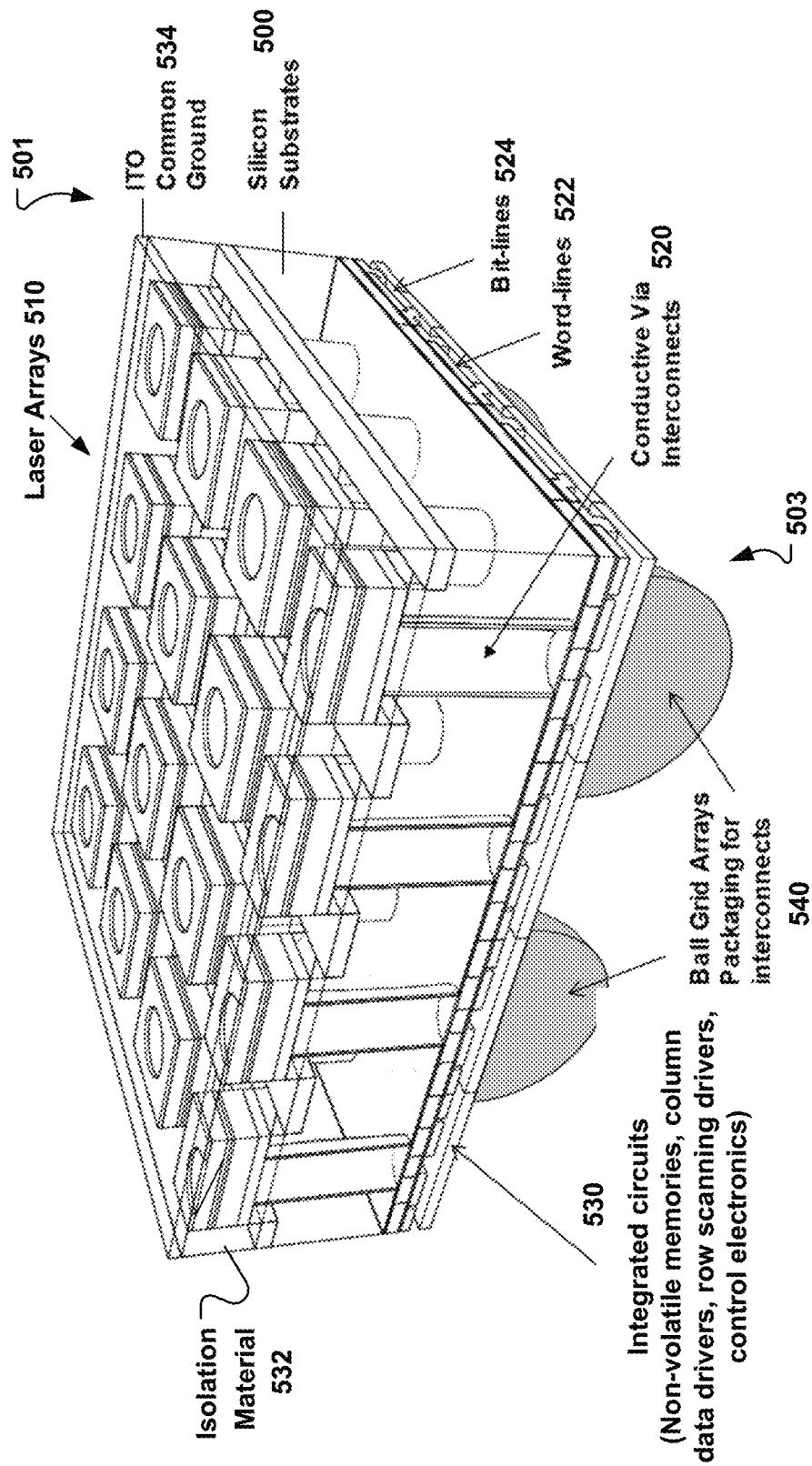

Sixth, as shown in FIG. 5F, a ball grid array (BGA) package 540 is formed on the lower side 503, e.g., on a surface of the ICs 530. Each BGA package 540 can include a number of BGA solider balls on the ICs, e.g., no less than 4. A larger number of BGA solider balls with corresponding grid lines enables a higher connection resolution for the ICs 530. The BGA package 540 function as conductive interconnects to connect the ICs 530 to other displays or to a control unit of a larger display.

Figure 5G:
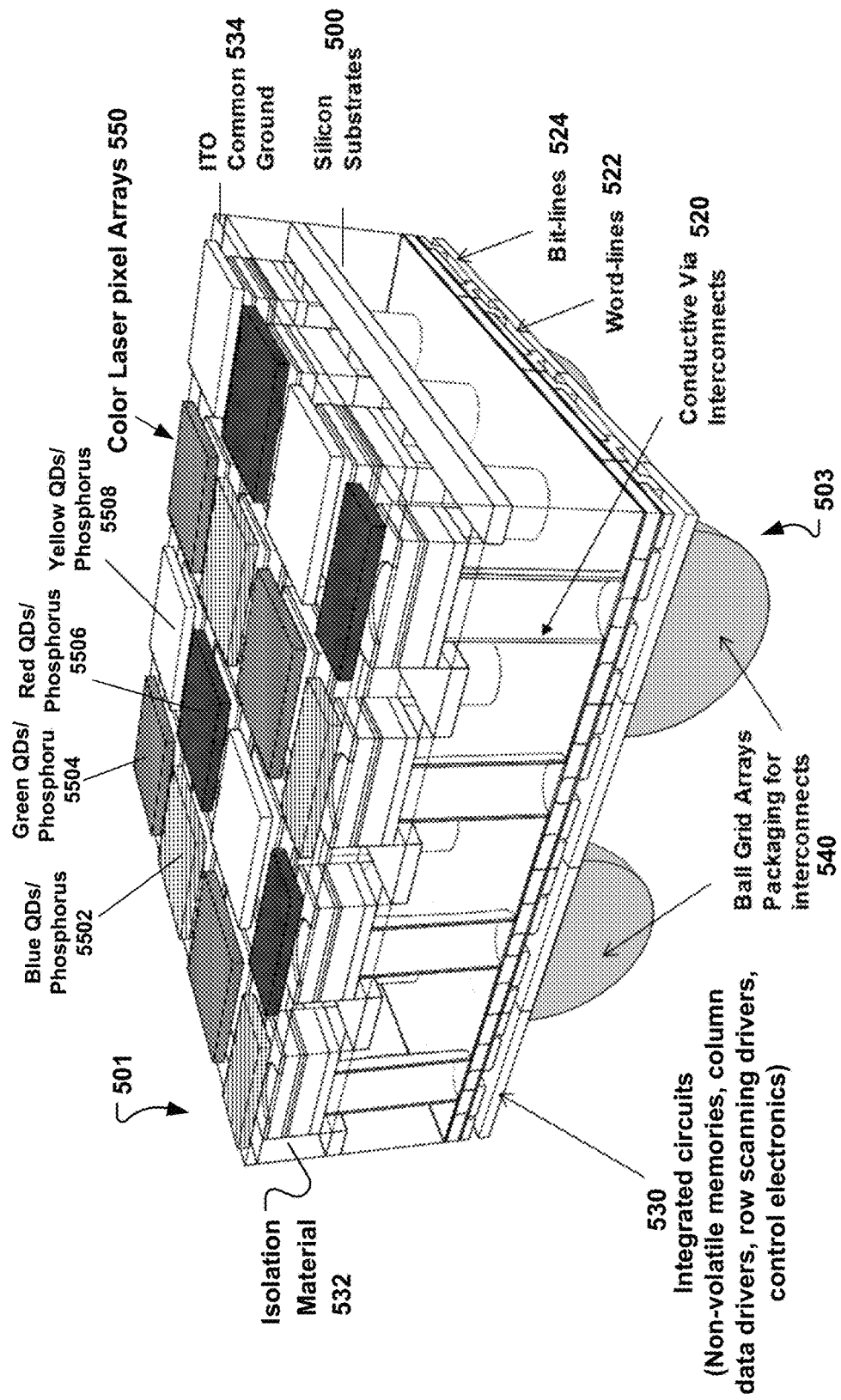

Seventh, the silicon substrate 500 is flipped back from the lower side 503 to the upper side 501. As shown in FIG. 5G, secondary color elements, e.g., blue color elements, red color elements, green color elements, and white color elements, can be formed based on the previously-formed lasers 510, e.g., blue color laser 510. The different color elements can form multi-color laser pixels 550. For example, each laser pixel includes blue color element, red color element, green color element, white color element, and associated non-volatile memories coupled to the lasers in the pixel. The white color element can be included in each pixel to increase a sharpness of displayed images/pictures.

Secondary color elements can be formed on surface of the lasers 510 by using particular color phosphor materials or particular size quantum-dot (QD) materials. Blue QDs/phosphorus 5502, e.g., K2A12B207:Eu2+ Phosphors, can be used to emit blue color when excited by the blue color laser 510; green QDs/phosphrous 5504, e.g., green garnet (GNYAG) phosphors, can be used to emit green color when excited by the blue color laser 510; red QDs/phosphrous 5506, e.g., potassium fluorosilicate (PFS)/K2SiF6 (KSF) phosphors, can be used to emit red color when excited by the blue color laser 510; and yellow QDs/phosphrous 5508, e.g., Cerium(III)-doped YAG phosphors, can be used to emit white color when excited by the blue color laser 510. Note that blue laser 510 emits collimated laser light, which may not be large enough to illuminate a whole area for a laser, and blue color phosphors/QDs can be deposited on top of the blue laser 510 to generate a larger size illumination.

In some implementations, an array of the multi-color laser pixels 550 is formed by the following processes: 1) patterning using photoresist for specific color elements, e.g., red color elements; 2) depositing, e.g., by ink-jet printing, specific color phosphor films or specific size QD thin-films for the specific color, e.g., red phosphor films or red QD thin-films; 3) lifting off to remove the photoresist to form specific color phosphors/Quantum-dot arrays thus to form the specific color element arrays, e.g., red color element arrays; 4) repeating the same processes above to form another specific color element arrays, e.g., green color element arrays, but with another specific color phosphor films or another specific size QD thin-films, e.g., green phosphor films or green QD thin-films; and 5) repeating the same processes above to form another specific color element arrays, e.g., white color element arrays, but with another specific color phosphor films or another specific size QD thin-films, e.g., yellow phosphor films or yellow QD thin-films.

In the example fabrication process, blue lasers 510 are first formed using Group III-V compound layers, e.g., In(0.3)Ga(0.7)N layer, as quantum well layers. Then other color elements, e.g., red color elements, green color elements, or white color elements, are formed by depositing corresponding color phosphor films or corresponding size QD thin-films on the blue color lasers.

In some other implementations, shorter-wavelength lasers, e.g., UV lasers, are first formed using Group III-V compound layers as quantum well layers. Then other color elements, e.g., blue color elements, green color elements, red color elements, or white color elements, are formed by depositing corresponding color phosphor films or QD thin-films on the UV lasers.

Figure 4B:
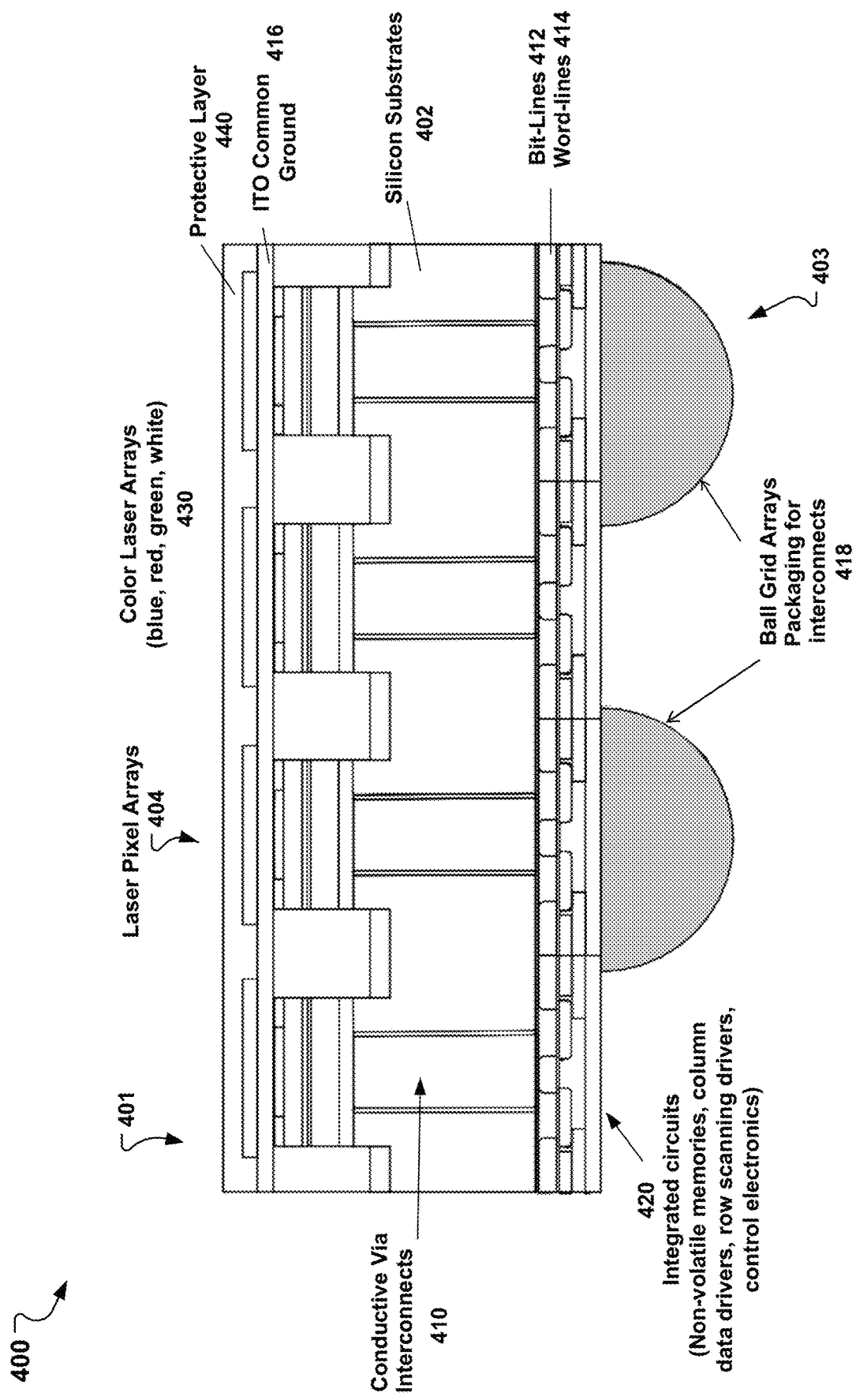
FIG. 4B is a cross-sectional view of the integrated laser display system of FIG. 4A.
Figure 5H:
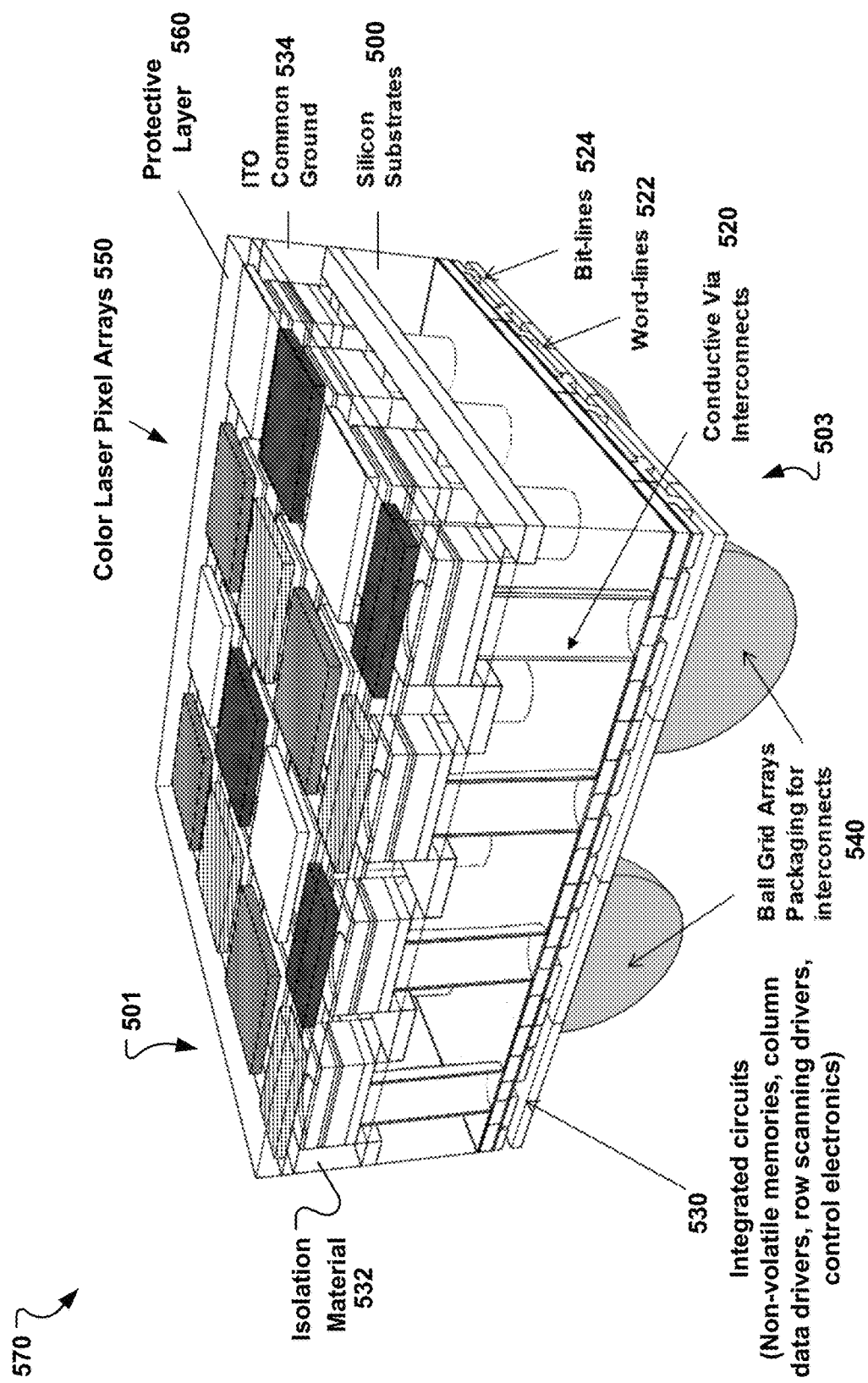

Eighth, as shown in FIG. 5H, a protective layer 560 can be further formed on surfaces of the multi-color laser pixel arrays 550, e.g., on surfaces of the QDs/phosphorus. The protective layer 560 can be made of transparent material, e.g., glass SiOx or plastic. In some implementations, the protective layer 560 can be coated with a conductive material, e.g., indium tin oxide (ITO). The protective layer 560 can be coupled to electrodes of individual laser pixels under the protective layer and forms a touch screen position sensor. The touch screen position sensor can use capacitive sensing. As noted above, a touch on the protective layer can be converted to a capacitance change which is detected by a touch screen detector/analyzer in the control electronics of the integrated circuits 530 through conductive connections. FIG. 5H shows an integrated laser array display 570 formed by the fabrication process as described above, which is similar to the integrated laser array display 400 of FIGS. 4A-4B.

Figure 6A:
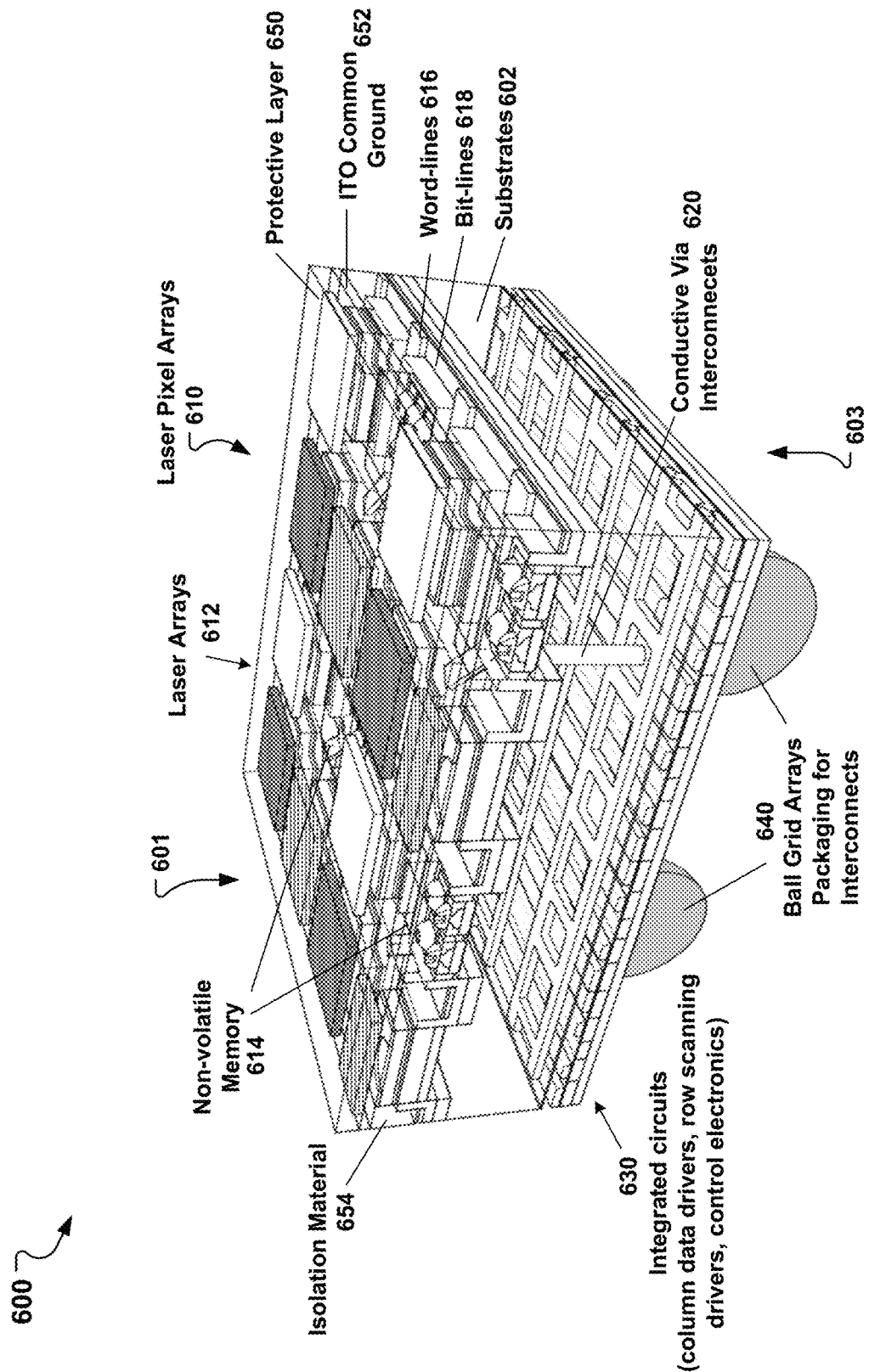
FIG. 6A is a perspective view of an example integrated display system with multi-color laser pixel arrays.
Figure 6B:
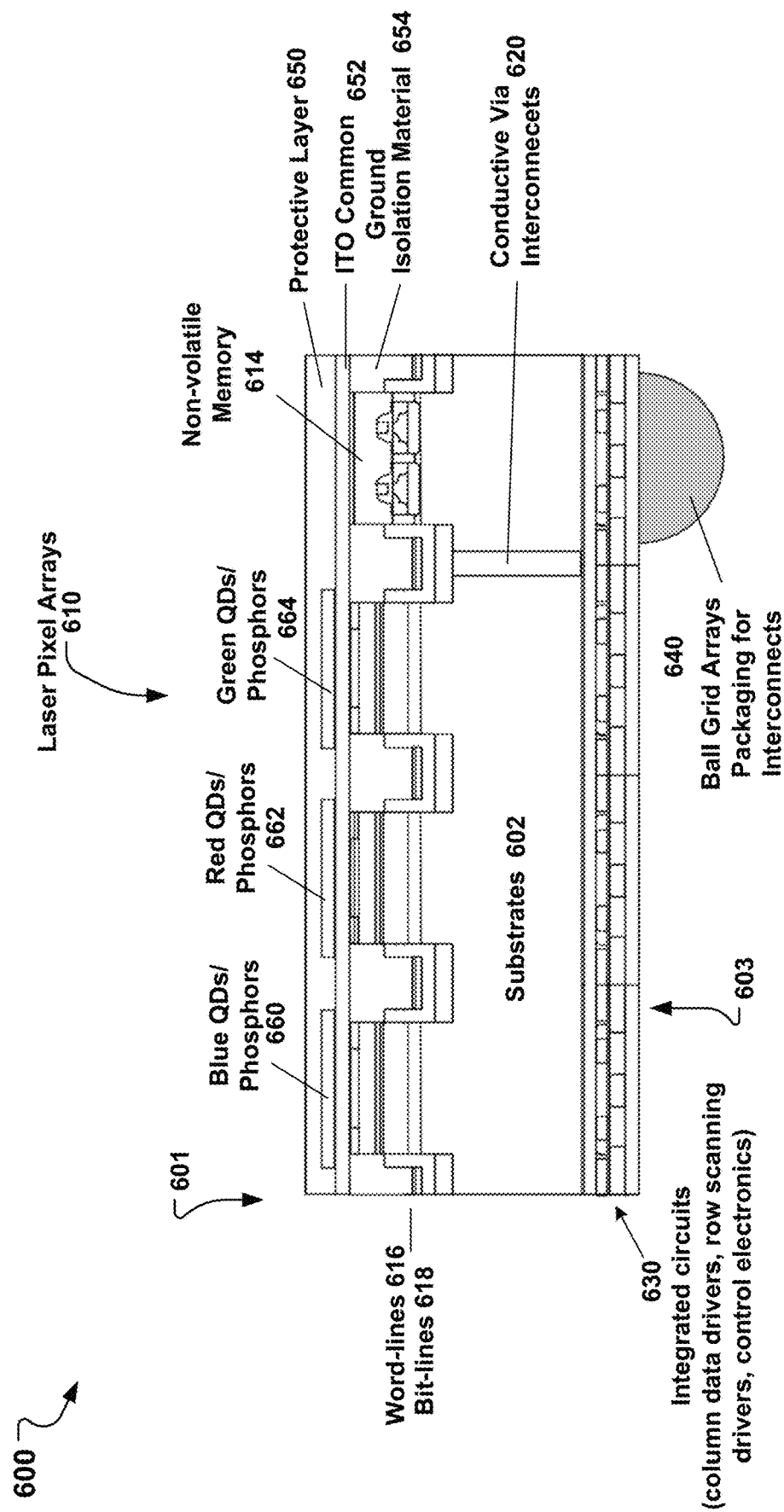
FIG. 6B is a cross-sectional view of the integrated laser display system of FIG. 6A.

FIGS. 6A-6B show another example integrated laser display system 600 with multi-color laser pixel arrays. Compared to the integrated laser display system 400, the laser display system 600 have lasers and non-volatile memories on the same side of a semiconductor substrate to form active-matrix laser pixels, which may reduce the number of conductive electrodes/interconnects penetrating through the semiconductor substrate, although an aspect ratio of the laser display 600 may be smaller than the laser display 400.

The laser display system 600 can be used as the display system 100 of FIG. 1A. This laser display system 600 is formed on a silicon semiconductor substrate 602, e.g., a silicon wafer, with (111) orientation, or a silicon (111) substrate. The silicon substrate 602 can be a 2-inch silicon wafer, 4-inch silicon wafer, 6-inch silicon wafer, or a combination of multiple silicon substrates.

The silicon substrate 602 has a first side 601 and a second side 603. The first side 601 can be an upper side and the second side 603 can be a lower side opposite to the upper side. Laser arrays 612 of laser pixel arrays 610 are formed on the first side 601 and arranged in rows and columns. The lasers are electrically separated from each other by isolation material 654.

As an example, each laser pixel in FIG. 6A includes a blue color element, a red color element, and a green color element. As discussed with further details in FIG. 7L, the different color elements can be formed based on primary lasers, e.g., blue color lasers, by depositing different color phosphor material or different size quantum dots material on top of the primary lasers to excite secondary light. As discussed with further details in FIG. 6B, the primary lasers can be directly formed on a surface of the first side 601 of the substrate 602 by depositing multiple layers including a pair of distributed Bragg reflectors to form an optical resonator and one or more quantum well layers having Group III-V compounds as an active medium in the optical resonator. The distributed Bragg reflectors can be made of pairs of alternating higher-index layer and lower-index layer, e.g., $TiO_2/SiO_2$, AlAs/GaAs, or $Al_xGa_{(1-x)}As$/GaAs. Each layer can have an effective thickness substantially identical to a quarter of the laser wavelength in the material, yielding high intensity reflectivity, e.g., above 99%. In some examples, a Group III-V compound layer includes a group III element and a group V element. The group III element can be gallium (Ga). The group V element can be nitride (N). In a particular example, the quantum well layers include a number of pairs of alternating InGaN layer and GaN: Si layer (or alternating AlGaN layer and GaN layer), and each of the lasers is operable to emit a laser light with a primary color.

The primary laser can be a vertical-cavity surface-emitting laser (VCSEL) operable to emit the primary laser light from a top surface of the laser. A first electrically conductive layer, e.g., p doped GaN layer, can be formed on the top surface of the laser as a first electrode layer. The first electrode layer defines an opening for outputting the primary laser light. The first electrode layers of the laser arrays 612 are electrically conductively coupled to a transparent conductive layer 652, e.g., indium tin oxide (ITO), as a common electric ground. Different color quantum dots (QDs) or phosphors are formed on top of the transparent conductive layer 652 and excitable by the primary laser light from the primary lasers. A protective layer 650 is formed on top of the multi-color laser arrays 610. The protective layer 650 can be transparent. In some examples, the protective layer 650 is made of glass coated with a conductive material like indium tin oxide (ITO). A second electrically conductive layer, e.g., n doped GaN layer, can be formed on the bottom surface of the laser as a second electrode layer. The second electrode layers of the lasers are separated from each other by electrically isolated material, e.g., $SiO_x$, such that the second electrode layers can be individually controlled.

Each laser pixel also includes a pixel memory system 614 positioned adjacent to the primary lasers. The pixel memory system 614 can include at least three non-volatile memories each coupled to one of at least three lasers, respectively. The three lasers and the pixel memory system 614 can be arranged in a rectangular shape or a square shape. Each laser can have a size of about 30 μm or less. Each laser pixel can have a size of about 100 μm or less.

As illustrated in FIGS. 6A-6B, the pixel memory systems 614 of the laser pixels are formed on the first side 601. Word lines 616 and bit lines 618 are also formed on the first side 601, where each word line 616 is coupled to a column of pixel memory systems 614 and each bit line 618 is coupled to a row of pixel memory systems 614.

One or more integrated circuits (ICs) 630 are formed on the second side 603 of the silicon substrate 602. The integrated circuits 630 can include column data drivers, row scanning drivers and other control electronics. The pixel memory systems 614 of the laser pixel arrays 610 are electrically coupled to the column data drivers and the row scanning drivers through the word lines 616, the bit lines 618, and conductive interconnects 620, such that each pixel memory system 614 is coupled to a corresponding data driver through a bit line 612 and a conductive interconnect 620 and a corresponding scanning driver through a word line 616 and a conductive interconnect 620. The conductive interconnects 620 penetrate through the substrate 602 from the second side 603 to the first side 601. The number of the conductive interconnects 620 can be identical to a sum of the number of the word lines 616 and the number of the bit lines 618.

The control electronics can be similar to the control electronics 106 of FIG. 1A. The scanning drivers and the data drivers are coupled to the control electronics via interconnects formed on the second side 603. Each scanning driver or each data driver can be individually coupled to (and/or controlled by) the control electronics, e.g., a controller or a processor.

A conductive grid array package, e.g., ball grid array (BGA) package 618, is formed on the second side 603, e.g., on a surface of the integrated circuits 620. The BGA package 618 can include a number of BGA solider balls on the integrated circuits, e.g., no less than 6. A larger number of BGA solider balls with corresponding grid lines enables a higher connection resolution for the integrated circuits 620. The BGA package 618 function as interconnects to connect the integrated circuits 620 to other displays or to a control unit of a larger display. The BGA package enables the formed integrated active-matrix light-emitting pixel array based display 600 to form a larger display with other displays.

FIGS. 7A-7M are perspective views at different steps of forming an integrated active-matrix laser display system, e.g., the laser display system 600 of FIGS. 6A-6B, on a silicon (111) substrate 700.

The silicon (111) substrate 700 has an upper side 701 including a top surface 702 and a lower side 703 including a bottom surface 704. The top surface 702 and the bottom surface 704 can be parallel to a (111) crystalline plane. The substrate 700 can be pre-treated, e.g., by cleaning the surfaces 702 and 704. In some cases, wet chemical treatment, e.g., an RCA clean procedure based on solutions, can be used to remove any organic or inorganic contaminations present on the surfaces 702 and 704. The solutions can include hydrogen peroxide, trichloroethylene, acetone, or methanol.

Figure 7A:
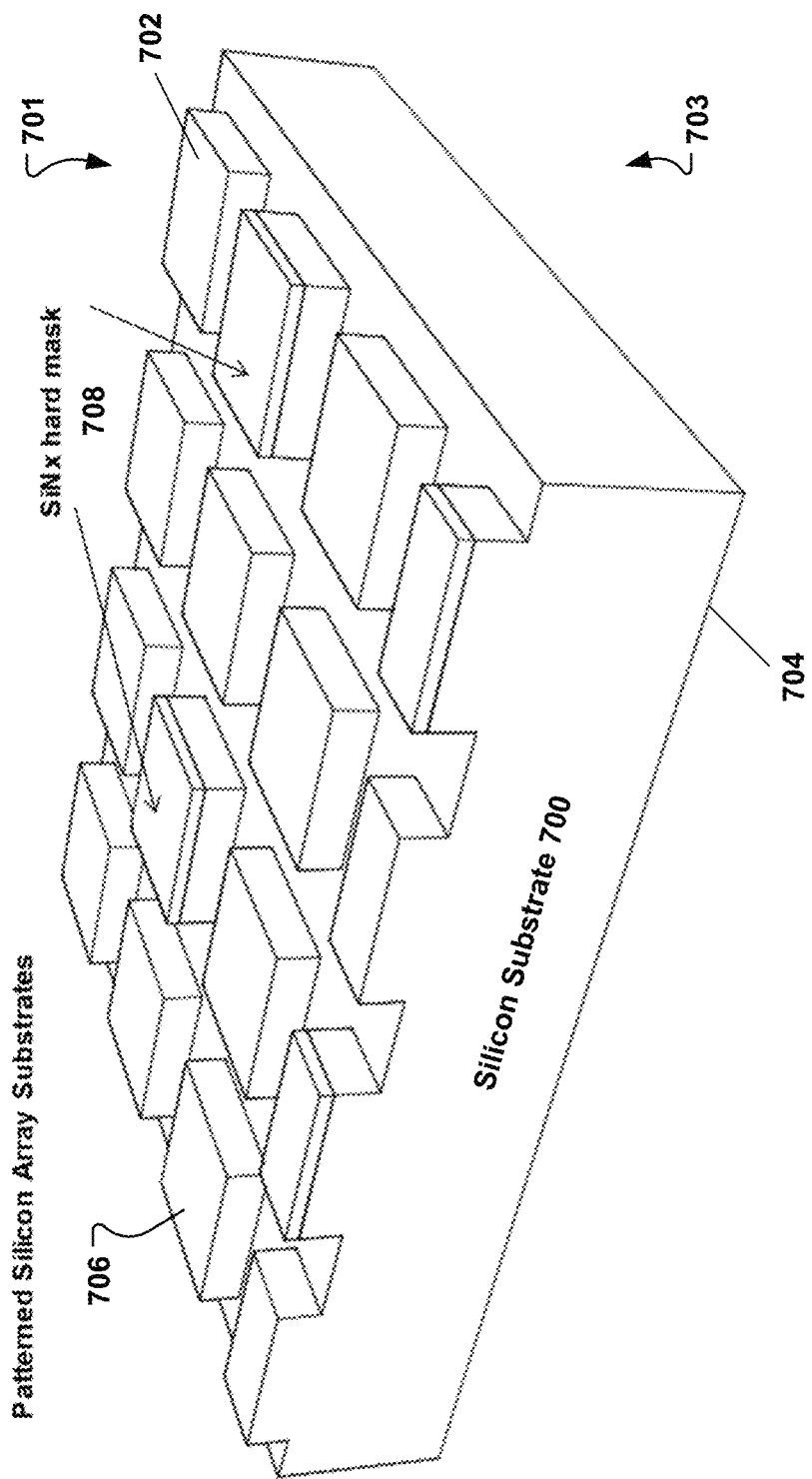

First, as shown in FIG. 7A, the silicon substrate 700 is patterned. In some implementations, a hard mask layer, e.g., SiNx such as $Si_3N_4$, is used as a protective layer for patterning. The patterning of the silicon substrate 700 can include: 1) patterning a hard mask layer on the silicon substrate 700. This patterning can be formed by putting a mold with the desired pattern over the silicon substrate 700 and then depositing the hard mask layer. The hard mask layer can be deposited on the silicon substrate by MOCVD, MBE, ALD, PVD, CVD, or any other deposition methods in a vacuum chamber; 2) dry etching silicon of the silicon substrate, e.g., using reactive ion etching (ME) or plasma etching; 3) selective removing the remaining hard mask layer to expose patterned silicon substrates 706. The exposed patterned silicon substrates 706 are used for forming lasers. A plurality of patterned silicon substrates 708 is kept with the remaining hard mask layer to be used for forming non-volatile memories for the lasers formed on the patterned silicon substrates 706.

In some implementations, photoresist is used as a protective material for patterning. The patterning of the silicon substrate 700 can include: 1) patterning a photoresist layer on the silicon substrate 700, e.g., by photolithography; 2) etching silicon with plasma. In some cases, edges of the silicon substrate for forming data drivers and scanning drivers can also be protected from etching; 3) removing the remaining photoresist layer from the silicon substrate to expose patterned silicon substrates 706 that are used for forming lasers. A plurality of the patterned silicon substrates 706 is selected to be coated with a hard mask layer, e.g., SiNx, to get patterned silicon substrates 708, which is used for forming non-volatile memories for the lasers.

Figure 7B:
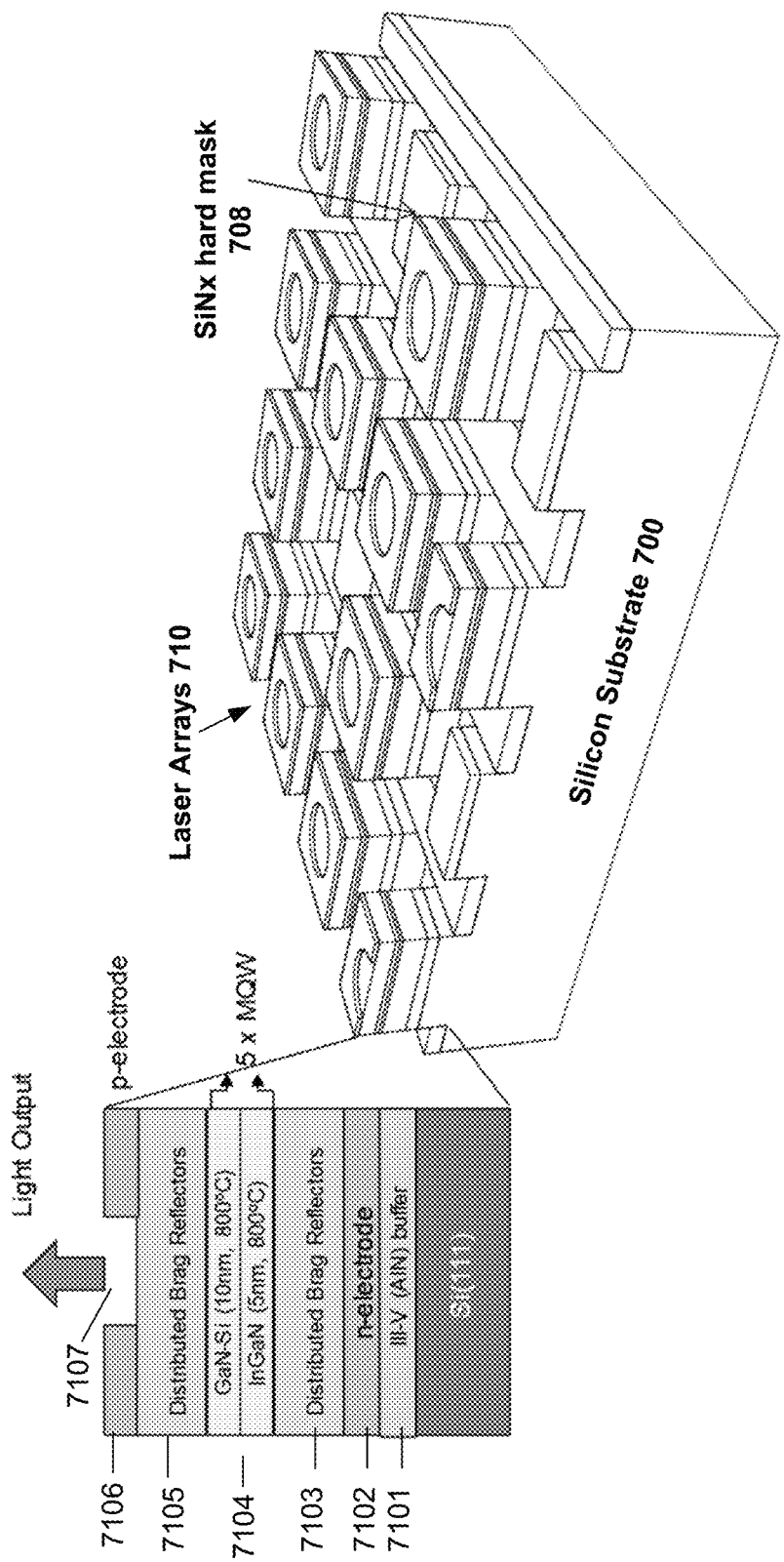

Second, as shown in FIG. 7B, arrays of lasers 710 are formed on the upper side 701 of the patterned silicon substrates 706. Each laser 710 can be similar to the laser 510 of FIG. 5B. The lasers 710 can be formed by depositing multiple layers on surfaces of the silicon substrate parallel to (111) crystalline plane. The multiple layers can be deposited by MOCVD, MBE, ALD, PVD, CVD, or any other suitable deposition methods in a vacuum chamber with a certain temperature.

The multiple layers include a pair of distributed Bragg reflectors to form an optical resonator and one or more quantum well layers having Group III-V compounds as an active medium in the optical resonator. The distributed Bragg reflectors can be made of pairs of alternating higher-index layer and lower-index layer, e.g., $TiO_2/SiO_2$, AlAs/GaAs, or $Al_xGa_{(1-x)}As$/GaAs. Each layer can have an effective thickness substantially identical to a quarter of the laser wavelength in the material, yielding a high intensity reflectivity, e.g., above 99%. In some examples, a Group III-V compound layer includes a group III element and a group V element. The group III element can be gallium (Ga). The group V element can be nitride (N). For example, III-V blue light lasers 710 can be formed by using pairs of InGaN and GaN: Si as the quantum well (MQW) layers.

As illustrated in FIG. 7B, each laser 710 can include one or more buffer layers 7101, e.g., III-V (AlN) buffer layers, deposited on the silicon (111) surface, a first electrode layer 7102, e.g., n-electrode layer, a lower reflector 7103, e.g., distributed Bragg reflectors, one or more MQW layers 7104, e.g., 5 pairs of 5-nm InGaN and 10-nm GaN—Si under 800° C., an upper reflector 7105, e.g., another distributed Bragg reflectors, and a second electrode layer 7106, e.g., p-electrode layer. The second electrode layer 7106 has an opening region 7107 configured to allow generated laser light emits out of the laser 710. The n-electrode layer 7102 can include a n doped semiconductive layer, e.g., a n doped GaAs layer, and the p type electrode 7106 can include a p doped semiconductive layer, e.g., a p doped GaAs layer. The lower reflector 7103 and the upper reflector 7105 can be doped as n-type and p-type materials, respectively, forming a diode junction. For example, the lower reflector 7103 can be made of pairs of alternating n-AlAs/GaAs, and the upper reflector 7105 can be made of pairs of alternating p-AlGaAs/GaAs.

The lasers 710 are selectively formed on the etched substrates 706. The other patterned silicon substrates 708 are protected, by the hard mask layer, from depositing the laser multiple layers and reserved for forming non-volatile memories for the lasers 710. Each patterned silicon substrate 708 can be configured adjacent to three or four substrates 706. The substrates 706 and 708 can be configured for forming laser pixels each with a minimized size or a specified size. Some other areas for forming conductive connections, e.g., bit lines, word lines, and/or interconnects, can be also protected from depositing the laser multiple layers.

Figure 7C:
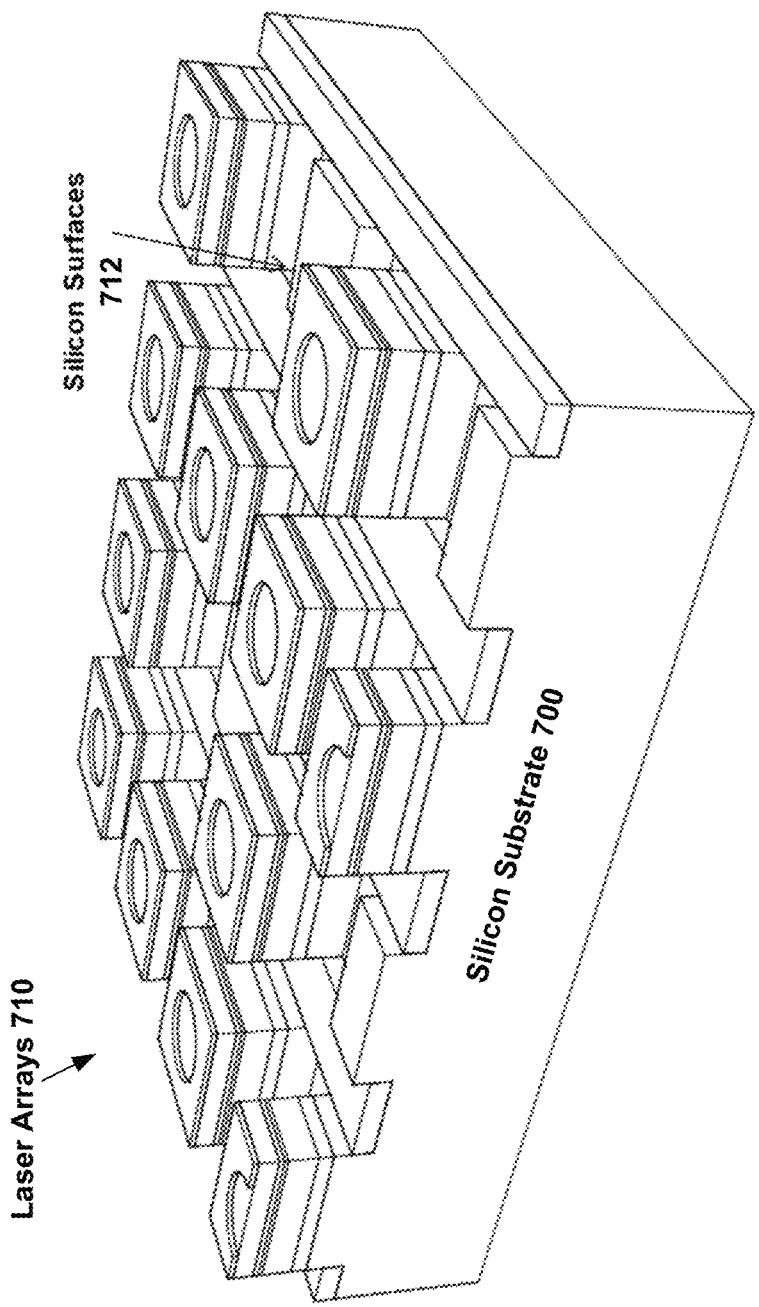

Third, the areas for forming non-volatile memories, bit lines, word lines, and/or interconnects can be selectively opened, e.g., by etching, and/or cleaned to prepare for forming these components. As illustrated in FIG. 7C, the areas including the patterned silicon substrates 708 are selectively etched and cleaned, such that the previously remained hard mask layer SiNx can also be removed to expose silicon surfaces. The cleaned patterned silicon substrates become patterned silicon substrates 712 with exposed silicon surfaces.

Figure 7D:
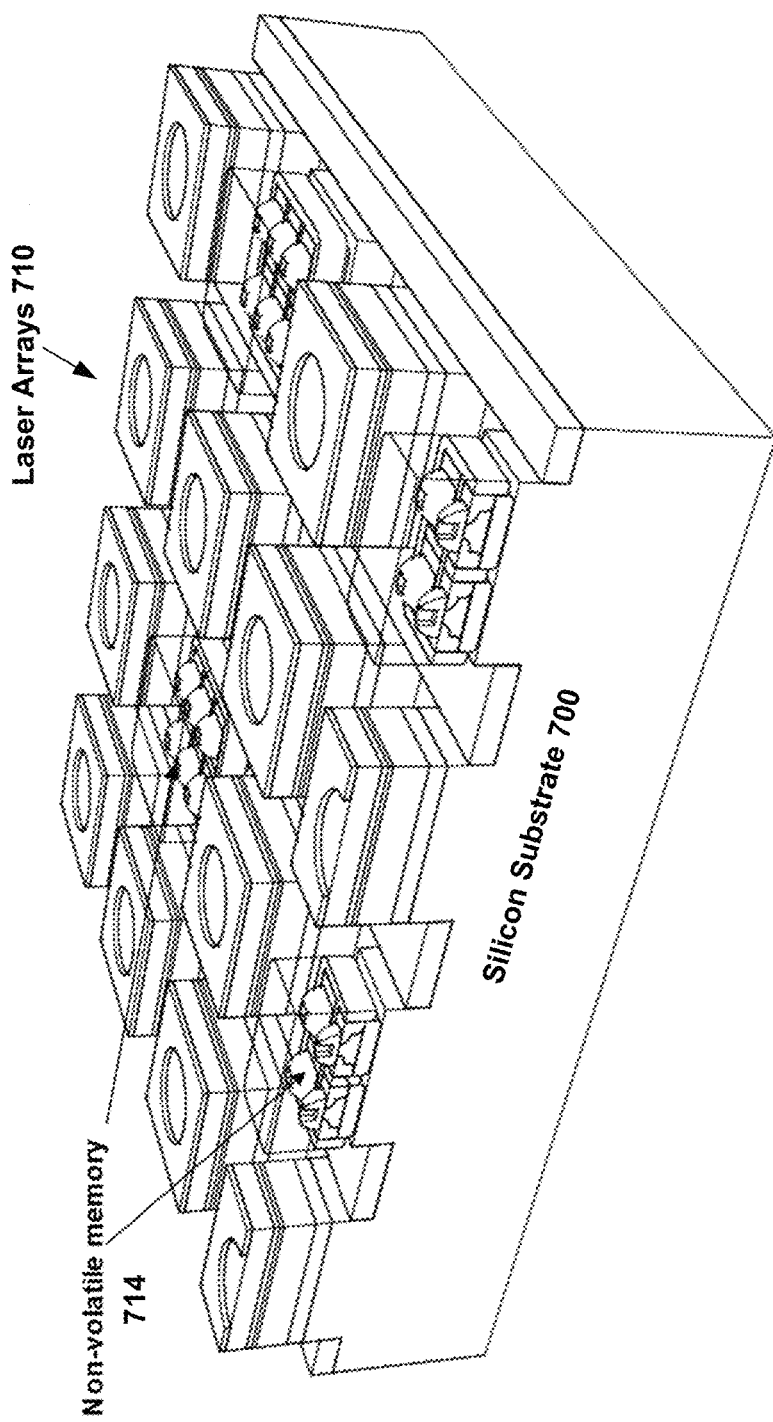

Fourth, as illustrated in FIG. 7D, non-volatile memories 714 are formed on the cleaned patterned silicon substrates 712 on the upper side 701 of the silicon substrate 700. Each non-volatile memory can be coupled to a respective laser or multiple lasers to form an active-matrix laser pixel. In some examples, for three lasers in one pixel, there may have three respective non-volatile memories.

Figure 7E:
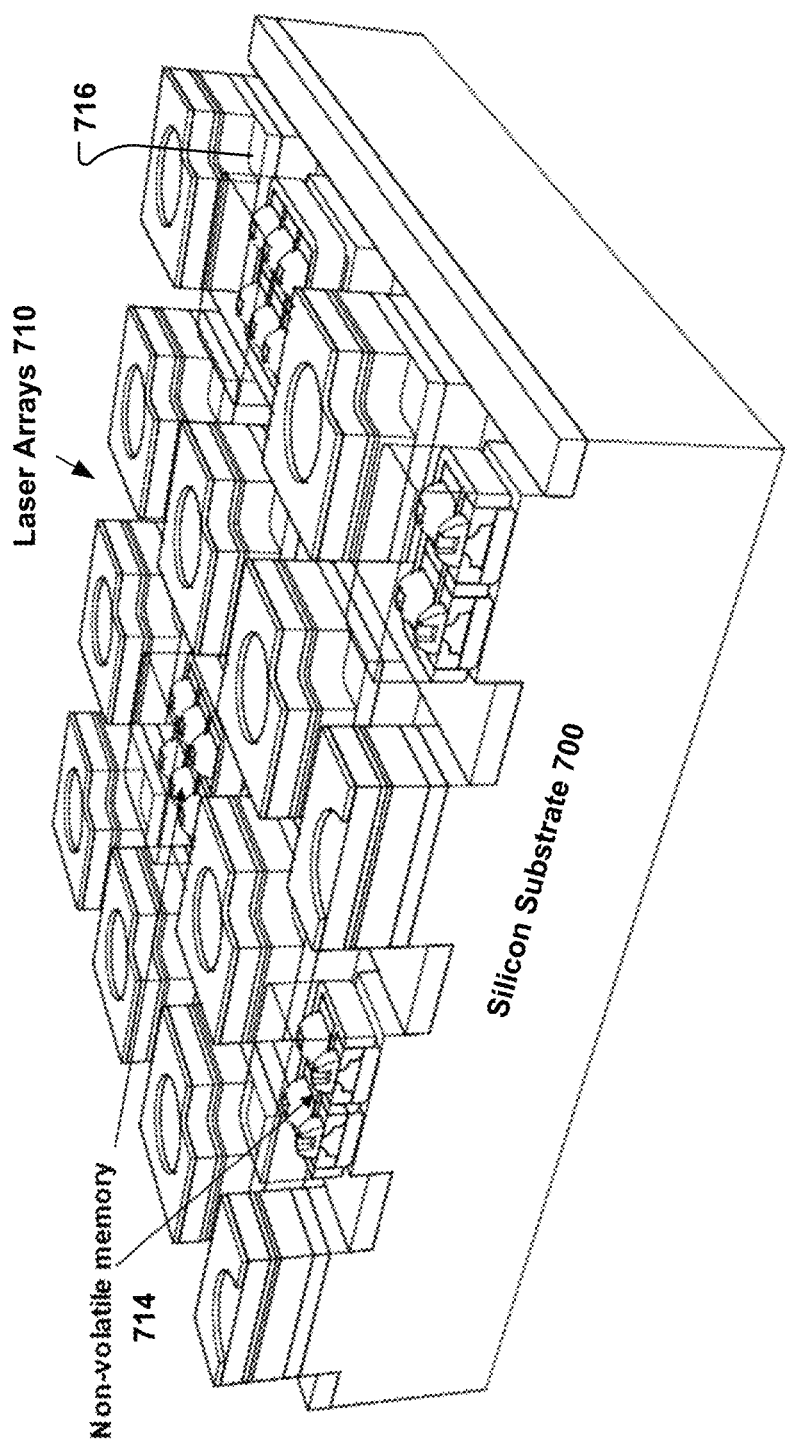

Fifth, as illustrated in FIG. 7E, the lasers 710 are selectively etched to open for forming Ohmic contacts 716 of the lasers 710. For example, the lasers 710 can be etched to a lower Group III-V compound layer under the quantum well layer. The lower Group III-V compound layer can be p-doped, e.g., p-GaN, and an n-type electrode (cathode) can be formed on the p-doped Group III-V compound layer as the Ohmic contacts 716. A top layer of the lasers 710 can be an n-doped Group III-V compound layer, and a p-type electrode (anode), e.g., a passivation ITO layer, can be formed on the n-doped Group III-V compound layer. In another example, the lower Group III-V compound layer can be n-doped, e.g., n-GaN, and a p-type electrode (anode) can be formed on the n-doped Group III-V compound layer as the Ohmic contacts 716; the top layer of the lasers can be p-doped Group III-V compound layer, e.g., p-GaN, and a n-type electrode (cathode) can be formed on the p-doped Group III-V compound layer.

Figure 7F:
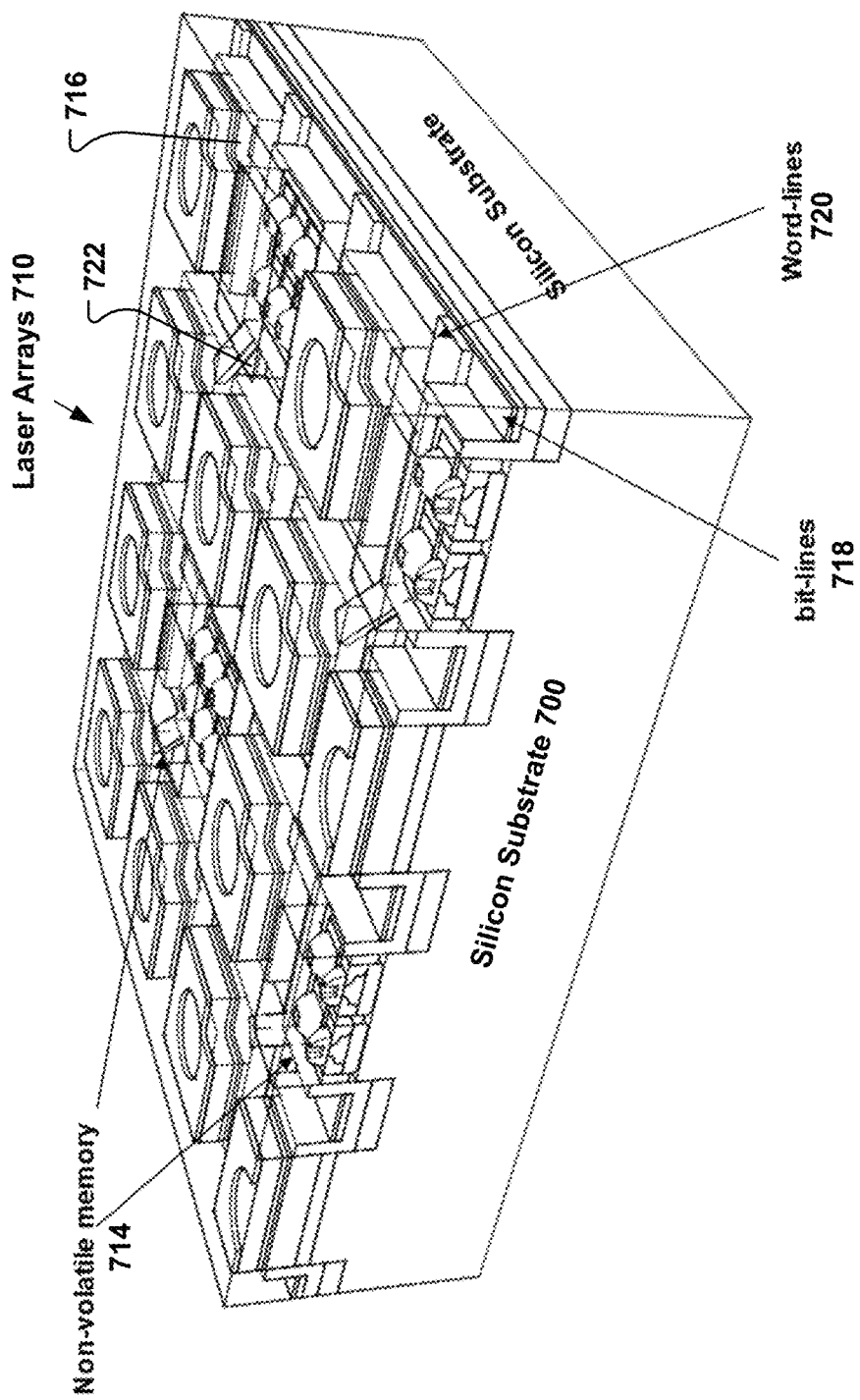

Sixth, as illustrated in FIG. 7F, bit lines 718 and word lines 720 are formed, e.g., in multiple rows and columns, respectively. The bit lines 718 and word lines 720 are conductively connected to the non-volatile memories 714. Particularly, each non-volatile memory 714 is connected to at least one respective column bit line 718 and to at least one respective row word line 720.

Interconnects 722 between the Ohmic contacts 716 of the lasers 710 and the non-volatile memories 714 and interconnects 724 between the non-volatile memories 714 and the bit lines 718 and the word lines 720 are also formed. In such a way, each laser 710 is conductively coupled to a non-volatile memory 714 that is further coupled to at least one corresponding bit line 718 and to at least one corresponding word line 720.

Figure 7G:
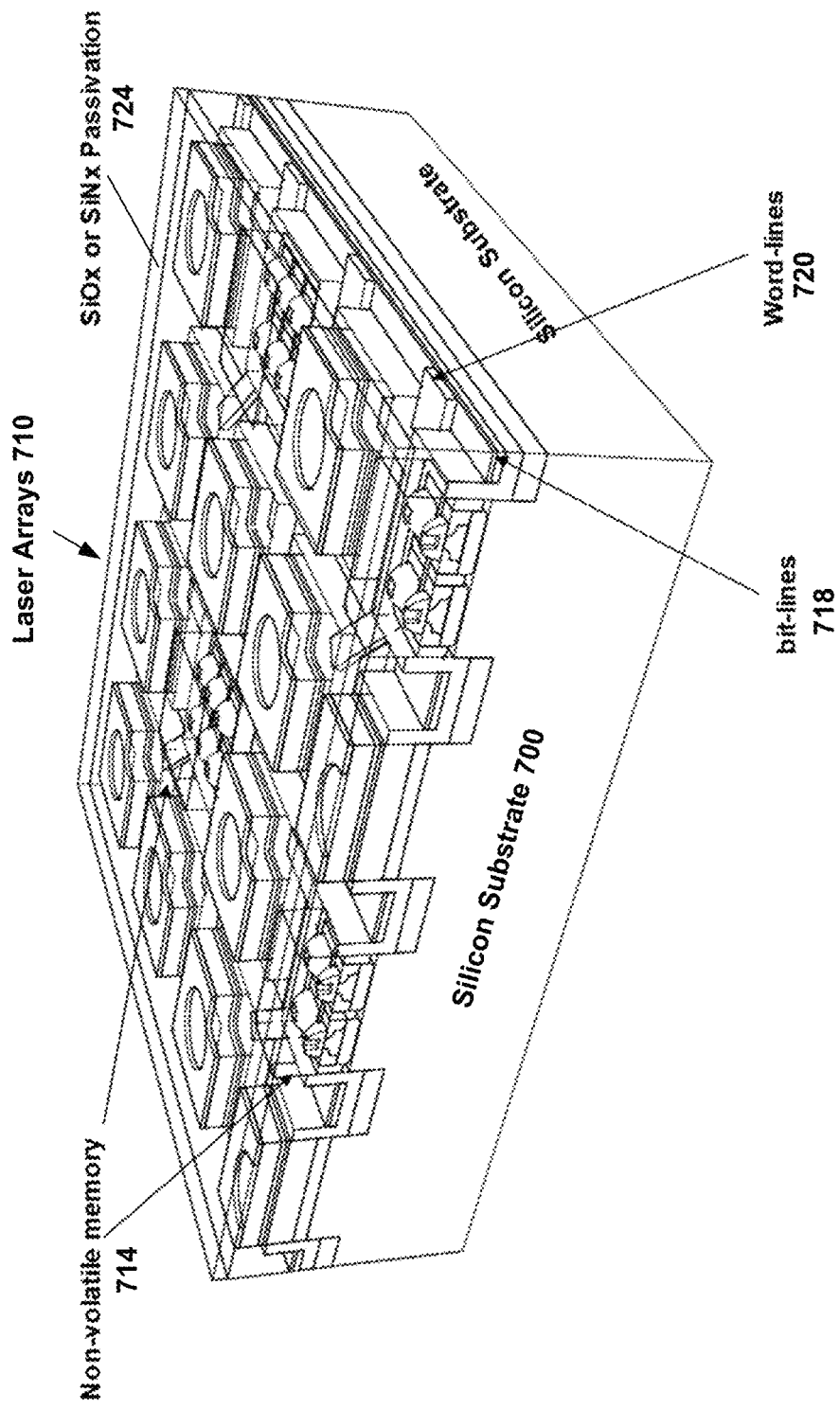

Seventh, as illustrated in FIG. 7G, a passivation layer 724, e.g., a transparent SiOx or SiNx layer, is formed to cover surfaces of the silicon substrate, including the laser pixel arrays. The passivation layer 724 can be deposited on the surfaces by MOCVD, ALD, PVD, CVD, or any suitable deposition methods.

Figure 7H:
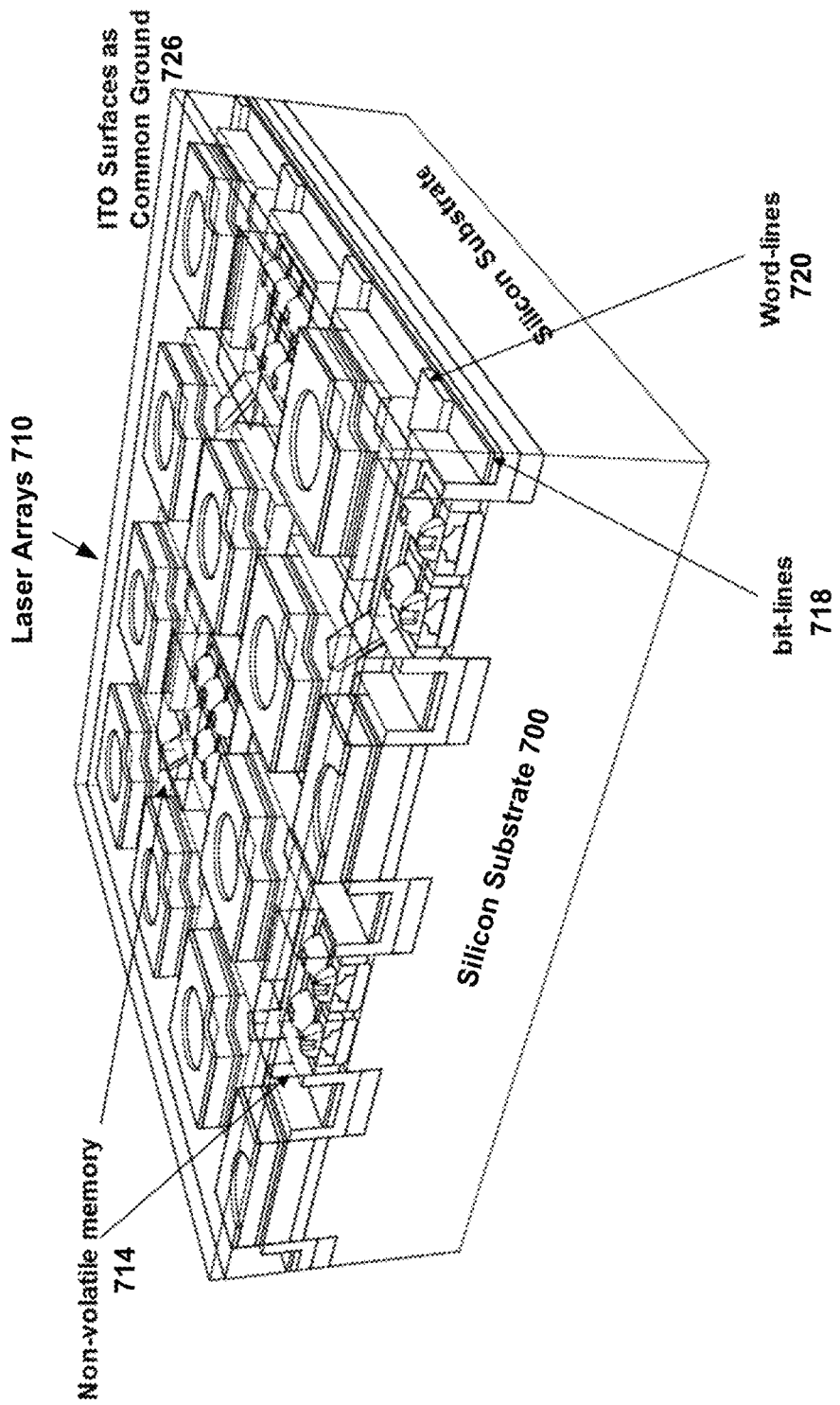
Figure 71:
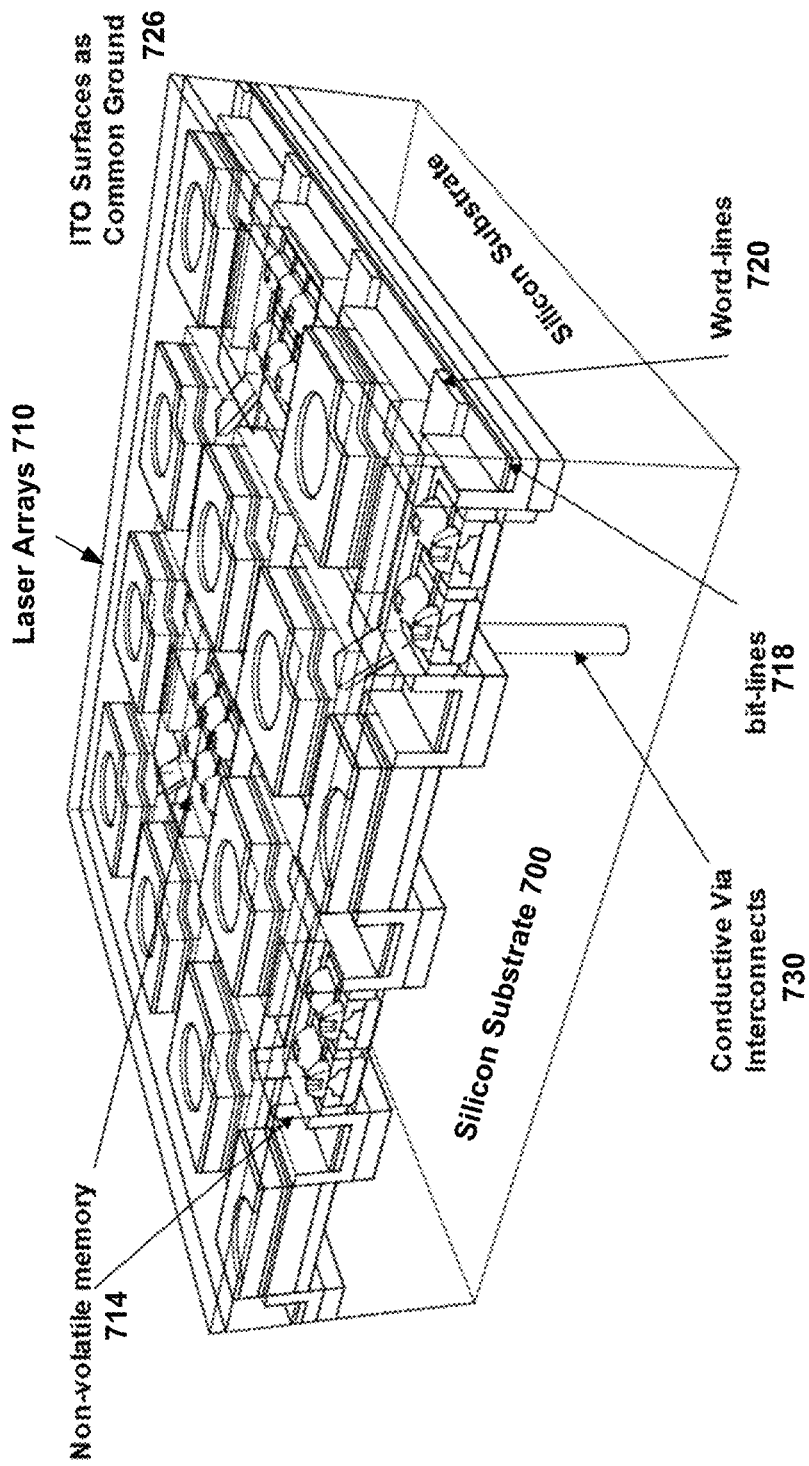

Eighth, the upper side 701 of the silicon substrate 700 is polished, e.g., by chemical-mechanical planarization (CMP) polish, to expose electrodes of all the lasers 710, e.g., p-electrode layer. Then, as shown in FIG. 7H, a conductive layer 726, e.g., an ITO layer, is deposited on top of the electrodes of the lasers 710 to form electrical common ground.

All the above steps are performed on the upper side 701 of the silicon substrate 700. In the following tenth step, the silicon substrate 700 is flipped from the upper side 701 to the lower side 703, and a plurality of deep trenches (or through-holes) are formed from the lower side 703, through the substrate 700, and towards the upper side 701. The deep trenches can be formed by deep etching, e.g., deep RIE or plasma etch. Then conductive electrodes are formed inside the deep trenches to form interconnects 730, as shown in FIG. 7I. In some cases, inner surfaces of the deep trenches are insulated and then metals are filled inside the deep trenches to form the conductive electrodes. The interconnects 730 are configured to connect the column bit lines 718 and the row word lines 720 to data drivers and scanning drivers to be formed on the lower side 703. As each column bit line 718 is coupled to a column of non-volatile memories 714 and each row word line 720 is coupled to a row of non-volatile memories 714, the number of interconnects 730 can be smaller than the total number of non-volatile memories 714.

Figure 7J:
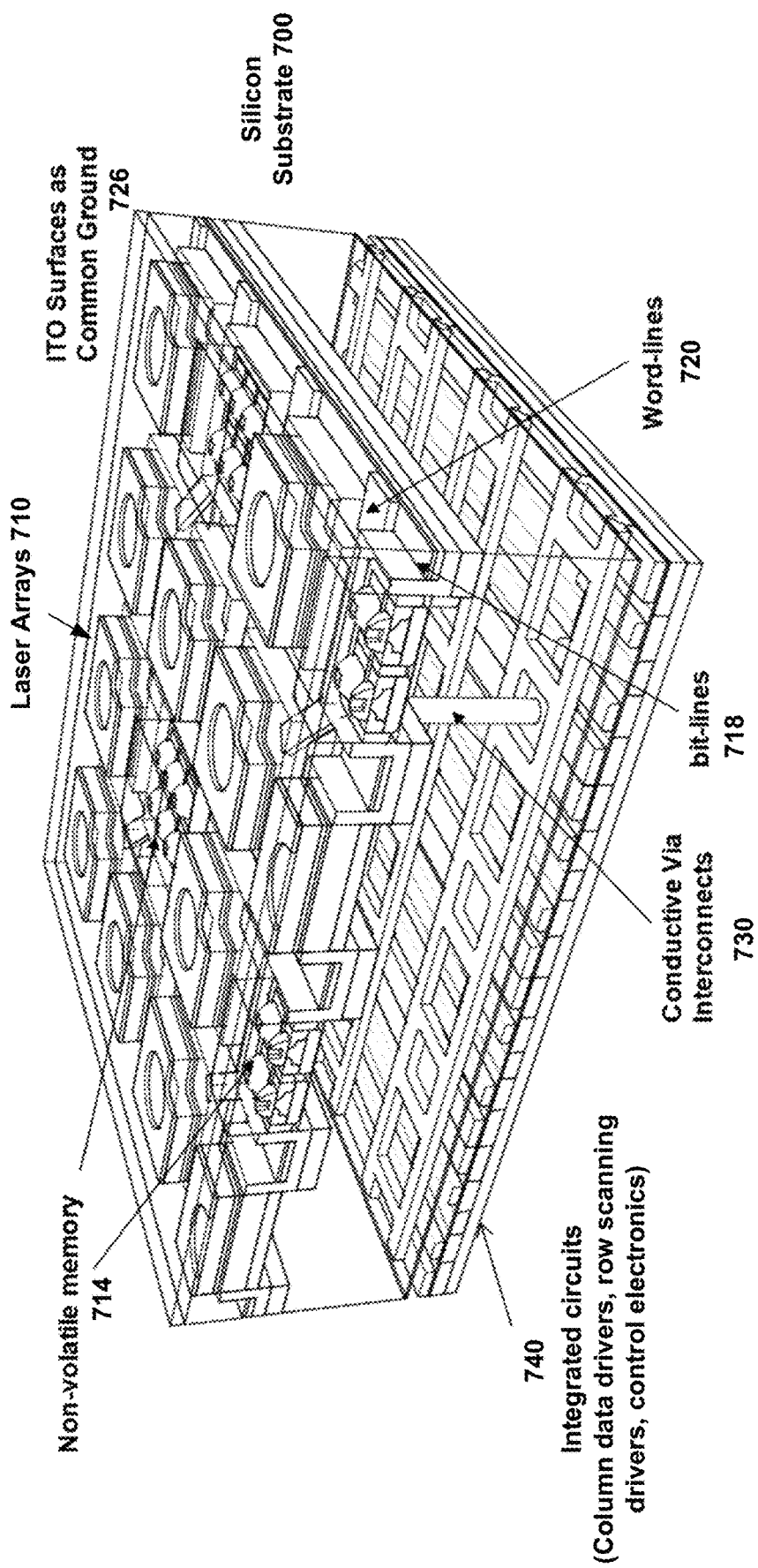

Tenth, as illustrated in FIG. 7J, integrated circuits 740 are formed on the bottom surface 704 of the lower side 703 of the silicon substrate 700. The integrated circuits 740 can include display drivers (column data drivers and row scanning drivers), and control electronics (e.g., CPU/MPU, memory, A/D converters, D/A converters, amplifiers, and other ICs). Components in the integrated circuits 740 can be connected to each other via conductive connections, e.g., via an internal bus. The control electronics is coupled to the data drivers and the scanning drivers through the conductive connections. The data drivers and the scanning drivers on the lower side 703 are coupled to the bit lines and the word lines on the upper side 701 through conductive interconnects 730 that penetrate through the silicon substrate 700, such that each non-volatile memory 714 is coupled to a respective data driver through at least one bit line and to a respective scanning driver through at least one word line.

Figure 7K:
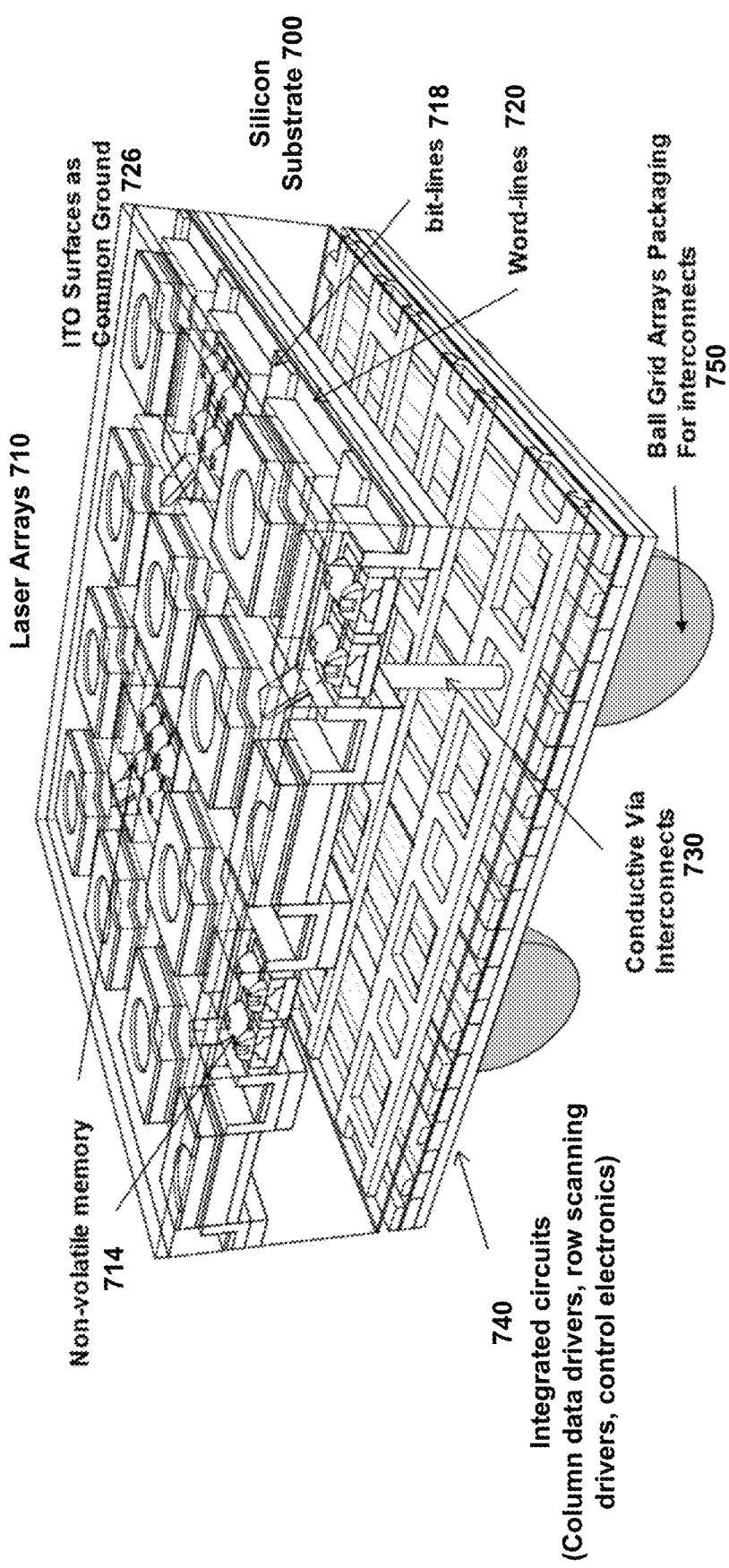

Eleventh, as shown in FIG. 7K, a ball grid array (BGA) package 750 is formed on the lower side 703, e.g., on a surface of the integrated circuits 740. Each BGA package 750 can include a number of BGA solider balls on the ICs. A larger number of BGA solider balls with corresponding grid lines enables a higher connection resolution for the ICs 740. The BGA package 750 function as conductive interconnects to connect the ICs 740 to other displays or to a control unit of a larger display.

Figure 7L:
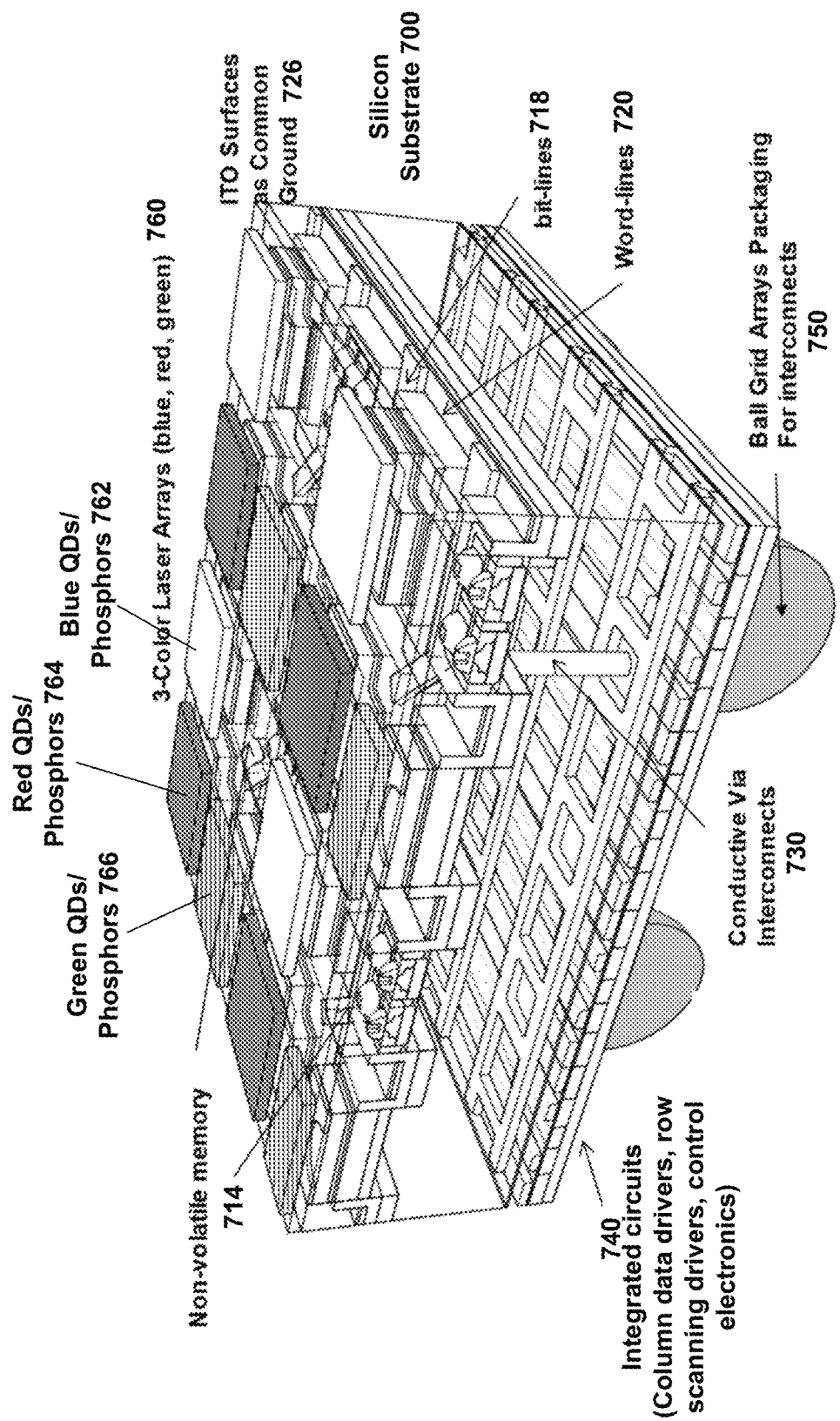

Twelfth, as shown in FIG. 7L, the silicon substrate 700 is flipped back from the lower side 703 to the upper side 701. Secondary color elements, e.g., red color elements and green color elements, can be formed based on the previously-formed lasers 710, e.g., blue color laser 710. The different color elements can form a multi-color laser pixel 770. Secondary color elements can be formed on surface of the lasers 710 by using different color phosphor materials or different size quantum-dot (QD) materials, including blue QDs/phosphors 762, red QDs/phosphors 764, and green QDs/phosphors 766.

In some implementations, an array of the multi-color laser pixels 760 is formed by the following processes: 1) patterning using photoresist for specific color elements, e.g., red color elements; 2) depositing, e.g., by ink-jet printing, specific color phosphor films or specific size QD thin-films for the specific color, e.g., red phosphor films or red QD thin-films; 3) lifting off to remove the photoresist to form specific color phosphors/Quantum-dot arrays thus to form the specific color element arrays, e.g., red color element arrays; 4) repeating the same processes above to form another specific color element arrays, e.g., green color element arrays, but with another specific color phosphor films or another specific size QD thin-films, e.g., green phosphor films or green QD thin-films. In a particular example, a white color element can be also formed to be included in each pixel to increase a sharpness of displayed images/pictures.

Figure 7M:
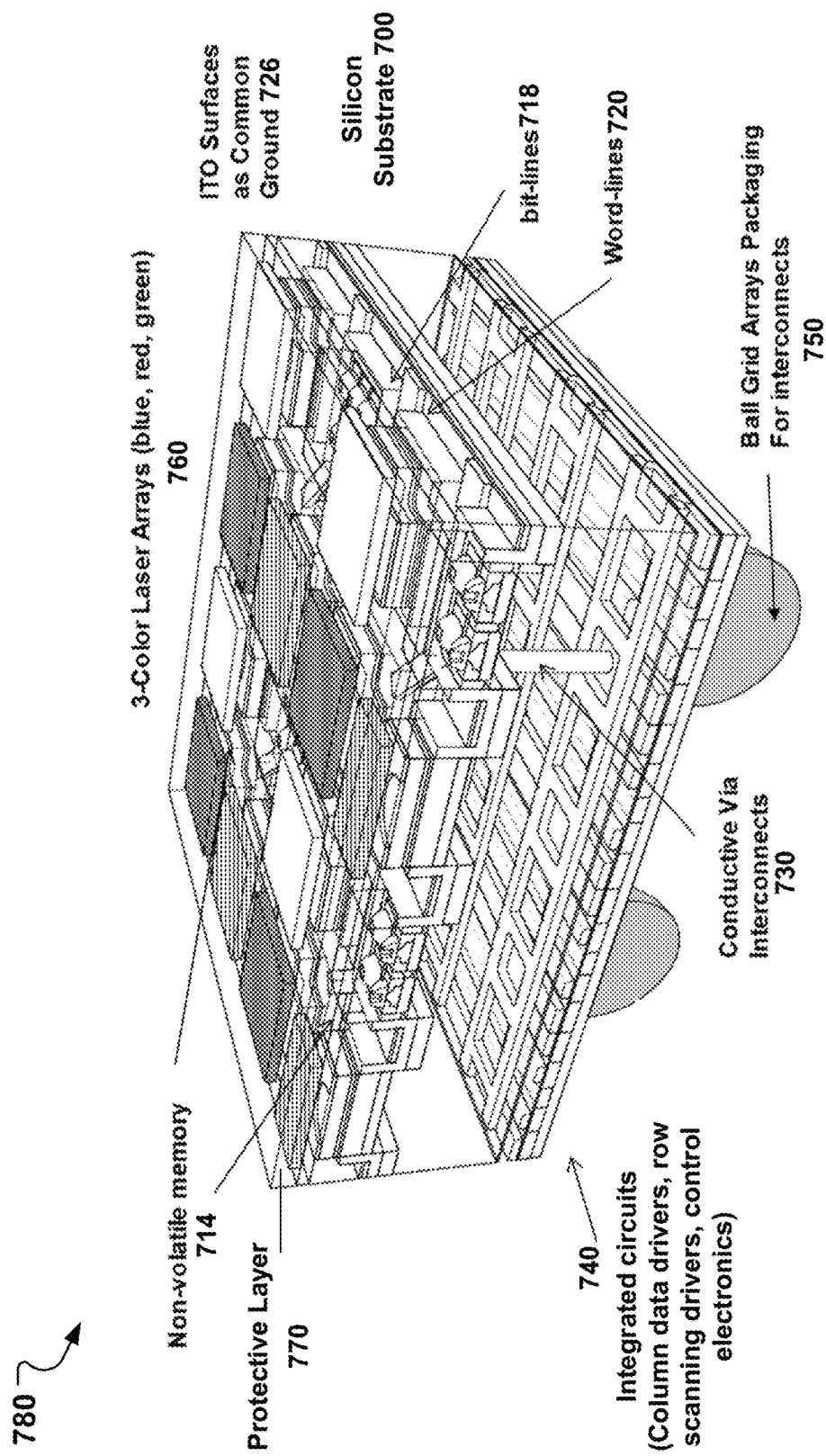

After forming the multi-color laser pixels 760, a protective layer 770 can be further formed on surfaces of the array of laser pixels 70, as illustrated in FIG. 7M. The protective layer 770 can be made of transparent material, e.g., glass or plastic, coated with a conductive material, e.g., indium tin oxide (ITO). The protective layer is coupled to non-volatile memories 714 in the laser pixels 770 under the protective layer and forms, with the non-volatile memories 714, a touch screen position sensor. The touch screen position sensor can use capacitive sensing. As noted above, a touch on the protective layer can be converted to a capacitance change which is detected by a touch screen detector/analyzer in the integrated circuits 740 through conductive connections between the non-volatile memories 714 and the data drivers/scanning drivers, and interconnects 730. FIG. 7M shows an integrated laser array display 780 formed by the fabrication process as described above, which is similar to the integrated laser array display 600 of FIGS. 6A-6B.

Example Processes

Figure 8:
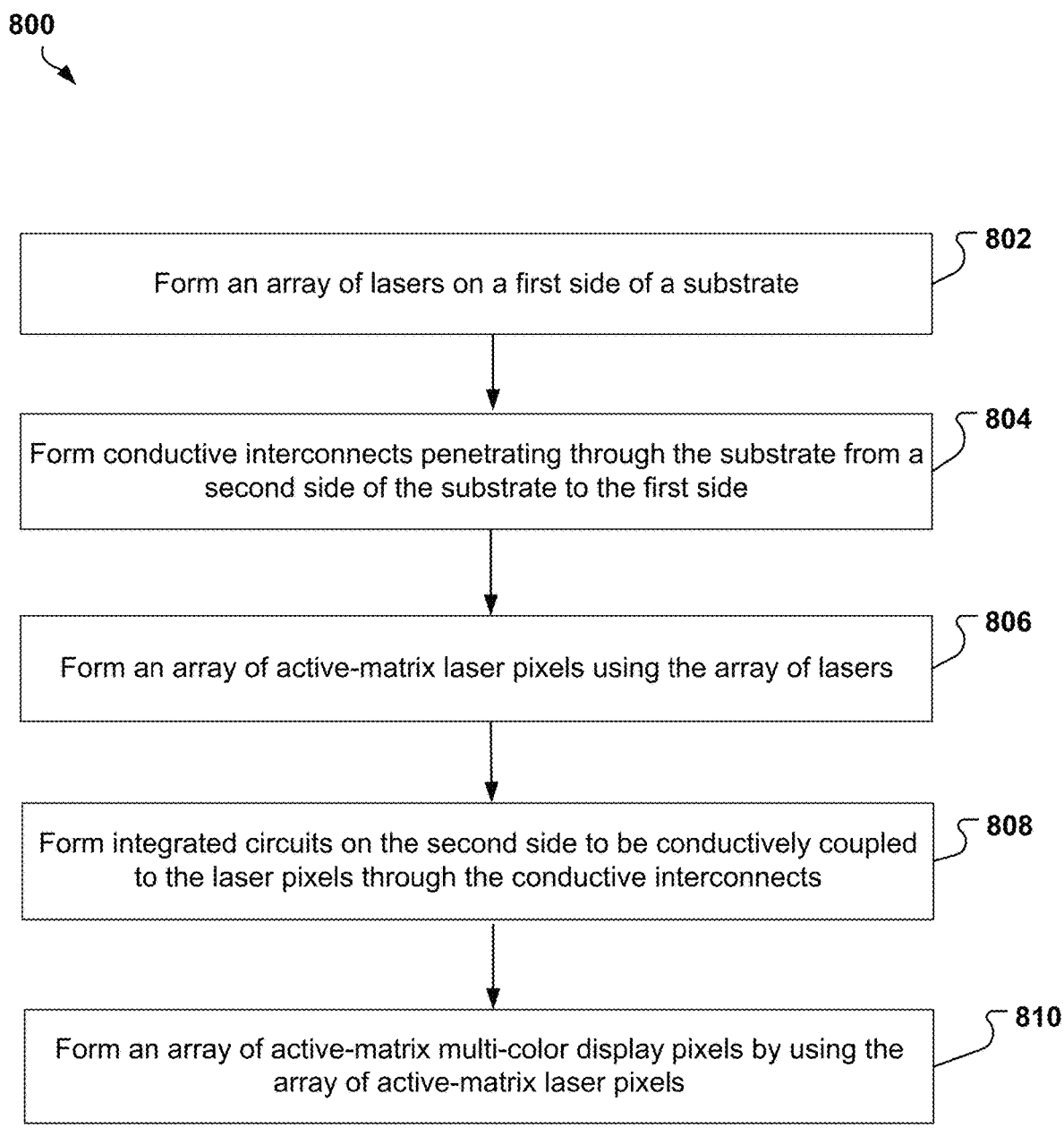
FIG. 8 is a flow diagram of an example process of forming an integrated active-matrix laser pixel display system on a substrate.

FIG. 8 is a flow diagram of an example process 800 of forming an integrated active-matrix laser pixel display system on a semiconductor substrate. The laser pixel display system can be the laser pixel display system 100 of FIGS. 1A, 400 of FIGS. 4A-4B, 570 of FIG. 5H, 600 of FIGS. 6A-6B, or 780 of FIG. 7M. The example process 800 can be similar to the processes described according to FIGS. 5A-5H or the processes described according to FIGS. 7A-7M.

The semiconductor substrate can be a single crystal silicon substrate that can have a first surface having a (111) orientation on the first side and a second surface having a (111) orientation on a second, opposite side and opposite to the first surface.

An array of lasers on the first side of the semiconductor substrate is formed (802). Each of the lasers can be a vertical-cavity surface-emitting laser (VCSEL) operable to emit the laser light from a top surface of the laser. The laser can include an optical resonator and one or more semiconductor layers in the optical resonator and being configured to emit a laser light. The one or more semiconductor layers can include one or more quantum well layers including Group III-V compounds. In some examples, the one or more semiconductor layers include a plurality of pairs of alternating InGaN layer and GaN: Si layer, and each of the lasing structures is operable to emit laser light with a blue color.

In some implementations, the array of lasers can be formed by patterning a surface of the semiconductor substrate on the first side to form an array of individual surfaces of the semiconductor substrate and sequentially depositing a plurality of layers on the array of individual surfaces. The plurality of layers can include a first distributed Bragg reflector, one or more semiconductor layers, and a second distributed Bragg reflector, the first and second distributed Bragg reflectors forming the optical resonator.

In some implementations, the array of lasers can be formed by forming a plurality of layers on the first side of the substrate to form a lasing structure including a first distributed Bragg reflector, one or more semiconductor layers, and a second distributed Bragg reflector, the first and second distributed Bragg reflectors forming the optical resonator and patterning the lasing structure to form the array of lasers, e.g., by etching through the lasing structure into the semiconductor substrate. The fabrication of the array of lasers can be described in US patent application Ser. No. 15/842,772, titled "FABRICATING INTEGRATED LIGHT-EMITTING PIXEL ARRAYS FOR DISPLAYS," filed on Dec. 14, 2017, the entire content of which is incorporated herein by reference.

For each of the lasers, a first electrode layer, e.g., n-electrode layer, can be formed on a bottom of the laser and a second electrode layer, e.g., p-electrode layer, can be formed on a top of the laser. The second electrode layer has an opening region, from which the laser light emits. Each laser can include a semiconductor buffer layer under the first electrode layer and on a surface of the semiconductor substrate on the first side. The first electrode layer can be highly-reflective, and the second electrode layer can be highly-reflective.

An electrically isolated material is filled in gaps between adjacent lasers of the array of lasers on the first side and the first side can be polished to form a flat surface across the array of lasers. The electrically isolated material can be optically transmissive, and each of the lasers has an opening window from which the laser light emits, and the opening window is filled with the electrically isolated material. An electrically conductive layer, e.g., ITO layer, can be deposited on the first side to connect the second electrodes of the lasers to form a common electrical ground for the array of lasers.

Conductive interconnects penetrating through the semiconductor substrate from the second side to the first side are formed (804). The semiconductor substrate can first be thinned from the second side, and then the thinned semiconductor substrate can be etched from the second side to form trenches in the semiconductor substrate. Inner surfaces of the trenches can be insulated, and an electrically conductive material is filled in the trenches to form the conductive interconnects.

An array of active-matrix laser pixels is formed using the array of lasers (806). Each of the laser pixels includes at least one of the lasers and at least one non-volatile memory coupled to the at least one of the lasers.

In some implementations, the non-volatile memories are formed on the first side. The lasers are conductively coupled to the non-volatile memories to form the array of active-matrix laser pixels.

In some examples, scanning drivers and data drivers are also formed on the first side, and word lines and bit lines are also formed on the first side. The number of the conductive interconnects can be smaller than a sum of the number of the scanning drivers and the number of the data drivers. Each of the non-volatile memories is coupled to one of the scanning drivers through at least one word line and to one of the data drivers through at least one bit line. The non-volatile memories and the scanning drivers and data drivers can be formed by selectively etching particular areas on the first side into the semiconductor substrate, cleaning open surfaces of the semiconductor substrate on the first side, and forming the non-volatile memories and the scanning drivers and data drivers on the open surfaces.

In some examples, the word lines and bit lines are formed on the first side and conductively coupled to the non-volatile memories and scanning drivers and data drivers are formed on the second side. The number of the conductive interconnects can be identical to a sum of the number of the word lines and the number of the bit lines. The word lines and bit lines are conductively coupled to the scanning drivers and the data drivers through the conductive interconnects, such that each of the non-volatile memories is coupled to one of the scanning drivers through at least one word line and to one of the data drivers through at least one bit line. The non-volatile memories and the word lines and bit lines can be formed on the first side by selectively etching particular areas on the first side into the substrate, cleaning open surfaces of the substrate, forming the non-volatile memories on the open surfaces on the particular areas, selectively etching the lasers to open particular layers and depositing conductive electrodes on the particular layers as Ohmic contacts of the lasers, and forming the word lines and bit lines and conductive connections on the first side, such that the word lines and the bit lines are conductively coupled to the non-volatile memories.

In some examples, the scanning drivers and data drivers are formed on the second side, and word lines and bit lines are also formed on the second side and coupled to the scanning drivers and the data drivers, respectively. The number of the conductive interconnects can be identical to the number of the non-volatile memories of the pixels. The non-volatile memories are conductively coupled to the word lines and bit lines through the conductive interconnects, such that each of the non-volatile memories is coupled to one of the scanning drivers through at least one word line and to one of the data drivers through at least one bit line.

In some implementations, the non-volatile memories are formed on the second side. The lasers are conductively coupled to the non-volatile memories to form the array of active-matrix laser pixels via the conductive interconnects. Each of the non-volatile memories can be coupled to a conductive electrode, e.g., n-electrode, formed on a bottom of a respective laser via the conductive interconnects. The scanning drivers and data drivers are formed on the second side. Word lines and bit lines are also formed on the second side and conductively coupled to the non-volatile memories and the scanning drivers and data drivers via interconnects, such that each of the non-volatile memories is coupled to one of the scanning drivers through at least one word line and to one of the data drivers through at least one bit line. The number of the conductive interconnects is no more than the number of the lasers of the laser pixels.

Integrated circuits are formed on the second side to be conductively coupled to the laser pixels through the conductive interconnects (808). The integrated circuits include control electronics. The control electronics can include one or more digital signal processors including at least one of: a digital signal analyzer, a digital processor, an image processor, a volatile memory, a non-volatile memory, or a touch screen processor. The control electronics can also include one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor. The control electronics can include transistors fabricated on the second side with the semiconductor substrate as their substrates.

The scanning drivers and the data drivers are conductively coupled to the control electronics. In some cases, when the scanning drivers and the data drivers are formed on the first side, the scanning drivers and the data drivers are coupled to the control electronics through the conductive interconnects. In some cases, when the scanning drivers and the data drivers are formed on the second side, the scanning drivers and the data drivers are coupled to the control electronics through interconnects formed on the second side.

An array of active-matrix multi-color display pixels is formed by using the array of active-matrix laser pixels (810). Each of the multi-color display pixels includes at least two pixel elements operable to emit light with at least two different colors when excited by the laser light emitted from at least two lasers of a corresponding laser pixel.

A phosphor film or quantum-dot film can be selectively deposited on a surface of at least one of the lasers in each of the multi-color display pixels. In some cases, at least blue, green, and red quantum dots or phosphors are selectively deposited on the surfaces of the lasers. When excited by the laser light from at least three lasers of a corresponding laser pixel, the blue, green, and red quantum dots or phosphors emit at least blue, green, and red lights.

In some implementations, a conductive grid array package, e.g., a BGA package, can be formed on the second side of the substrate and conductively coupled to the integrated circuits. The conductive grid array package can be formed on a surface of the integrated circuits.

In some implementations, a protective layer is formed on top of the array of active-matrix multi-color laser pixels. When the non-volatile memories of the pixels are on the first side, the protective layer and the non-volatile memories can form a touch screen position sensor operable to generate an electrical change in response to a touch on a spot of the protective layer, and the one or more integrated circuits can include a touch screen signal processor coupled to the non-volatile memories through the conductive interconnects.

Example Integrated Displays on Si (100) Substrates

Integrated laser arrays based displays can be also formed on a silicon semiconductor substrate with (100) orientation or a silicon (100) substrate. The silicon (100) substrate can be etched to generate trenches with silicon (111) sub-surfaces. Monochrome lasers can be formed on the silicon (111) sub-surfaces within the trenches of the silicon (100) substrate. Each monochrome laser can be an edge emission laser. For example, each edge emission laser on the silicon (111) sub-surfaces includes a lasing structure similar to the lasing structure of the laser 510 of FIG. 5B, including a semiconductor buffer layer, an n-electrode layer, a lower distributed Bragg reflector, a quantum well layer, an upper distributed Bragg reflector, and a p-electrode layer. However, the edge emission laser has no opening region on the p-electrode layer for the laser light to emit out. Instead, the edge emission laser emits the laser light from edges of the quantum well layer, e.g., InGaN/GaN: Si layers. Different color quantum dots or phosphors can be filled in the trenches and/or on a top of the trenches to be excited by the laser light to emit different colors.

A multi-color laser pixel display can be formed according to procedures similar to those for the integrated laser pixel array based display system 400 of FIGS. 4A-4B or 600 of FIGS. 6A-6B, or any other integrated LED display system formed on a silicon (100) substrate as described in U.S. patent application Ser. No. 15/291,330, entitled "INTEGRATED LIGHT-EMITTING DIODE ARRAYS FOR DISPLAYS" and filed on Oct. 12, 2016, the entire content of which is incorporated herein by reference.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS)

receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing can be advantageous.

The invention claimed is:

1. An integrated device comprising:
a semiconductor substrate including a first side and a second side;
an array of active-matrix light-emitting pixels, each of the pixels including one or more light-emitting elements formed on the first side and at least one non-volatile memory coupled to the one or more light-emitting elements, each of the light-emitting elements including a lasing structure that has an optical resonator and one or more semiconductor layers in the optical resonator and is operable to emit laser light, wherein each of the light-emitting elements comprises a first highly-reflective layer on a top surface of the lasing structure, and wherein the first highly-reflective layer defines an opening region filled with a highly-transmissive layer, from which the laser light exits the lasing structure;
an electrically conductive layer on top of the light-emitting elements to form a common electrical ground, the electrically conductive layer being highly-transmissive,
wherein the first highly-reflective layer is electrically conductive, the electrically conductive layer is on top of the first highly-reflective layer, and the highly-transmissive layer in the opening region is electrically isolated.

2. The integrated device of claim 1, wherein the optical resonator comprises a pair of distributed Bragg reflectors, and the one or more semiconductor layers are arranged between the pair of distributed Bragg reflectors.

3. The integrated device of claim 1, further comprising:
one or more integrated circuits formed on the second side; and
conductive interconnects penetrating from the second side through the semiconductor substrate and conductively coupling the one or more integrated circuits to the light-emitting elements.

4. The integrated device of claim 3, wherein the non-volatile memories of the pixels are on the second side and conductively coupled to the light-emitting elements through the conductive interconnects;
scanning drivers and data drivers on the second side and conductively coupled to the one or more integrated circuits on the second side; and
word lines and bit lines on the second side and conductively coupled to the non-volatile memories, such that each of the non-volatile memories is coupled to one of the scanning drivers through at least one word line and to one of the data drivers through at least one bit line.

5. The integrated device of claim 4, wherein a number of the conductive interconnects is no more than a number of the light emitting elements of the pixels.

6. The integrated device of claim 3, wherein the non-volatile memories of the pixels are on the first side and conductively coupled to the light-emitting elements, each of the non-volatile memories being adjacent to one or more light emitting elements of a corresponding pixel.

7. The integrated device of claim 6, further comprising:
scanning drivers and data drivers on the first side, wherein the scanning drivers and the data drivers are conductively coupled to the one or more integrated circuits on the second side through the conductive interconnects; and
word lines and bit lines on the first side and conductively coupled to the scanning drivers and the data drivers, wherein each of the non-volatile memories is coupled to one of the scanning drivers through at least one word line and to one of the data drivers through at least one bit line.

8. The integrated device of claim 7, wherein a number of the conductive interconnects is smaller than a sum of a number of the scanning drivers and a number of the data drivers.

9. The integrated device of claim 6, further comprising:
scanning drivers and data drivers on the second side and conductively coupled to the one or more integrated circuits on the second side; and
word lines and bit lines on the first side and conductively coupled to the non-volatile memories,
wherein the word lines and the bit lines are coupled to the scanning drivers and the data drivers through the conductive interconnects, respectively, such that each of the non-volatile memories is coupled to one of the scanning drivers through at least one word line and to one of the data drivers through at least one bit line.

10. The integrated device of claim 9, wherein a number of the conductive interconnects is identical to a sum of a number of the word lines and a number of the bit lines.

11. The integrated device of claim 6, further comprising:
scanning drivers and data drivers on the second side and conductively coupled to the one or more integrated circuits on the second side; and
word lines and bit lines on the second side and conductively coupled to the scanning drivers and the data drivers, respectively,
wherein the non-volatile memories are coupled to the word lines and the bit lines through the conductive interconnects, such that each of the non-volatile memories is coupled to one of the scanning drivers through at least one word line and to one of the data drivers through at least one bit line.

12. The integrated device of claim 11, wherein a number of the conductive interconnects is identical to a number of the non-volatile memories of the pixels.

13. The integrated device of claim 3, further comprising:
a conductive grid array package on the second side of the semiconductor substrate and conductively coupled to the one or more integrated circuits.

14. The integrated device of claim 13, wherein the conductive grid array package comprises a ball grid array (BGA) package, and the BGA package is formed on a surface of the one or more integrated circuits.

15. The integrated device of claim 3, further comprising:
a protective layer on top of the array of active-matrix light-emitting pixels.

16. The integrated device of claim 15, wherein the non-volatile memories of the pixels are on the first side,
wherein the protective layer and the non-volatile memories form a touch screen position sensor operable to generate an electrical change in response to a touch on a spot of the protective layer, and
wherein the one or more integrated circuits comprise a touch screen signal processor coupled to the non-volatile memories through the conductive interconnects.

17. The integrated device of claim 3, wherein the one or more integrated circuits comprise at least one of:
one or more digital signal processors including at least one of: a digital signal analyzer, a digital processor, an image processor, a volatile memory, a non-volatile memory, or a touch screen processor; or
one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

18. The integrated device of claim 3, wherein the semiconductor substrate comprises a single crystal silicon substrate,
wherein the single crystal silicon substrate has a first surface having a (111) orientation on the first side and a second surface having a (111) orientation on the second side and opposite to the first surface, and
wherein the array of light-emitting elements are formed on the first surface, and the one or more integrated circuits are formed on the second surface.

19. The integrated device of claim 1, wherein each of the light-emitting elements further comprises a second highly-reflective layer under a bottom surface of the lasing structure, and
wherein the second highly-reflective layers of the light-emitting elements are electrically conductive to be individual electrodes and separated from each other by an electrically isolated material.

20. The integrated device of claim 19, wherein each of the light-emitting elements further comprises a semiconductor buffer layer under the second highly-reflective layer and on a surface of the semiconductor substrate on the first side.

21. The integrated device of claim 20, further comprising:
conductive interconnects penetrating from the second side through the semiconductor substrate and through the semiconductor buffer layers to be electrically coupled to the second highly-reflective layers.

22. The integrated device of claim 1, wherein the one or more semiconductor layers comprise one or more quantum well layers including Group III-V compounds.

23. The integrated device of claim 22, wherein the one or more semiconductor layers comprise a plurality of pairs of alternating InGaN layer and GaN: Si layer, and each of the lasing structures is operable to emit laser light with one of a ultraviolet color, a violet-blue color, a blue color, and a green color.

24. The integrated device of claim 1, wherein the lasing structures in the light-emitting elements of each of the pixels include the same semiconductor layers and are operable to emit the same laser light with a same primary color.

25. The integrated device of claim 24, wherein at least one of the light-emitting elements in each of the pixels comprises a phosphor material or a quantum-dot material on a surface of the lasing structure and is operable to emit secondary light based on the laser light with the primary color.

26. The integrated device of claim 25, wherein the secondary light has a second color different from the primary color.

27. The integrated device of claim 25, wherein each of the pixels comprises at least three light-emitting elements operable to emit light with at least three different colors including red, blue, and green based on the laser light with the primary color.

28. The integrated device of claim 1, wherein the light emitting elements are isolated by an electrically isolated material.

29. A method of fabricating an integrate device, the method comprising:
forming an array of lasers on a first side of a semiconductor substrate, each of the lasers including an optical resonator and one or more semiconductor layers in the optical resonator and being configured to emit a laser light;
filling an electrically isolated material in gaps between adjacent lasers of the array of lasers on the first side;
polishing the first side to form a flat surface across the array of lasers; and
forming an array of active-matrix laser pixels by using the array of lasers, wherein each of the laser pixels includes at least one of the lasers and at least one non-volatile memory coupled to the at least one of the lasers,
wherein forming the array of lasers comprises:
for each of the lasers, forming a first electrode on a bottom of the laser and a second electrode on a top of the laser; and forming an opening region in the second electrode, from which the laser light emits.

30. The method of claim 29, further comprising:
forming an array of active-matrix multi-color display pixels by using the array of active-matrix laser pixels, each of the multi-color display pixels including at least two pixel elements operable to emit light with at least two different colors when excited by the laser light emitted from at least two lasers of a corresponding laser pixel.

31. The method of claim 30, wherein forming the array of active-matrix multi-color display pixels comprises selectively depositing a phosphor film or quantum-dot film on a surface of at least one of the lasers in each of the multi-color display pixels.

32. The method of claim 31, wherein forming the array of active-matrix multi-color display pixels comprises selectively depositing blue, green, and red quantum dots or phosphors on the surfaces of the lasers.

33. The method of claim 29, wherein each of the lasers is a vertical-cavity surface-emitting laser (VCSEL) operable to emit the laser light from a top surface of the laser.

34. The method of claim 29, wherein the one or more semiconductor layers comprise one or more quantum well layers including Group III-V compounds.

35. The method of claim 29, wherein forming the array of lasers comprises:
patterning a surface of the semiconductor substrate on the first side to form an array of individual surfaces of the semiconductor substrate; and
sequentially depositing a plurality of layers on the array of individual surfaces, the plurality of layers including a first distributed Bragg reflector, one or more semiconductor layers, and a second distributed Bragg reflector, the first and second distributed Bragg reflectors forming the optical resonator.

36. The method of claim 29, wherein forming the array of lasers comprises:
forming a plurality of layers on the first side of the substrate to form a lasing structure including a first distributed Bragg reflector, one or more semiconductor layers, and a second distributed Bragg reflector, the first and second distributed Bragg reflectors forming the optical resonator; and
patterning the lasing structure to form the array of lasers.

37. The method of claim 29, further comprising:
forming conductive interconnects penetrating from a second side of the semiconductor substrate through the semiconductor substrate to the first side; and
forming one or more integrated circuits on the second side and conductively coupled to the array of active-matrix laser pixels through the conductive interconnects.

38. The method of claim 37, wherein forming the conductive interconnects comprises:
thinning the semiconductor substrate from the second side;
etching the thinned semiconductor substrate from the second side to form trenches in the semiconductor substrate;
insulating inner surfaces of the trenches; and
filling an electrically conductive material in the trenches.

39. The method of claim 37, wherein forming the array of active-matrix laser pixels comprises:
forming a plurality of non-volatile memories on the second side; and
conductively connecting the array of lasers on the first side to the plurality of non-volatile memories on the second side via the conductive interconnects.

40. The method of claim 39, wherein each of the non-volatile memories is coupled to a conductive electrode formed on a bottom of a respective laser via the conductive interconnects.

41. The method of claim 39, further comprising:
forming scanning drivers and data drivers on the second side, wherein the scanning drivers and the data drivers are conductively coupled to the one or more integrated circuits on the second side; and
forming word lines and bit lines on the second side and conductively coupled to the non-volatile memories, such that each of the non-volatile memories is coupled to one of the scanning drivers through at least one word line and to one of the data drivers through at least one bit line.

42. The method of claim 37, wherein forming the array of active-matrix laser pixels comprises:
forming a plurality of non-volatile memories on the first side, each of the non-volatile memories being adjacent to one or more lasers of a corresponding laser pixel.

43. The method of claim 42, further comprising:
forming scanning drivers and data drivers on the first side, wherein the scanning drivers and the data drivers are conductively coupled to the one or more integrated circuits on the second side through the conductive interconnects; and
forming word lines and bit lines on the first side, such that each of the non-volatile memories is coupled to one of the scanning drivers through at least one word line and to one of the data drivers through at least one bit line.

44. The method of claim 43, wherein forming the plurality of non-volatile memories and the scanning drivers and data drivers comprises:
selectively etching particular areas on the first side into the semiconductor substrate;
cleaning open surfaces of the semiconductor substrate on the first side; and
forming the plurality of non-volatile memories and the scanning drivers and data drivers on the open surfaces.

45. The method of claim 42, further comprising:
forming word lines and bit lines on the first side and conductively coupled to the plurality of non-volatile memories; and
forming scanning drivers and data drivers on the second side and conductively coupled to the one or more integrated circuits on the second side,
wherein the word lines and bit lines are conductively coupled to the scanning drivers and
the data drivers through the conductive interconnects, such that each of the non-volatile memories is coupled to one of the scanning drivers through at least one word line and to one of the data drivers through at least one bit line.

46. The method of claim 45, wherein forming the plurality of non-volatile memories and the word lines and bit lines on the first side comprises:
selectively etching particular areas on the first side into the substrate;
cleaning open surfaces of the substrate;
forming the plurality of non-volatile memories on the open surfaces on the particular areas;
selectively etching the lasers to open particular layers and depositing conductive electrodes on the particular layers as Ohmic contacts of the lasers; and forming the word lines and bit lines and conductive connections on the first side, such that the word lines and the bit lines are conductively coupled to the plurality of non-volatile memories.

47. The method of claim 42, further comprising:
forming scanning drivers and data drivers on the second side, wherein the scanning drivers and the data drivers are conductively coupled to the one or more integrated circuits on the second side; and
forming word lines and bit lines on the second side and coupled to the scanning drivers and the data drivers, respectively, wherein the non-volatile memories are conductively coupled to the word lines and bit lines through the conductive interconnects, such that each of the non-volatile memories is coupled to one of the scanning drivers through at least one word line and to one of the data drivers through at least one bit line.

48. The method of claim 37, further comprising:
forming a conductive grid array package on the second side of the substrate; and conductively coupling the conductive grid array package to the one or more integrated circuits.

49. The method of claim 37, further comprising:
forming a protective layer on top of the array of active-matrix multi-color display pixels.

50. The method of claim 37, wherein the one or more integrated circuits comprise at least one of:
one or more digital signal processors including at least one of: a digital signal analyzer, a digital processor, an image processor, a volatile memory, a non-volatile memory, or a touch screen processor; or
one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

51. The method of claim 37, wherein the semiconductor substrate comprises a single crystal silicon substrate,
wherein the single crystal silicon substrate has a first surface having a (111) orientation on the first side and a second surface having a (111) orientation on the second side and opposite to the first surface, and
wherein the array of lasers are formed on the first surface, and the one or more integrated circuits are formed on the second surface.

52. The method of claim 29, wherein the electrically isolated material is optically transmissive, and
wherein each of the lasers has an opening window from which the laser light emits, and the opening window is filled with the electrically isolated material.

53. The method of claim 29, further comprising:
forming an electrically conductive layer on the first side to form a common electrical ground for the array of lasers.

54. A method of fabricating an integrate active-matrix laser pixel array based display, the method comprising:
forming an array of vertical-cavity surface-emitting lasers (VCSELs) on a first side of a single crystal Si (111) substrate by depositing multiple layers on a top surface of the substrate, the multiple layers comprising a pair of distributed Bragg reflectors to form an optical resonator and one or more quantum well layers having Group III-V compounds as an active medium in the optical resonator, each of the lasers being operable to emit a laser light with a primary color;
forming an array of active-matrix laser pixels by using the array of lasers, wherein each of the laser pixels includes at least three lasers and at least one non-volatile memory coupled to the at least three lasers;
forming conductive interconnects penetrating through the substrate from the second side to the first side;
forming one or more integrated circuits on the second side and conductively coupled to the array of active-matrix laser pixels through the conductive interconnects; and
forming an array of active-matrix multi-color display pixels by selectively depositing at least three different color quantum dots or phosphors on surfaces of the array of lasers, each display pixel including at least three pixel elements operable to emit light with the at least three different colors, when excited by the laser light with the primary color emitted from the at least three lasers of a corresponding laser pixel.

55. An integrated device comprising:
a semiconductor substrate including a side and a second side; and
an array of active-matrix light-emitting pixels, each of the pixels including one or more light-emitting elements formed on the side and at least one non-volatile memory coupled to the one or more light-emitting elements, each of the light-emitting elements including a lasing structure that has an optical resonator and one or more semiconductor layers in the optical resonator and is operable to emit laser light,
wherein the one or more semiconductor layers comprise one or more quantum well layers including Group III-V compounds, and
wherein the one or more semiconductor layers comprise a plurality of pairs of alternating InGaN layer and GaN: Si layer, and each of the lasing structures is operable to emit laser light with one of a ultraviolet color, a violet-blue color, a blue color, and a green color.

56. The integrated device of claim 55, wherein the lasing structures in the light-emitting elements of each of the pixels include the same semiconductor layers and are operable to emit the same laser light with a same primary color, and
wherein at least one of the light-emitting elements in each of the pixels comprises a phosphor material or a quantum-dot material on a surface of the lasing structure and is operable to emit secondary light based on the laser light with the primary color, wherein the secondary light has a second color different from the primary color.

57. A method of fabricating an integrate device, the method comprising:
forming an array of lasers on a side of a semiconductor substrate, each of the lasers including an optical resonator and one or more semiconductor layers in the optical resonator and being configured to emit a laser light;
filling an electrically isolated material in gaps between adjacent lasers of the array of lasers on the side;
polishing the side to form a flat surface across the array of lasers;
forming an array of active-matrix laser pixels by using the array of lasers, wherein each of the laser pixels includes at least one of the lasers and at least one non-volatile memory coupled to the at least one of the lasers; and
forming an array of active-matrix multi-color display pixels by using the array of active-matrix laser pixels, each of the multi-color display pixels including at least two pixel elements operable to emit light with at least two different colors when excited by the laser light emitted from at least two lasers of a corresponding laser pixel.

58. The method of claim 57, wherein the electrically isolated material is optically transmissive, and wherein each of the lasers has an opening window from which the laser light emits, and the opening window is filled with the electrically isolated material.

* * * * *